(12) United States Patent
Ikeda et al.

(10) Patent No.: US 6,423,959 B1
(45) Date of Patent: Jul. 23, 2002

(54) SOLID-STATE IMAGE PICKUP APPARATUS AND ITS CONTROL METHOD INCLUDING A THINNING READOUT MODE AND AN ADDING MOVIE MODE

(75) Inventors: Katsumi Ikeda; Kazuyuki Masukane, both of Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 114 days.

(21) Appl. No.: 09/664,541

(22) Filed: Sep. 18, 2000

(30) Foreign Application Priority Data

Oct. 7, 1999 (JP) ............................................ 11-287337

(51) Int. Cl.[7] .............................................. H01L 27/00
(52) U.S. Cl. ..................................... 250/208.1; 348/322
(58) Field of Search .......................... 250/208.1, 214 R, 250/235; 348/322, 297, 298, 320, 311, 315, 302, 305

(56) References Cited

U.S. PATENT DOCUMENTS 4,689,687 A * 8/1987 Koike et al. ................ 348/322

FOREIGN PATENT DOCUMENTS

JP           8-111517        4/1996

* cited by examiner

*Primary Examiner*—Que T. Le
(74) *Attorney, Agent, or Firm*—Arent Fox Kintner Plotkin & Kahn, PLLC

(57) ABSTRACT

A solid-state image pickup apparatus includes photoelectric converter elements arranged in an array on a two-dimensional plane, vertical charge transfer paths respectively fabricated adjacent the photoelectric converter elements, vertical charge transfer electrodes for transferring charge one charge transfer stage by each transfer operation, a horizontal charge transfer path connected to end sections respectively of the vertical charge transfer paths for receiving transferred therefrom and for transferring the charge in a horizontal direction, horizontal charge transfer electrodes on the horizontal charge transfer path in a horizontal direction, an output amplifier connected to an end of the horizontal charge transfer path for amplifying charge from the horizontal charge transfer path, and a control circuit to drive the apparatus in an adding movie mode in which the control circuit reads charge, read from the photoelectric converter elements to the vertical transfer path, feeds the charge to all charge transfer stages, transfers the charge of at least two photoelectric converter elements from the vertical charge transfer path to the horizontal charge transfer path, and then stops a transfer of charge from said vertical charge transfer path to said horizontal charge transfer path and outputs by the horizontal charge transfer path the charge to an external device. This improves display sensitivity of the solid-state image pickup apparatus in the adding movie mode.

17 Claims, 43 Drawing Sheets

FIG.11A FIG.11B FIG.11C
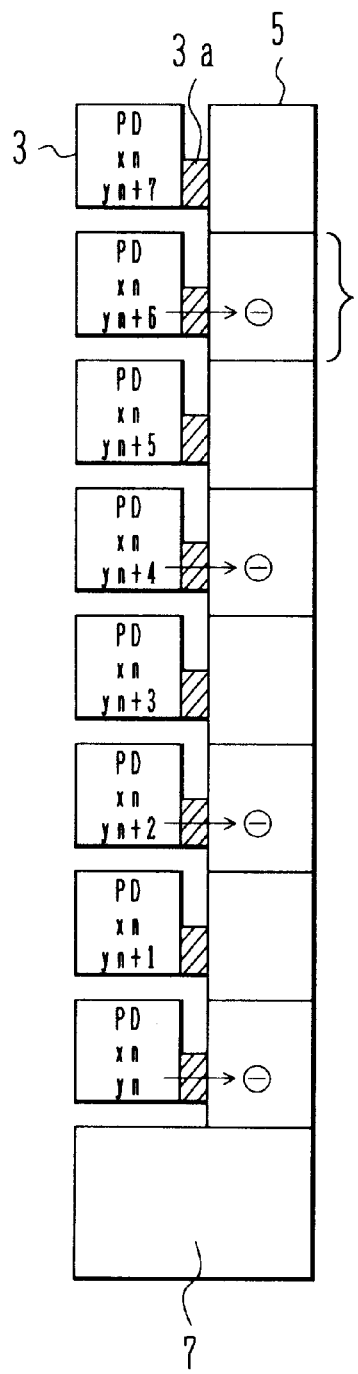
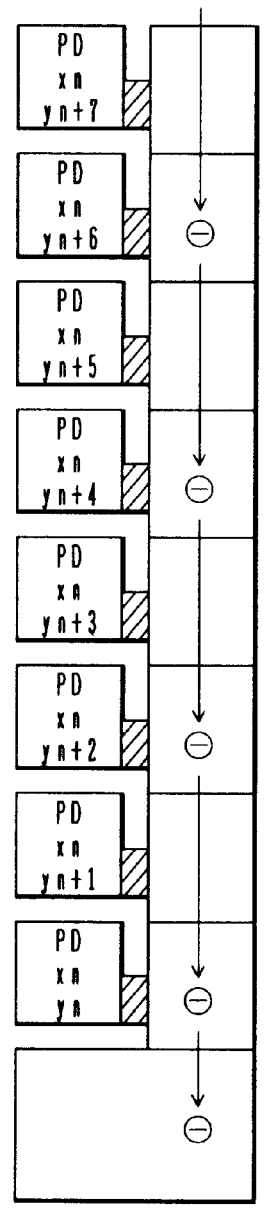
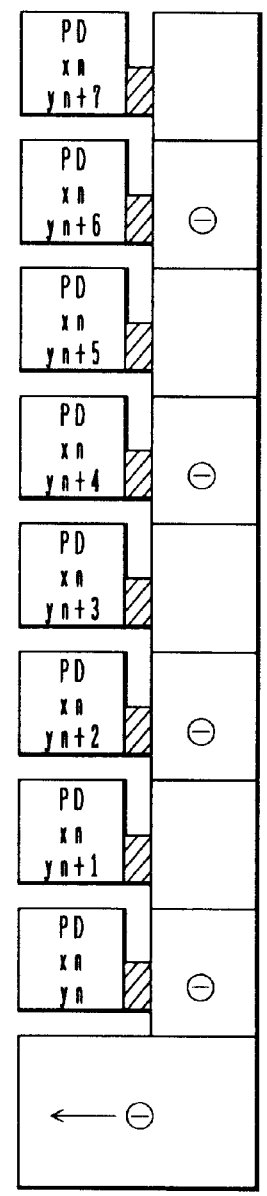

FIG.24A FIG.24B FIG.24C
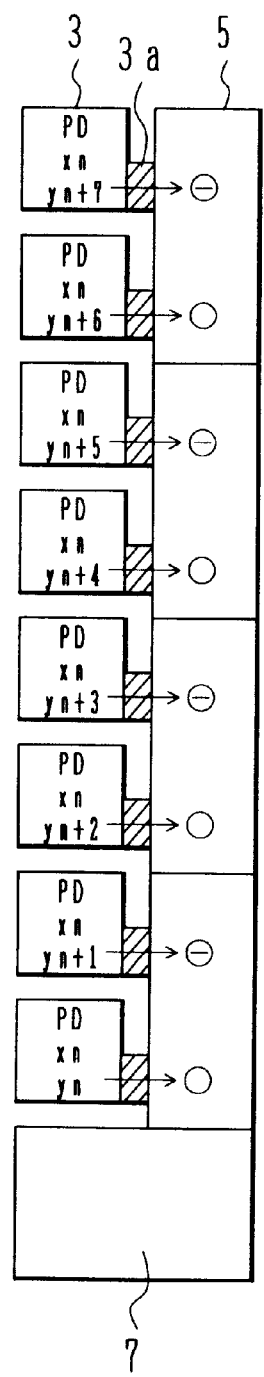
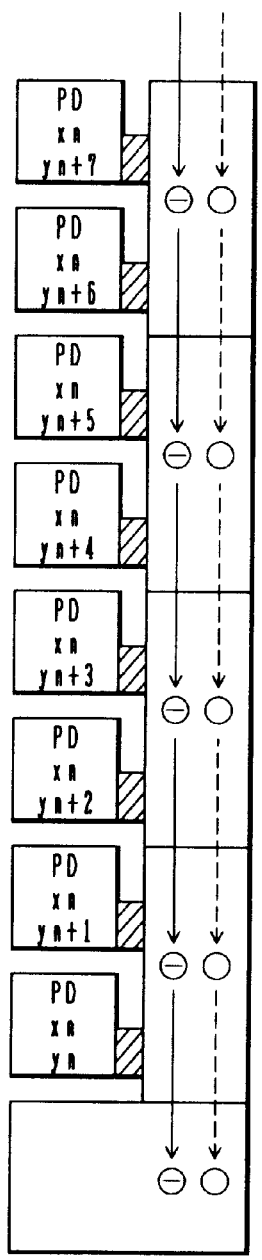
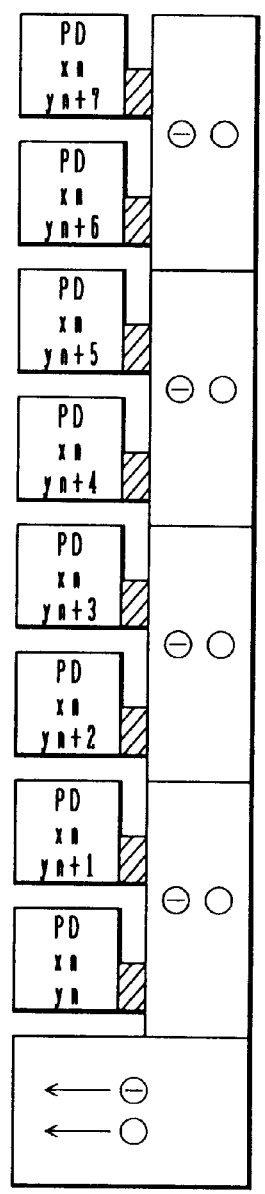

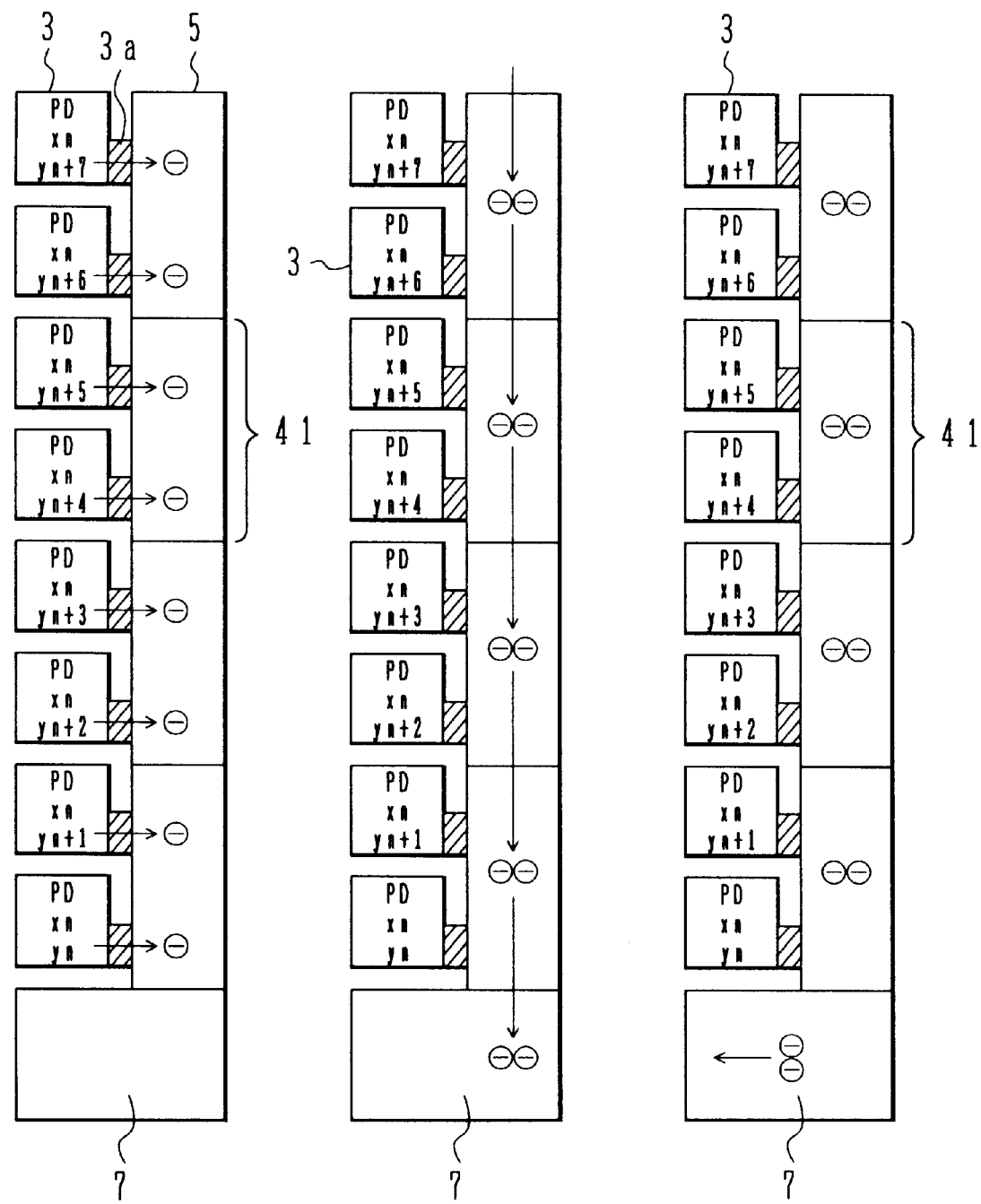

FIG.33A   FIG.33B   FIG.33C   FIG.33D   FIG.33E

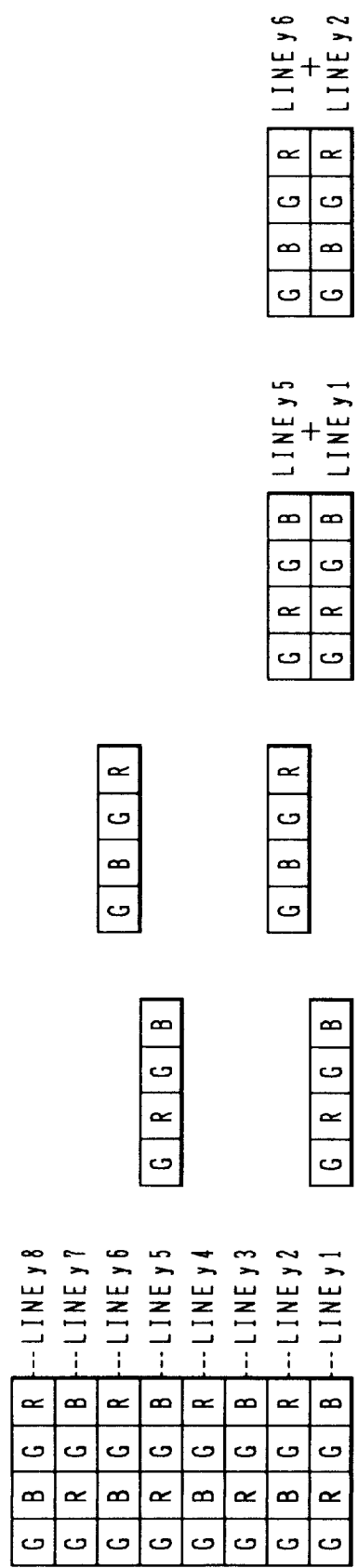

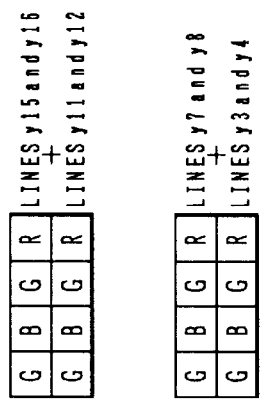
FIG.35E
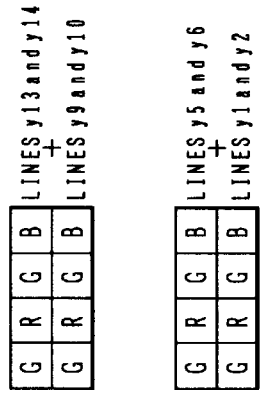
FIG.35D
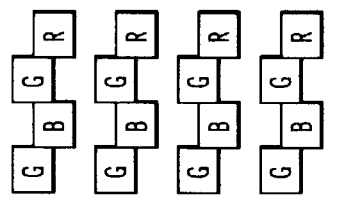
FIG.35C
FIG.35B
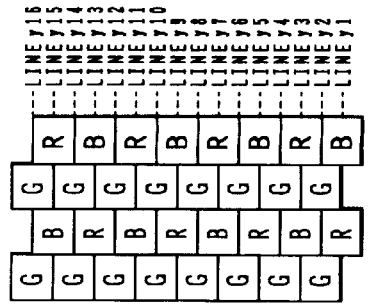
FIG.35A

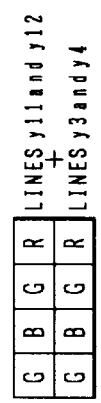
FIG.36A
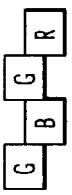
FIG.36B FIG.36C
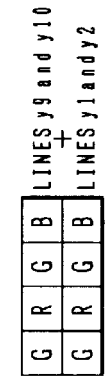
FIG.36D
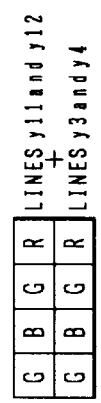
FIG.36E
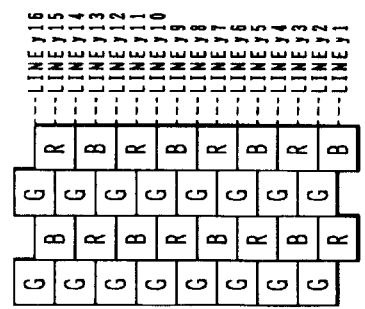

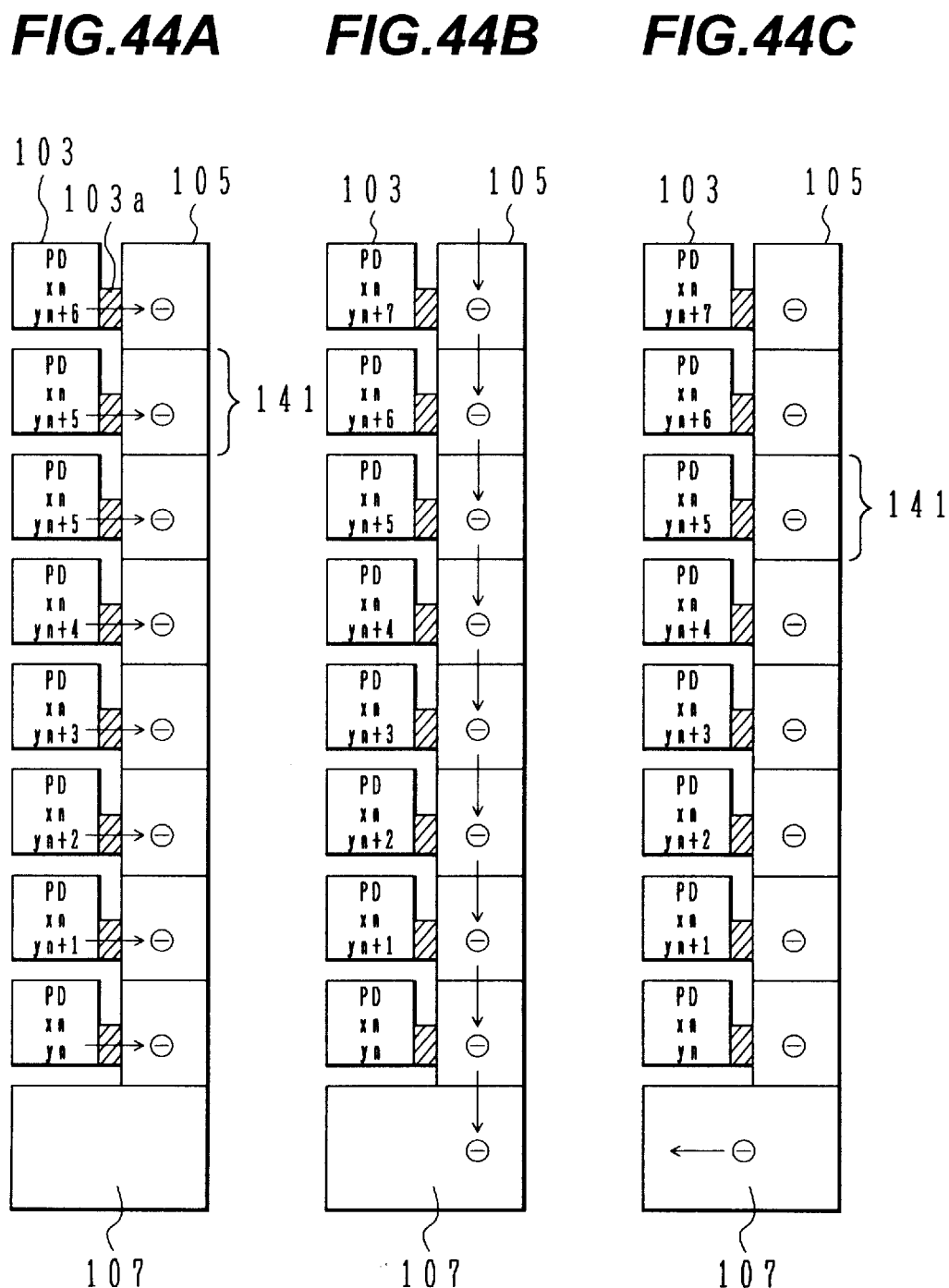

SOLID-STATE IMAGE PICKUP APPARATUS AND ITS CONTROL METHOD INCLUDING A THINNING READOUT MODE AND AN ADDING MOVIE MODE

This application is based on Japanese Patent Application HEI 11-287337 filed on Oct. 7, 1999, all the content of which is incorporated herein by reference.

BACKGROUND OF THE INVENTION

1. Field of the Invention

The present invention relates to a solid-state image pickup device, a method of controlling the same, a solid-state image pickup apparatus such as a still camera including a monitor screen, and a method of controlling the same.

In this specification, one transfer stage is defined as a minimum unit of an electric charge transfer region to which electric charge is transferred when a plurality of pulse signals having different phases are applied to charge transfer electrodes successively disposed on a charge transfer path.

For example, when charge in the charge transfer path is driven by signals having four phases, four pulse signals having mutually different phases are respectively applied to four charge transfer electrodes successively arranged on the charge transfer path. In this operation, a region to which electric charge is transferred is referred to as one transfer stage. For example, in the four-phase driving, a region in which four charge transfer electrodes are disposed is called one transfer stage.

In an n-phase driving operation (n is an integer equal to or more than two), a region in which n successive charge transfer electrodes are arranged is referred to as one transfer stage.

2. Description of the Related Art

FIG. 41 shows in a plan view a general configuration of a solid-state image. pickup device.

A solid-state image pickup device X of FIG. 41 includes a semiconductor substrate 101, a plurality of photoelectric converter elements 103 arranged in a row direction and in a column direction on a two-dimensional plane of a surface of the substrate 101, a plurality of vertical charge transfer paths 105 for reading out signal charge accumulated in the photoelectric converter elements 103 and for sequentially transferring the charge in the column direction, a horizontal charge transfer path 107 connected to an end section of each of the vertical charge transfer paths 105 for transferring in a horizontal direction the charge transferred from the vertical charge transfer paths 105, and an output amplifier 111 for amplifying the charge transferred from the horizontal charge transfer path 105 and for outputting charge resultant from the amplification to an external device.

The device X further includes a readout gate 103a between the photoelectric converter 103 and the vertical charge transfer path 105 to read charge from the converter 103 to the path 105.

FIG. 42 shows a cross-sectional view of the horizontal charge transfer path 107.

The path 107 includes a p-type well layer 108 formed in the semiconductor substrate 101, an n-type conductor layer 118 manufactured in the layer 108, and two layers of polycrystalline silicon including a first polycrystalline silicon layer and a second polycrystalline silicon layer fabricated on the substrate 101.

The n-type conductor layer 118 includes a region 118a having a low concentration of n-type impurity and a region 118b having a high concentration of n-type impurity in an alternate fashion. The low-concentration region 118a forms a potential barrier B having high potential energy and the high-concentration region 118b constitutes a potential well W having low potential energy.

The potential barrier and the potential well are alternately disposed in a horizontal direction. One set including one of the potential barriers and one of the potential wells forms one charge transfer unit (to be referred to as one packet herebelow). A large number of packets are manufactured in the horizontal direction.

On the low-concentration region 118a, polycrystalline silicon electrodes (horizontal transfer electrodes 121-0, 121-2, 121-4, etc.) are fabricated in a first layer, and polycrystalline silicon electrodes (horizontal transfer electrodes 121-1, 121-3, 121-5, etc.) are formed in a second layer.

The electrode 121-0 is connected to the electrode 121-1, and a voltage waveform $\phi 1$ is applied thereto. The electrode 121-2 is connected to the electrode 121-3, and a voltage waveform $\phi 2$ is applied thereto. Similarly, the electrode 121-4 is connected to the electrode 121-5, and a voltage waveform $\phi 1$ is applied thereto.

FIG. 43 is a plan view primarily showing a layout of the vertical charge transfer electrodes.

This layout includes four vertical charge transfer electrodes EV, i.e., EV1 to EV4 in a vertical direction for first one of the photoelectric converters 103 arranged in a column direction. For each of second and third ones of the converters 103 sandwiching the first one converter 103 therebetween, four vertical charge transfer electrodes E5 to E8 are disposed.

For the vertical charge transfer electrodes EV1 to EV8, there are further included a driving circuit, not shown, to apply voltage waveforms V1 to V8 to the respective vertical charge transfer electrodes EV1 to EV8.

The voltage waveforms V1 to V4 (or, V5 to V8) are controlled, for example, as follows. To form a potential barrier B in the vertical charge transfer path 105, 0 V is applied to the vertical charge transfer electrodes; to form a potential well W in the vertical charge transfer path 105, 8 V are applied thereto; and to read electric charge from the photoelectric converter 103, 15 V are applied thereto.

The vertical charge transfer path 105 is electrically linked with a region of the horizontal charge transfer path 107 in which one potential well W is formed for each packet.

Referring now to FIGS. 43, 44A to 44C, and 45A to 45C, description will be given of operation of the solid-state image pickup device X.

Assume that the vertical charge transfer electrodes are first set as EV1=0 V, EV2=8 V, EV3=8 V, and EV4=0 V to thereafter set the electrode V3 to 15 V.

As shown in FIG. 44A, charge accumulated in the photoelectric converters 103 is read therefrom via the transfer gate 103a to the vertical charge transfer path 105. The electrode E3 is then restored to 8 V.

As can be seen from FIG. 44B, all charge read out to the transfer path 105 is transferred one transfer stage in the vertical direction to the horizontal charge transfer path 107.

Description will now be given in detail of the operation to transfer charge through the vertical charge transfer path 105 in a step of one transfer stage, i.e., in a stage-by-stage way.

The vertical charge transfer electrode EV4 is set to 8 V. Charge is distributed to regions below the vertical charge transfer electrodes EV2 to EV4.

Thereafter, the transfer electrode EV2 is set to 0 V. Charge is confined in a semiconductor region below the transfer electrodes EV3 and EV4.

When the transfer electrode EV5 (EV1) is set to 8 V, charge is dispersed in a semiconductor region below the transfer electrodes EV3 to EV5.

When the transfer electrode EV 3 is set to 0 V, charge is confined in a semiconductor region below the electrodes EV4 and EV5.

When the electrodes EV6 (EV2) and EV4 (EV8) are respectively set to 8 V and 0 V, charge is accumulated in a semiconductor region below the electrodes EV5 and EV6.

Charge read from one photoelectric converter 103 to the transfer stage 41 of the vertical charge transfer path 105 contiguous to the horizontal charge transfer path 107 in the vertical direction is fed to the transfer path 107.

As shown in FIG. 44C, the charge fed to the transfer path 107 is then transferred through the path 107 and is outputted to an external device.

The operation above is thereafter conducted such that the charge read out to the vertical charge transfer path 105 is again transferred one transfer stage 141 in the vertical direction to the horizontal charge transfer path 107.

The electric charge read out to the transfer stage 141 of the vertical charge transfer path 105 contiguous to the horizontal charge transfer path 107 in the vertical direction is transferred to the transfer path 107. The charge is then horizontally delivered through the path 107 to be fed to an external device.

By repeatedly conducting the operation above, the electric charge can be read from all pixels of the solid-state image pickup device X. That is, an overall pixel readout operation is achieved.

The overall pixel readout method allows a maximum value for resolution in the solid-state image pickup device, for example, a digital still camera and hence is suitable for the reproduction of still pictures with high quality.

As the number of pixels of the solid-state image pickup device increases, a period of time to read out image signals of one frame becomes longer. In a digital still camera conforming to standards of the national television system committee (NTSC), a frame rate of image signals is, for example, one frame per 1/30 seconds.

To reproduce a still picture shot by a digital camera, even when the time to read out image signals is increased, there does not arise any serious problem.

However, for a liquid-crystal display disposed in a digital still camera to monitor an image before the image is actually shot, it is required to increase the period of mobile pictures to display mobile pictures in a realtime fashion. That is, in an operation to display a mobile picture (to be referred to as a mobile picture in a movie mode herebelow), when the number of pixels increases, the system cannot achieve the operation according to the frame rate in some cases.

Particularly, when the total number of pixels exceeds one million in the solid-state image pickup device, it is difficult to read image signals from all pixels in the frame rate of 1/30 sec. and hence the monitor picture becomes obscure.

To overcome this difficulty, the charge is read from the photoelectric converters 103 to the vertical charge transfer paths 105, for example, as shown in FIGS. 45A to 45C by thinning out signal charge at an equal interval in the vertical direction. By transferring only the charge thus thinned out, the display period (readout period) can be increased to display mobile pictures by a thinning readout operation.

In the thinning readout operation, the system does not read the charge from all photoelectric converters 103 arranged in the column direction, but reads, for example, the charge from every second row of the photoelectric converters arranged adjacent to each other in the vertical direction and feeds the obtained charge to the vertical charge transfer path 105 as shown in FIG. 45A (the charge thus attained is indicated by a negative sign in a small circle in FIGS. 45A to 45C).

As can be seen from FIG. 45B, the charge read out to the vertical charge transfer path 105 is vertically transferred toward the horizontal charge transfer path 107 in a similar way.

As shown in FIG. 45C, the charge of one photoelectric converter 103 fed to the transfer path 107 is then horizontally transferred through the path 107.

Description has been given of the charge indicated by a negative sign in a small circle. It is also possible that the charge thinned out in the preceding operation, indicated by an open circle in FIG. 45, is read by the thinning readout operation and is fed to the transfer path 105. The charge is then similarly transferred to the transfer path 107.

In the thinning readout described above, the picture obtained from the photoelectric converters has a maximum sensitivity substantially equal to a signal accumulation period which is a readout period. That is, the quicker the display period is, the lower the maximum sensitivity is.

Even if the object to be shot is dark, when a flashlight is used in a final shooting operation (in a still picture reproduction mode using the overall pixel readout), it is possible to obtain sufficient intensity of illumination for the object.

However, the monitor image is used to observe and to determine an object before the object is actually shot. Therefore, peripheral areas of the object remain dark in the observation of the monitor image. This leads to a problem that a moment of a good picture is possibly lost and/or a desired final picture cannot be easily attained.

SUMMARY OF THE INVENTION

It is therefore an object of the present invention to provide a solid-state image pickup device, a method of controlling the same, and a solid-state image pickup apparatus using the same in which in the movie mode to display mobile pictures, the display sensitivity is improved and a clear image can be obtained even for a dark object.

According to one aspect of the present invention, there is provided a solid-state image pickup device comprising a plurality of photoelectric converter elements arranged in columns in a vertical direction with a predetermined pitch and in rows in a horizontal direction with a predetermined pitch on a two-dimensional plane; a plurality of vertical charge transfer paths respectively fabricated adjacent to the columns of said photoelectric converter elements, each said path including a plurality of charge transfer stages; a plurality of vertical charge transfer electrodes fabricated on each said vertical charge transfer paths for transferring charge through said each vertical charge transfer path one said charge transfer stage in each transfer period; a horizontal charge transfer path fabricated to be connected to an end section of each said vertical charge transfer path for receiving charge transferred from said vertical charge transfer path and for transferring the charge in a horizontal direction; a plurality of horizontal charge transfer electrodes fabricated on said horizontal charge transfer path in a horizontal direction; an output amplifier fabricated to be connected to an end section of said horizontal charge transfer path for amplifying charge supplied from said horizontal charge transfer path and for outputting charge resultant from the amplification to an external device; and a control circuit operating in a two driving modes including a thinning readout mode and an adding movie mode, said control circuit reading, in the thinning readout mode, charge from said photoelectric converter elements to only part of said charge transfer stages, said control circuit transferring the charge from said vertical charge transfer path to said horizontal charge transfer path, said control circuit reading, in the adding movie mode, charge from said photoelectric converter elements to all said charge transfer stages, said control circuit transferring the charge of at least two said photoelectric converter elements from said vertical charge transfer path to said horizontal charge transfer path to add each said charge to each other, said control circuit stopping a transfer of charge from said vertical charge transfer path to said horizontal charge transfer path, said control circuit outputting by said horizontal charge transfer path charge resultant from the addition to an-external device.

According to one aspect of the present invention, there is provided a solid-state image pickup apparatus, comprising: a plurality of photoelectric. converter elements arranged in columns in a vertical direction with a predetermined pitch and in rows in a horizontal direction with a predetermined pitch on a two-dimensional plane; a plurality of vertical charge transfer paths respectively fabricated adjacent to the columns of said photoelectric converter elements, each said path including a plurality of charge transfer stages; a plurality of vertical charge transfer electrodes fabricated on each said vertical charge transfer paths for transferring charge through said each vertical charge transfer path one said charge transfer stage in each transfer period; a horizontal charge transfer path fabricated to be connected to an end section of each said vertical charge transfer path for receiving charge transferred from said vertical charge transfer path and for transferring the charge in a horizontal direction;

a plurality of horizontal charge transfer electrodes fabricated on said horizontal charge transfer path in a horizontal direction; an output amplifier fabricated to be connected to an end section of said horizontal charge transfer path for amplifying charge supplied from said horizontal charge transfer path and for outputting charge resultant from the amplification to an external device; and a control circuit operating in a two driving modes including a thinning readout mode and an adding movie mode, said control circuit reading, in the thinning readout mode, charge from said photoelectric converter elements to only part of said charge transfer stages, said control circuit transferring the charge from said vertical charge transfer path to said horizontal charge transfer path, said control circuit reading, in the adding movie mode, charge from said photoelectric converter elements to all said charge transfer stages, said control circuit transferring the charge of at least two said photoelectric converter elements from said vertical charge transfer path to said horizontal charge transfer path to add each said charge to each other, said control circuit stopping a transfer of charge from said vertical charge transfer path to said horizontal charge transfer path, said control circuit outputting by said horizontal charge transfer path charge resultant from the addition to an external device; an optical lens; an iris mechanism for controlling a quantity of light for exposure; a mobile picture monitor display for displaying a shooting object when necessary; a light monitor for measuring brightness of a peripheral area of the shooting object; and a switch responsive to a result of the measurement by said light monitor for automatically selecting, when the brightness of the peripheral area of the shooting object exceeds a reference value, driving of the device in the thinning readout mode and for automatically selecting, when the brightness of the peripheral area of the shooting object is less than a reference value, driving of the device in the adding movie mode.

According to one aspect of the present invention, there is provided a method of controlling a solid-state image pickup apparatus comprising a solid-state image pickup device including a plurality of photoelectric converter elements arranged in columns in a vertical direction with a predetermined pitch and in rows in a horizontal direction with a predetermined pitch on a two-dimensional plane, a plurality of vertical charge transfer paths respectively fabricated adjacent to the columns of said photoelectric converter elements, each said path including a plurality of charge transfer stages; n vertical charge transfer electrodes (n is an integer equal to or more than three) vertically fabricated for each said charge transfer stage on each said vertical charge transfer path, a horizontal charge transfer path fabricated to be connected to a lower end section of a plurality of said vertical charge transfer paths for receiving charge transferred from said vertical charge transfer paths and for transferring the charge in a horizontal direction, an output amplifier fabricated to be connected to an end section of said horizontal charge transfer path for amplifying charge supplied from said horizontal charge transfer path and for outputting charge resultant from the amplification to an external device, and a driving circuit including a timing generator for generating driving pulse signals to said vertical charge transfer paths to drive said solid-state image pickup device; an optical lens, an iris mechanism, a mobile picture monitor display for displaying a shooting object, a light monitor for measuring brightness of a peripheral area of the shooting object, and a shooting method switch for changing a shooting method according to an output from said light monitor, comprising the steps of: a) setting the apparatus to a movie mode and for displaying a monitor image on the mobile picture monitor display; b) measuring by the light monitor a quantity of light in peripheral area of the shooting object and selecting, when the quantity of light measured exceeds a reference value, a thinning readout mode in which the charge of said photoelectric converters read out to only part of said charge transfer stages is read out to said vertical charge transfer path associated therewith and is transferred from said vertical charge transfer path to said horizontal charge transfer path, and selecting, when the quantity of light measured is less than a reference value, an adding movie mode in which the charge is read out to all said charge transfer stages, the charge of at least two said photoelectric converters is transferred from said vertical charge transfer path to said horizontal charge transfer path, each said charge is added to each other, a transfer of charge from said vertical charge transfer path to said horizontal charge transfer path is stopped, and charge resultant from the addition is transferred and is outputted by said horizontal charge transfer path to an external device; c) transferring the charge fed to said horizontal charge transfer path, amplifying the charge by the output amplifier, and delivering charge resultant from the amplification to an external device; d) repeatedly executing said steps b) and c) and continuously displaying a picture on the monitor display in the thinning readout mode or the adding movie mode; and e) shooting a still picture at a desired point of timing.

According to the solid-state image pickup device (apparatus) of the present invention, even when a shooting object to be shot is, for example, dark, it is possible to obtain a monitor picture or image with high sensitivity to observe an image of the object before the object is finally shot (as a still picture). The user can shoot the image at a suitable moment for a good picture and can readily obtain a desired picture.

BRIEF DESCRIPTION OF THE DRAWINGS

The objects and features of the present invention will become more apparent from the consideration of the following detailed description taken in conjunction with the accompanying drawings in which:

FIGS. 8A to 8C are diagrams sequentially showing operations in an overall pixel readout mode employed to reproduce a still picture or the like;

FIGS. 11A to 11C are diagrams showing thinning readout operations (in a thinning readout movie mode) to reproduce a monitor image;

FIGS. 24A to 24C are diagrams sequentially showing operations in an overall pixel readout mode employed to reproduce a still picture or the like;

FIGS. 26A to 26C are diagrams showing a method of reading charge from all pixels in one readout operation;

FIGS. 27A to 28C are diagram sequentially showing an example of operation in which addition of charge is conducted in the vertical charge transfer path 5 and an addition of charge is further conducted in the horizontal charge transfer path 7;

FIG. 28 is a diagram showing an example of operation in which addition of charge is conducted in the vertical charge transfer path 5 and an addition of charge is further conducted in the horizontal charge transfer path 7;

FIGS. 33A to 33E are diagram for specifically explaining a readout operation when photoelectric converter elements and color filters are disposed in horizontal and vertical directions;

FIGS. 34A to 34E are diagram for specifically explaining a readout operation when photoelectric converter elements and color filters are disposed in horizontal and vertical directions;

FIGS. 35A to 35E are plan views showing a solid-state image pickup device in a shifted-pixel layout;

FIGS. 36A to 36E are plan views showing a solid-state image pickup device in a shifted-pixel layout;

FIGS. 37A to 37E are diagram showing a readout example in a movie mode when color filters are disposed in a Bayer layout;

Figures 38A, 38B, 38C, 38D, 38E:
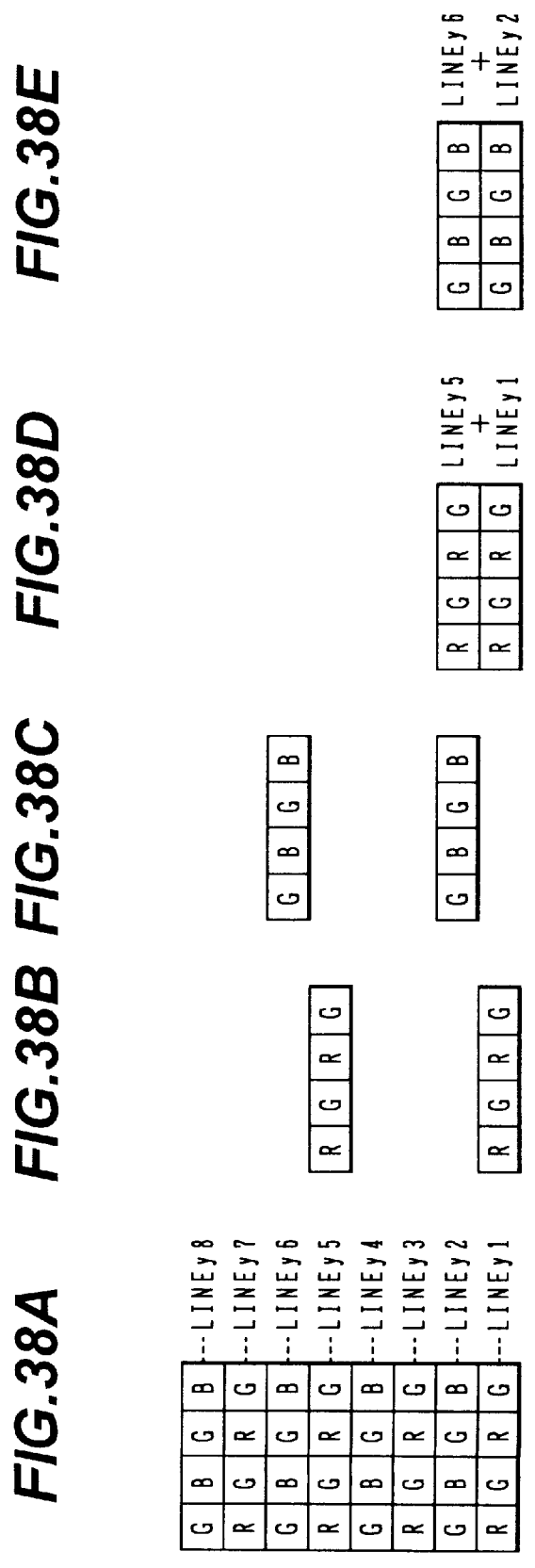

FIGS. 38A to 38E are diagrams showing a readout example in a movie mode when color filters are disposed in a Bayer layout;

FIGS. 44A to 44C are diagrams showing operation of a solid-state image pickup device.

DESCRIPTION OF THE PREFERRED EMBODIMENTS

In this specification, one charge transfer stage is defined as a region of a shortest transfer path. Specifically, to transfer charge using a plurality of charge transfer electrodes on a charge transfer path (charge transfer channel), when a set of voltage signals having mutually different phases are applied to the charge transfer electrodes, charge can be transferred from a current transfer stage to a transfer subsequent stage and the charge is not returned to the original transfer stage. This stage is defined as one charge transfer stage.

Figure 1:
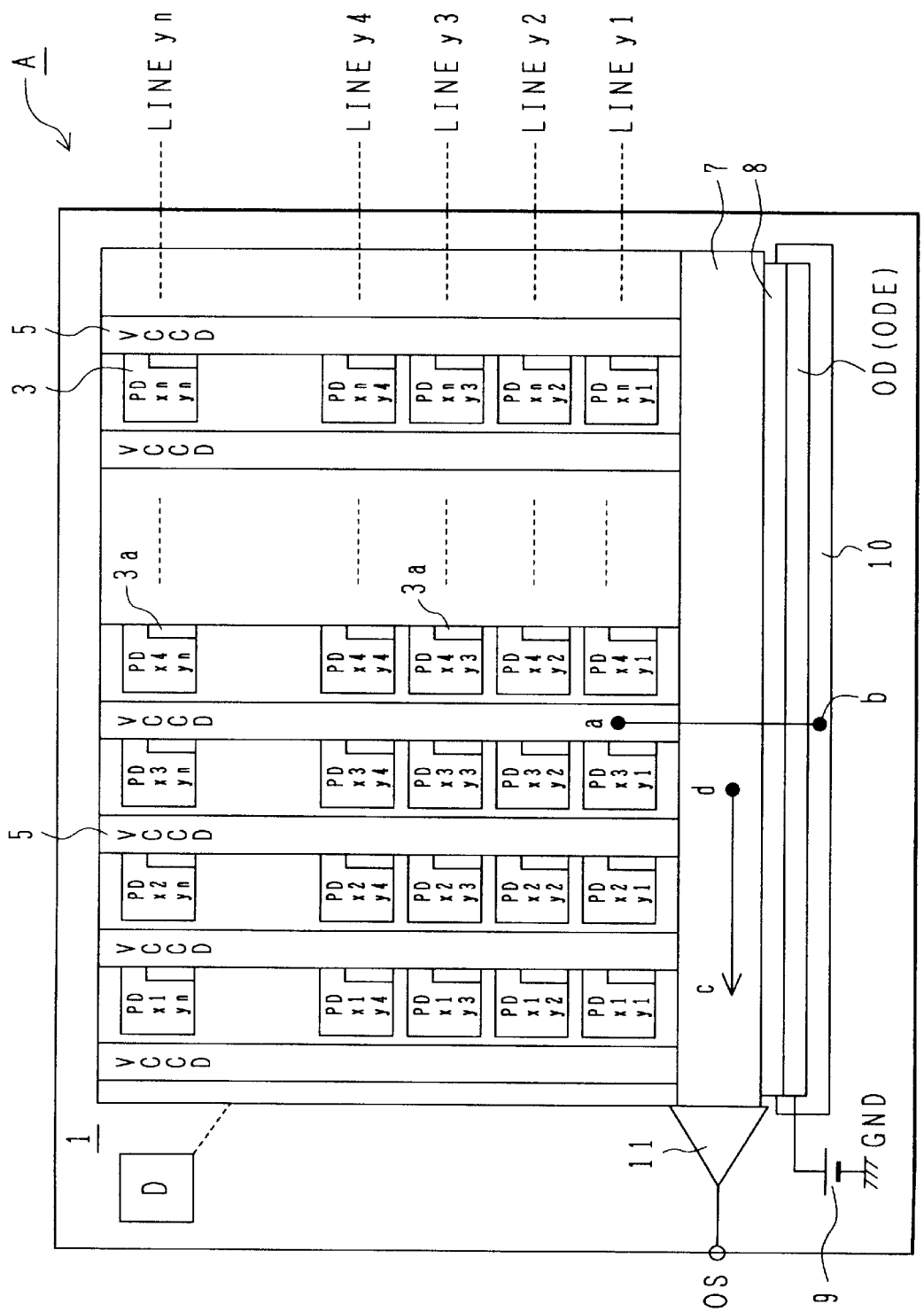
FIG. 1 is a plan view showing a first embodiment of a solid-state image pickup device according to the present invention.

FIG. 1 shows in a plan view an embodiment of a solid-state image pickup device A according to the present invention.

The solid-state image pickup device A of FIG. 1 includes a semiconductor substrate 1, a plurality of photoelectric converters or converter elements (photodiodes PDs) 3 arranged in rows and columns on a two-dimensional plane on a surface of the substrate 1, a plurality of vertical charge transfer paths 5 for reading signal charge from the respective photoelectric converters 3 and for sequentially transferring the charge in a column direction, a horizontal charge transfer path 7 connected to an end section of each of the vertical charge transfer paths 5 for transferring in a horizontal direction the charge fed from the vertical charge transfer paths 5; and an output amplifier 11 for amplifying the charge fed from the horizontal charge transfer path 7 and for outputting the resultant charge to an external device.

Disposed between each photoelectric converter 3 and the vertical charge transfer path 5 disposed adjacent thereto is a readout gate 3a to read charge from the converter 3 to the path 5.

In a semiconductor region 1 which is contiguous in a vertical direction to the horizontal charge transfer path 7 and which is below the path 7, there is fabricated a charge amount adjusting barrier layer 8 slightly doped with a p-type impurity to extend along the path 7 in a horizontal direction. The barrier layer 8 accumulates charge in a well layer of the path 7. When the charge accumulated therein is equal to or more than a predetermined value, the barrier layer 8 draws or delivers the excess charge from the path 7.

The device A further includes a overflow drain region OD doped with an n-type impurity to extend in a horizontal direction along the barrier layer 8 in the substrate 1.

On the overflow drain region OD, there is manufactured an overflow drain electrode ODE. Disposed between the electrode ODE and a point of ground potential GND is a power source 9. The power source 9 may be a fixed power source or a variable power source.

The device A includes a separating zone 10 which is a p-type region having a high impurity concentration and which is arranged vertically below the overflow drain region OD to cover a peripheral region of the overflow drain OD.

The device A includes photoelectric converters 3 in n columns by n rows, namely, columns x1 to Xn for each row and rows y1 to yn for each column. The device A may include photoelectric converters 3 with columns X1 to Xm for each row and rows y1 to yn for each column.

Figure 2:
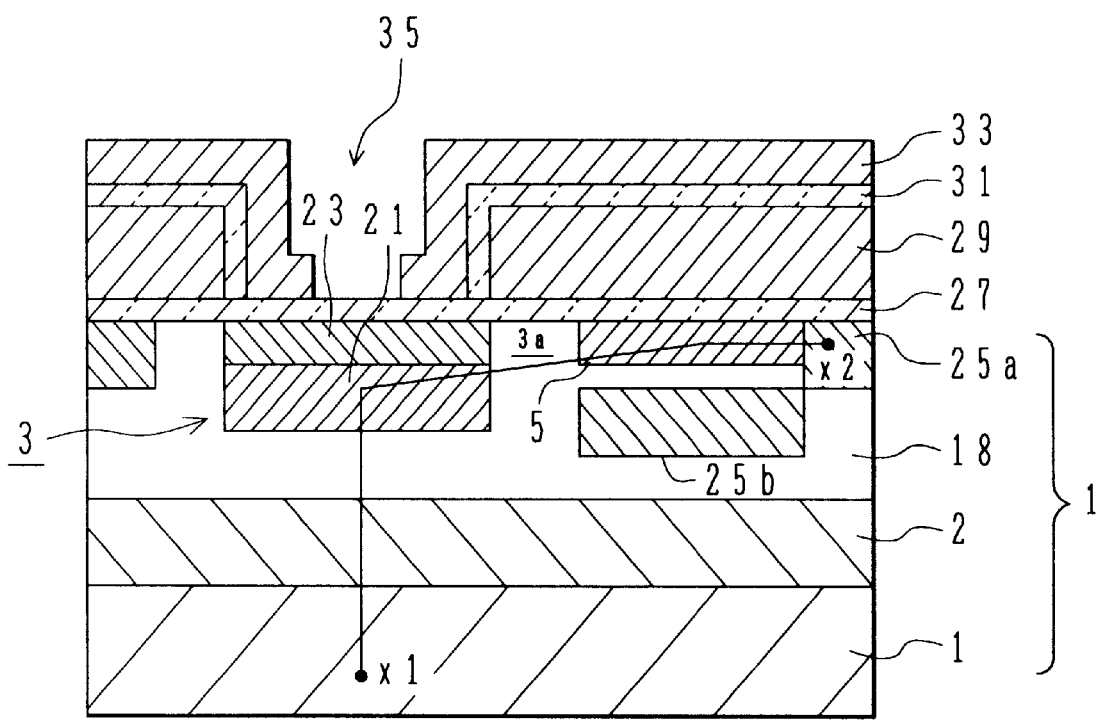
FIG. 2 is a cross-sectional view showing a photoelectric converter element and its periphery.
Figure 3:
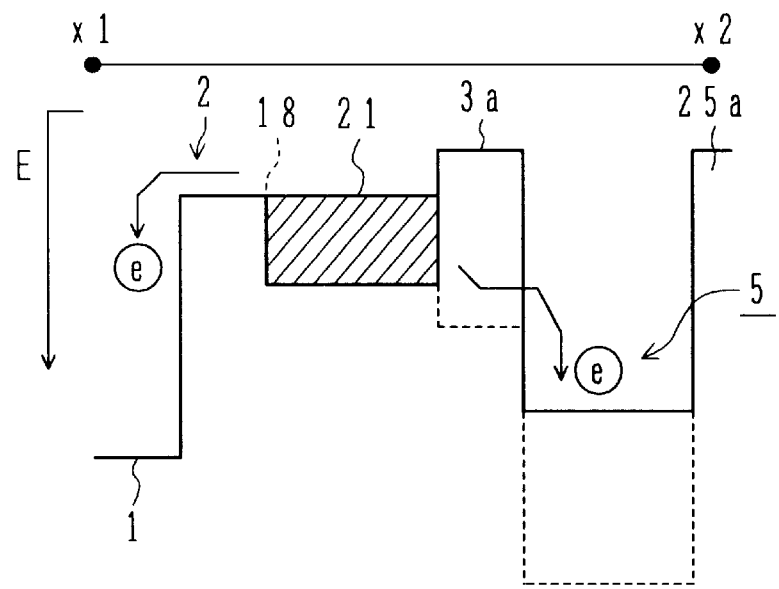
FIG. 3 is a diagram schematically showing energy potential along line x1-x2 of FIG. 2.

FIG. 2 shows in a cross-sectional view the photoelectric converter 3 and its periphery, and FIG. 3 shows a cross section taken along a line x1-x2 of FIG. 2.

As can be seen from FIG. 2, a p-type well layer 2 is fabricated on an n-type semiconductor substrate 1. Arranged on the p-type well layer 2 is, for example, a p-type semiconductor layer 18 having a low impurity concentration. Photoelectric converters (photodiodes) 3 and a vertical charge transfer path 5 are manufactured in the p-type layer 18.

Each photoelectric converter 3 includes a p-n junction formed between an n-type conductor layer 21 doped with an n-type impurity and a p-type conductor layer 23 fabricated in a semiconductor region on the n-type conductor layer 21.

The vertical charge transfer path 5 of an n-type conductor layer is formed adjacent to the photoelectric converters 3. The p-type semiconductor layer 18 disposed between the converters 3 and the path 5 serves as a readout gate 3a. Disposed on a side of the path 5 opposite to the gate 3a is an isolation layer 25a highly doped with a p-type impurity. The device 3 further includes an isolation well layer 25b highly doped with a p-type impurity below the path 5 with part of the p-type layer 18 therebetween.

On a surface of the upper-most p-type semiconductor layer 18 of the substrate 1, there is fabricated a thin insulating layer 27 of, for example, an oxide. Manufactured on the insulating film 27 excepting a light receiving surface of the photoelectric converter 3 is a vertical charge transfer electrode 29 of, for example, a polycrystalline silicon on which a thin insulation film 31 is fabricated. On the film 31, there is formed a light shielding film 33 of, for example, aluminum. Formed in the film 33 is an opening 35 in which the light receiving surface of the converter 3 is exposed.

FIG. 3 schematically shows energy potential of a semiconductor region along line X1-X2 of FIG. 2.

As above, in a direction from X1 to X2, the device A sequentially includes the n-type semiconductor substrate 1 having a low potential, the p-type well layer 2 having a high potential, the i-type or n⁻-type semiconductor layer 18, the n-type semiconductor layer 21 as part of the photoelectric converter 3, the p-type semiconductor layer 3a having a high potential and constituting the readout gate, the n-type semiconductor layer 5 having a low potential and constituting the vertical charge transfer path 5, and the p-type semiconductor layer 25a having a high potential and constituting the isolating zone.

When light enters the photoelectric converter 3, the converter 3 generates charge corresponding thereto. Electrons of the charge are accumulated in the n-type semiconductor layer 21 as part of the converter 3.

When a high positive voltage, for example, a voltage of 15 V is applied to the vertical charge transfer electrode 29 (FIG. 2), a high positive reading voltage is applied to the p-type semiconductor layer 3a constituting the readout gate. Potential of the gate 3a is therefore decreased as indicated by a dotted line. Potential of the n-type semiconductor layer 5 having a low potential and constituting the vertical charge path 5 is similarly decreased (as indicated by a dotted line).

The charge accumulated in the n-type semiconductor layer 21 as part of the converter 3 then flows into the n-type semiconductor layer 5 having a low potential and constituting the vertical charge path 5. If the voltage applied to the vertical charge transfer electrode 29 is, for example, 8 V, a potential well is formed in the n-type semiconductor layer 5 having a low potential and constituting the vertical charge path 5 beneath the electrode 29.

The charge read from the photoelectric converter 3 is accumulated in the potential well formed in the n-type semiconductor layer 5 constituting the vertical charge path 5.

Figure 4:
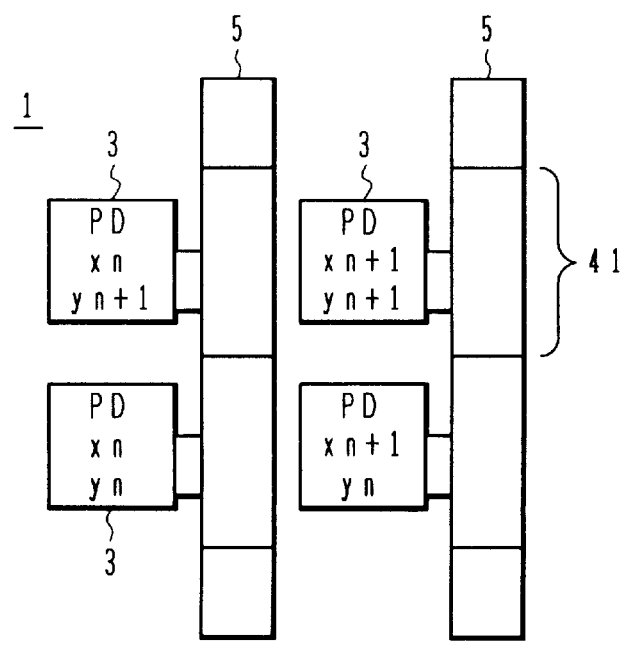
FIG. 4 is a plan view a layout of photoelectric converter elements and vertical charge transfer paths manufactured in a semiconductor substrate.
Figure 5:
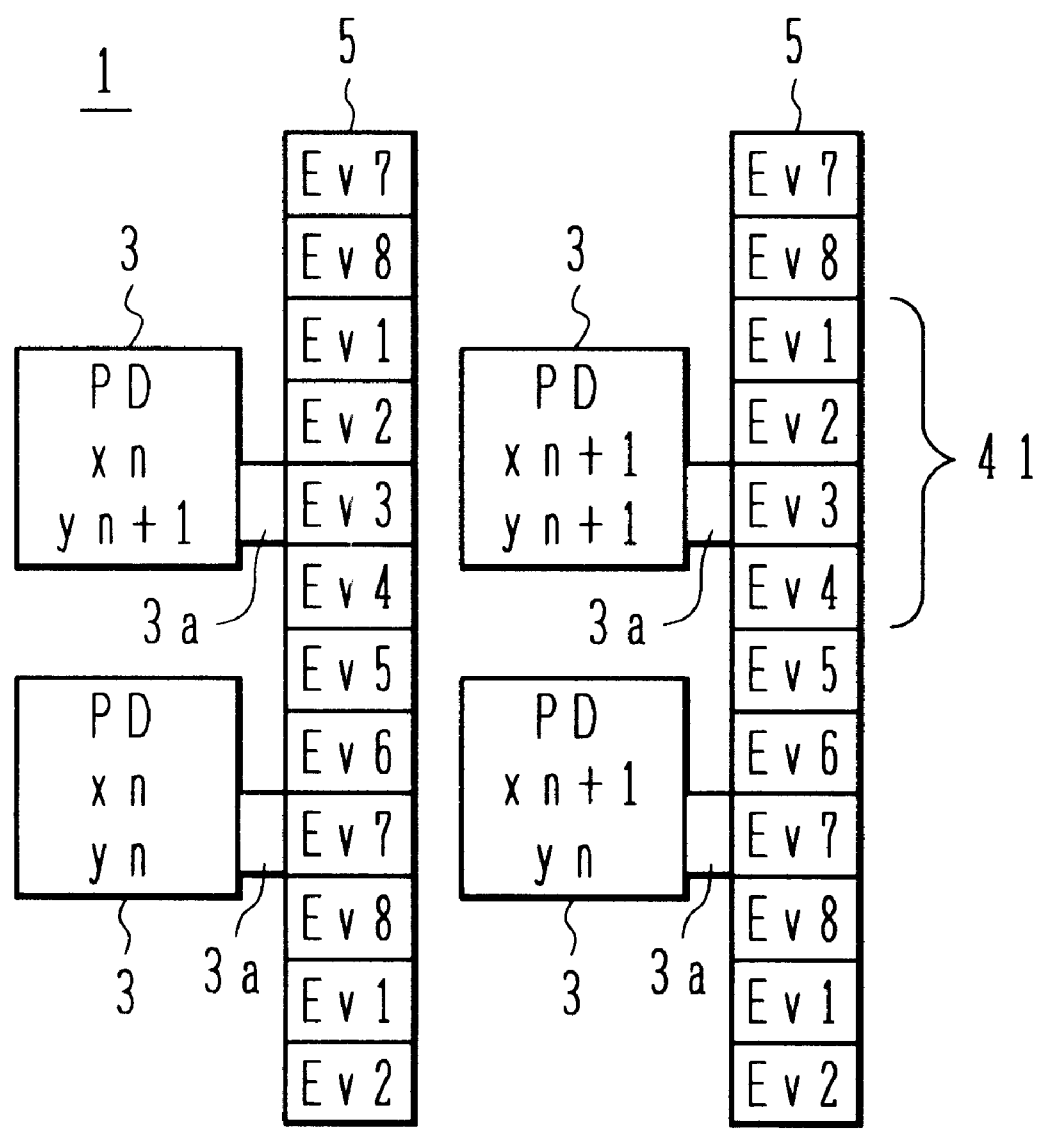
FIG. 5 is a plan view a layout of vertical charge transfer paths in a semiconductor substrate.

FIG. 4 shows in a plan view a layout of photoelectric converters 3 and vertical charge transfer paths 5 manufactured in the semiconductor substrate 1. FIG. 5 shows in a plan view a layout of the vertical charge transfer paths 5 (EV1 to EV8) in the semiconductor substrate 1.

FIGS. 4 and 5 include a region 41 which is one charge transfer stage.

As shown in FIG. 5, four vertical charge transfer electrodes EV are successively arranged for one transfer stage. By applying four kinds of signal pulses having mutually different phases to four electrodes EV, charge is transferred one transfer stage in a four-phase driving mode.

As can be seen from FIG. 4, one photoelectric converter 3 is fabricated for each charge transfer stage 41 of the vertical charge transfer path 5. As shown in FIG. 5, four electrodes (e.g., EV1 to EV4 or EV5 to EV8) are disposed for each charge transfer stage 41 of the path 5.

Figure 6:
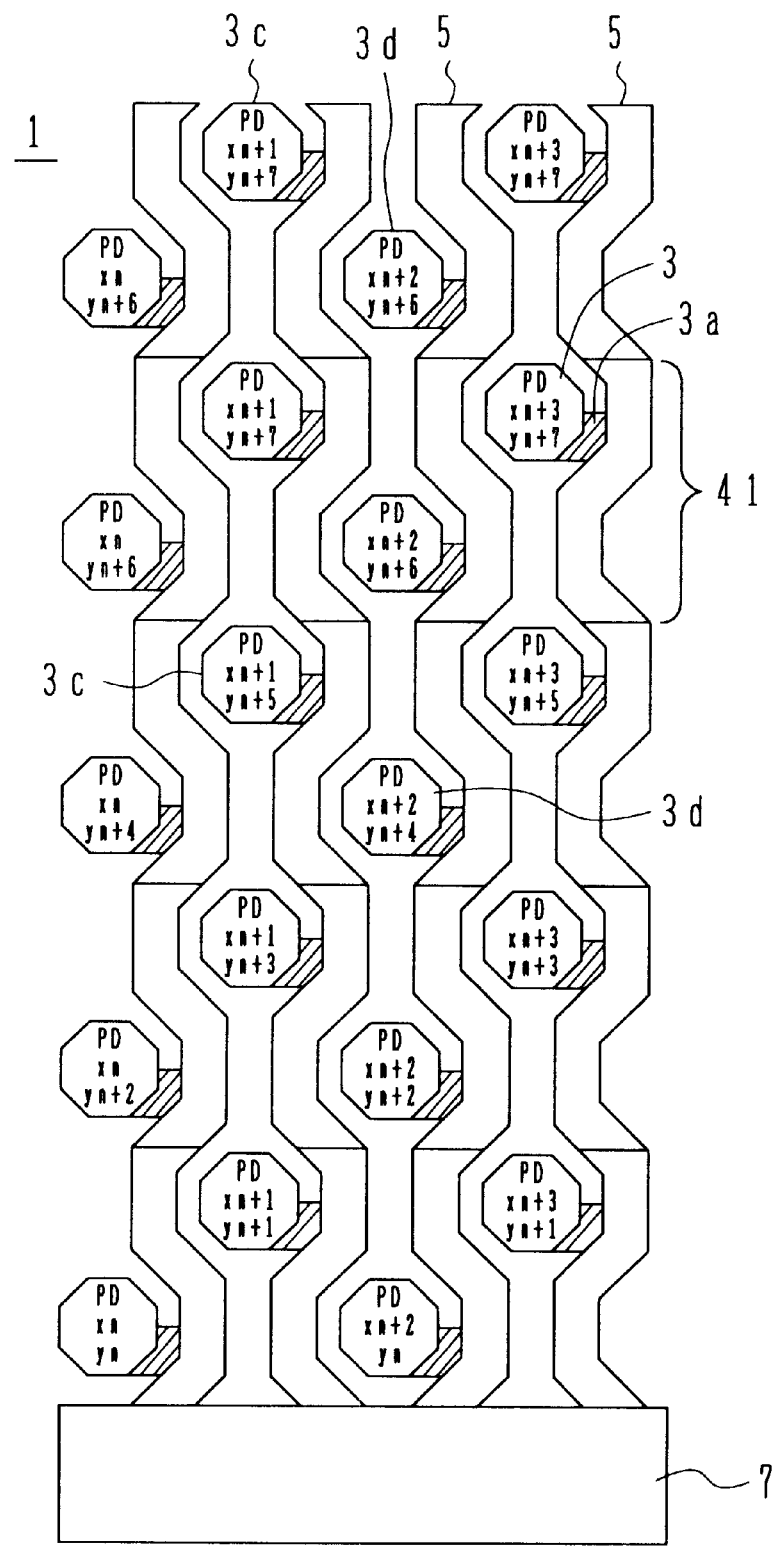
FIG. 6 is a plan view showing a variation of the solid-state image pickup device shown in FIG. 4.
Figure 7:
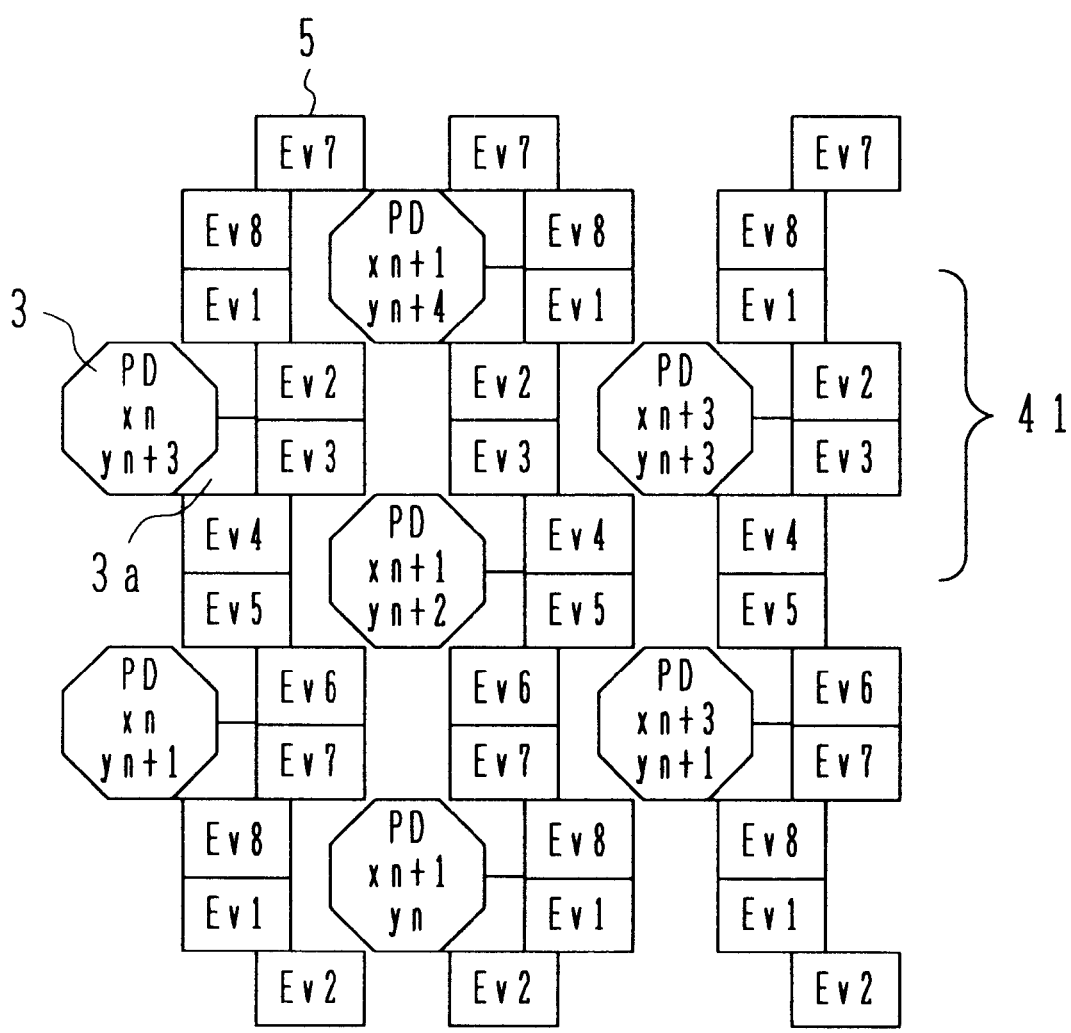
FIG. 7 is a plan view showing a variation of the solid-state image pickup device of FIG. 5.

FIGS. 6 and 7 are plan views showing variations of the solid-state image pickup device of FIGS. 4 and 5.

In the configuration of FIGS. 6 and 7, each photoelectric converter 3 has a shape of substantially a regular octagon. The converters 3 are arranged in a shifted-pixel layout. Namely, the converters 3c arranged with a pixel pitch in a vertical column are shifted one half-of the pixel pitch relative to the converters 3d arranged in a vertical column to be horizontally adjacent to the converters 3c.

Also in this structure, one photoelectric converter 3 is manufactured for every charge transfer stage 41 of the vertical charge transfer path 5. Disposed on the path 5 are four electrodes (e.g., EV1 to EV4 or EV5 to EV8) for each charge transfer stage 41.

Description will now be given of operation of the solid-state image pickup device configured as shown in FIGS. 4 and 5 or FIGS. 6 and 7.

Figure 8A:
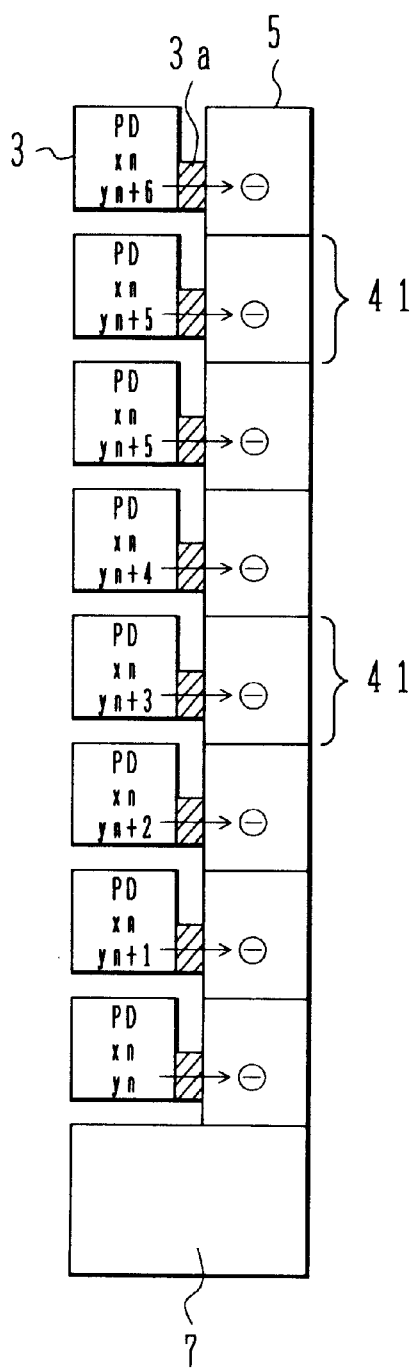
Figure 8B:
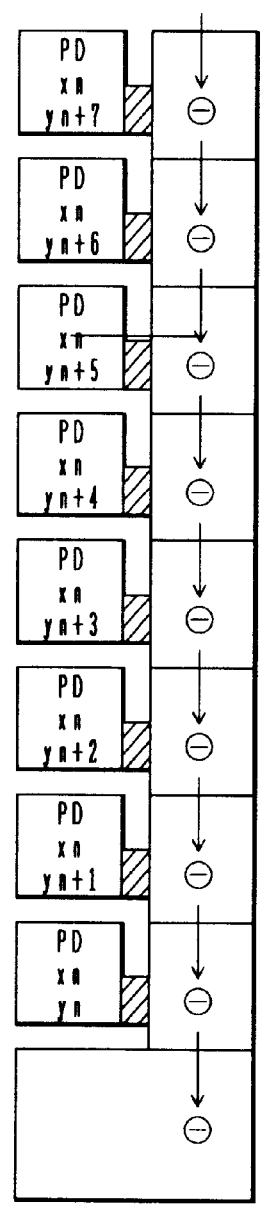
Figure 8C:
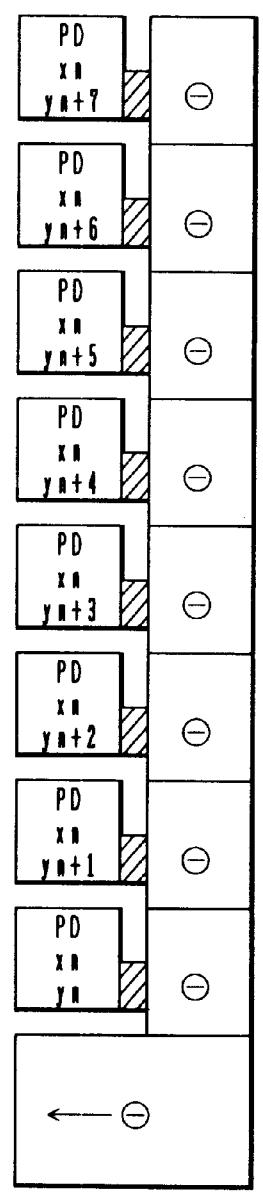

FIGS. 8A to 8C schematically show operation of the device in an overall pixel readout mode to reproduce a still picture or the like. The operation will be described by referring to FIGS. 4 to 7 when necessary. Charge read from the photoelectric converter 3 is schematically indicated by a negative sign in a small circle.

As can be seen from FIG. 7 and 8A, a reading pulse voltage is applied to each of the vertical charge transfer electrodes EV3 and EV7. Signal charge accumulated in the converters 3 of the device X is entirely read out to the associated vertical charge transfer path 5.

FIG. 8B shows operation to transfer charge in a step of one transfer stage (41).

The electrode EV4 is first set to 8 V. Charge is distributed in a semiconductor region below the electrode EV2 to the electrode EV4. The electrode EV2 is then set to 0 V. Charge is confined in a semiconductor region below the electrode EV3 and the electrode EV4. When the electrode EV5 (EV1) is set to 8 V, charge is distributed in a semiconductor region below the electrode EV3 to the electrode EV5. When the electrode EV3 is set to 0 V, charge is confined in a semiconductor region below the electrode EV4 and the electrode EV5. When the electrode EV6 (EV2) is set to 8 V and the electrode EV4 (EV8) to 0 V, charge is accumulated in a semiconductor region below the electrode EV5 and the electrode EV6.

As a result of the operation above, the charge read out to the vertical charge transfer path 5 is transferred therethrough one transfer stage (41) toward the horizontal charge transfer path 7.

As can be seen from FIG. 8C, in each charge transfer to the path 7, the charge is transferred through the path 7 in a horizontal direction (toward the output amplifier) in a two-phase driving mode.

Figure 9A:
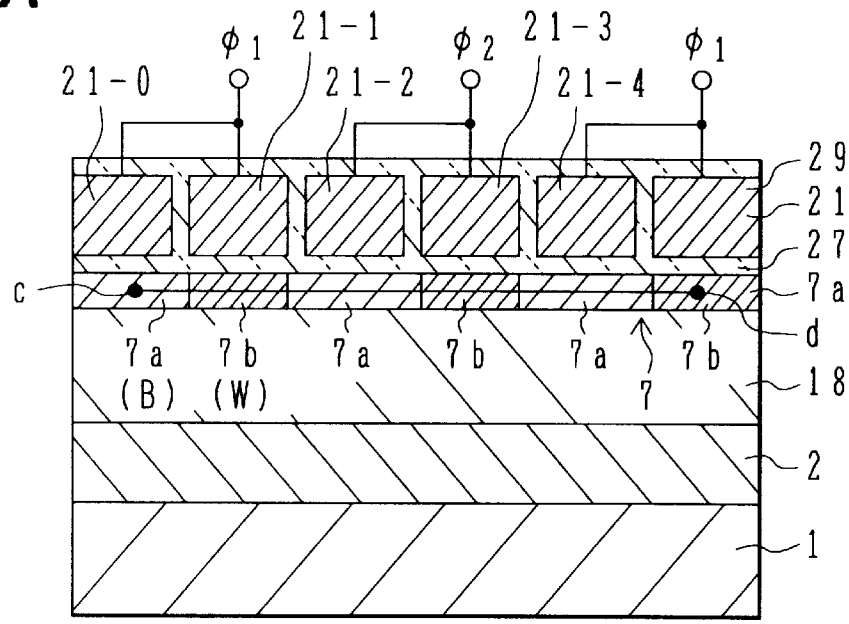
FIG. 9A is a cross-sectional view of a horizontal charge transfer path taken along a line c-d of FIG. 1.
Figure 9B:
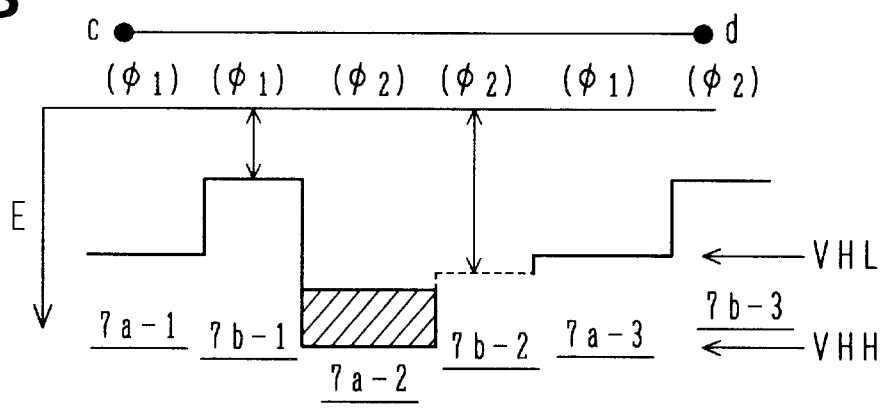
FIG. 9B is a diagram showing a potential profile along the line c-d of FIG. 9A.
Figure 9C:
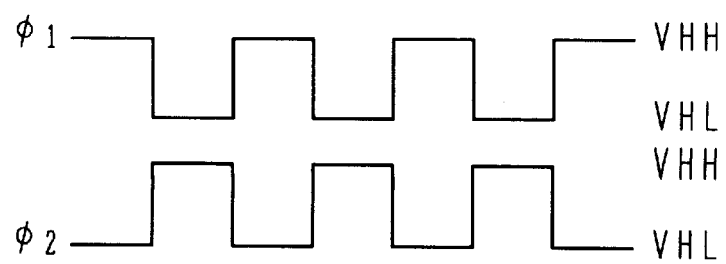
FIG. 9C is a graph showing two-phase driving voltage waveforms applied to the horizontal charge transfer electrode 7.

FIGS. 9A to 9C schematically show operation of the horizontal charge transfer path 7.

FIG. 9A shows a cross-sectional view of the path along a line c-d of FIG. 1. FIG. 9B shows a potential profile along a line c-d of FIG. 9A. FIG. 9C shows two-phase driving voltage waveforms applied to a horizontal charge transfer electrode 21.

As shown in FIG. 9A, the path 7 mainly includes an n-type semiconductor substrate 1, a p-type semiconductor layer 2, a p-type semiconductor layer 18 on the layer 2, an n-type conductor layer 7 fabricated on the layer 18, and two layers of polycrystalline silicon including first and second polycrystalline silicon layers manufactured on the layer 7. with an insulating film 27 therebetween.

The n-type conductor layer 7 alternately includes a low-impurity layer 7b having a low n-type impurity concentration and a high-impurity layer 7a having a high n-type impurity concentration. The layer 7b forms a high-potential barrier B having high potential energy. The layer 7b forms a low-potential well B having low potential energy.

The horizontal charge transfer path 7 alternately includes the potential barrier B and the potential well W in the horizontal direction. One set of the barrier B and the well W constitutes one charge transfer unit (to be referred to as one packet herebelow) of the path 7. A large number of packets are arranged in the horizontal direction.

A horizontal charge transfer electrode 21-0 of the first polycrystalline silicon layer is disposed on the potential barrier B. A horizontal charge transfer electrode 21-1 of the second polycrystalline silicon layer is arranged on the potential well W. Similarly, there are fabricated horizontal charge transfer electrodes 21-2 to 21-5.

The horizontal charge transfer electrode 21-0 is connected to the horizontal charge transfer electrode 21-1, and a voltage waveform φ1 is applied to the electrodes 21-0 and 21-1. The electrode 21-2 is connected to the electrode 21-3, and a voltage waveform φ2 is applied to the electrodes 21-2 and 21-3. Similarly, the electrode 21-4 is connected to the electrode 21-5, and a voltage waveform 0 1 is applied to the electrodes 21-4 and 21-5.

FIG. 9B shows a potential profile of the horizontal charge transfer path 7.

The potential profile of FIG. 9B is obtained when a low voltage is applied to regions 7a-1 and 7b-1 of the path 7, a high voltage to regions 7a-2 and 7b-2 thereof, and a low voltage to regions 7a-3 and 7b-3 thereof.

In a state in which a high voltage is applied to the regions 7a-2 and 7b-2, the potential of these regions is lowered, and hence charge (electron) is transferred to be accumulated in the region 7a-2.

FIG. 9C shows voltage waveforms φ1 and φ2 applied to the horizontal charge transfer electrodes 21. The ordinate is a time axis. The waveforms φ1 alternately includes a high voltage VH and a low voltage VL. The waveform φ2 alternately includes a high voltage VH and a low voltage VL. Timing of the high and low voltages in the waveform φ1 is reverse to timing thereof in the waveform φ2.

By applying the voltage waveforms of FIG. 9C to the horizontal charge transfer electrodes 21, the charge shown in FIG. 9B is sequentially transferred toward the output amplifier 11 (FIG. 1).

The charge is horizontally transferred in the two-phase driving mode.

In FIG. 1, the overflow drain region OD having a high n-type impurity concentration is fabricated on the semiconductor substrate 1 below at least regions of the horizontal charge transfer path 7, the regions being connected to the vertical charge transfer paths 5, respectively.

Figure 10A:
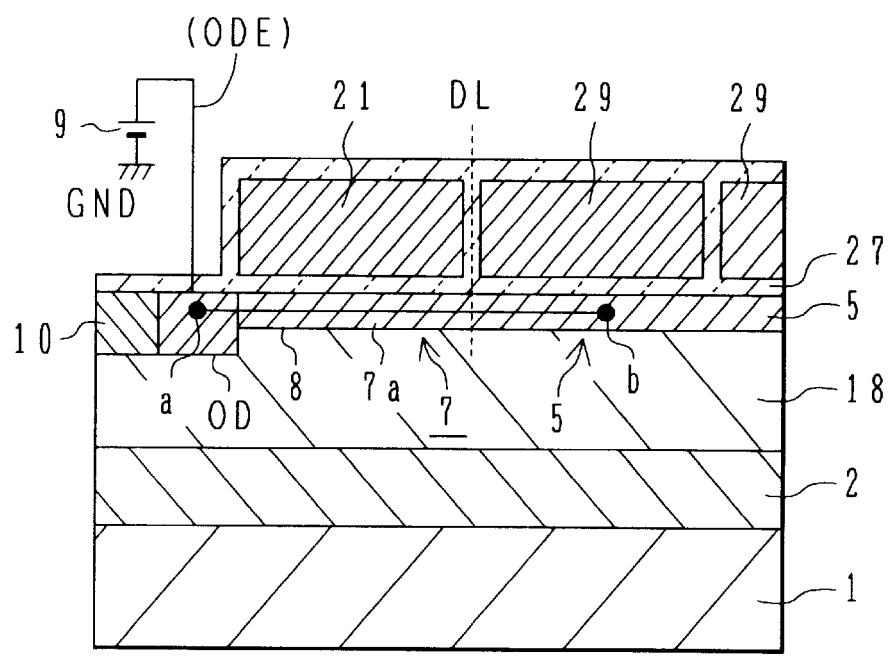
FIG. 10A is a cross-sectional view of a horizontal charge transfer path taken along a line c-d of FIG. 1.
Figure 10B:
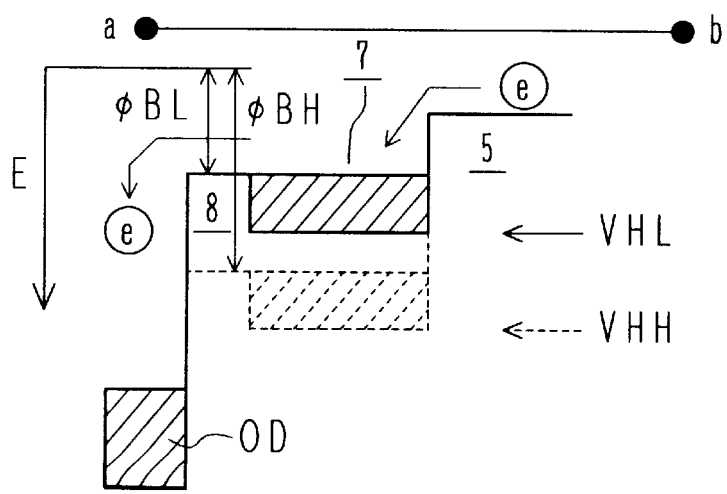
FIG. 10B. is a diagram showing a potential profile along the line c-d of FIG.

FIG. 10A shows in a cross-sectional view semiconductor regions taken along line a-b of FIG. 1. FIG. 10B shows a potential profile along a line a-b of FIG. 1.

As can be seen from FIG. 10A, a charge adjusting barrier layer 8 slightly doped with a p-type impurity is manufactured contiguous to the horizontal charge transfer path 7.

An overflow drain region OD doped with an n-type impurity is fabricated contiguous to the barrier layer 8.

Disposed on the overflow drain region OD is an overflow drain electrode ODE. Between the electrode ODE and a ground potential GND, there is disposed a power source 9. The power source 9 may be a fixed power source or a variable power source.

The configuration further includes an isolation region 10 with a high p-type impurity concentration vertically below the overflow drain region OD, the isolation region 10 covering a peripheral region of the overflow drain region OD.

A section on the right of a dotted line DL is a vertical charge transfer path 5, and a section on the left thereof is a horizontal charge transfer path 7.

Arranged on the path 7 and the barrier layer 8 is the horizontal charge transfer electrode 21 with an insulating film 27 therebetween.

As shown in FIG. 10B, with a high voltage (VHH) or a low voltage (VHL) applied to the electrode 21 (FIG. 10A), when the charge which exceeds height of the barrier layer 8 is accumulated in the path 7, part of the charge exceeding the height is drawn as excess charge to the overflow drain OD.

The height of the barrier layer 8 is changed by the voltage applied to the electrode 21.

The barrier layer 8 accumulates charge stored in the well layer of the horizontal charge transfer path 7. When the charge exceeds a predetermined value, the barrier layer 8 draws the excess charge to an outside region. This prevents the disadvantage that the excess charge accumulated in the well layer overflows into another transfer stage of the transfer path 7.

Arranged on the overflow drain OD is an electrode 9 to which a voltage is applied from a power source.

By increasing a positive voltage applied to the electrode 9, the well of the overflow drain OD becomes deeper and the barrier layer 8 becomes higher. This reduces the quantity of charge to be accumulated.

FIGS. 11A to 11C shows in a schematic diagram a charge transfer in a thinning readout operation (in the thinning readout movie mode) used to reproduce a monitor image.

As shown in FIG. 11A, charge of the photoelectric converters 3 is read out to the associated vertical charge transfer path 5 in each step of one transfer stage (41) of, for example, two transfer stages.

As can be seen from FIG. 11B, the charge read therefrom is transferred two transfer stages (41, 41) of the vertical transfer path 5 toward the horizontal transfer path 7.

As shown in FIG. 11C, each time the charge of one photoelectric converter is fed to the path 7, the charge is horizontally transferred through the path 7 and is outputted to an external device to display a monitor image.

By conducting the thinning readout operation, the charge stored in the photoelectric converters can be transferred to the path 7 and is fed to an external device at a higher speed when compared with the overall pixel readout operation.

Of the readout operation used to reproduce a monitor image, the operation of the adding movie mode will be shown in FIGS. 12A to 12C and 13 to 17.

Figure 12A:
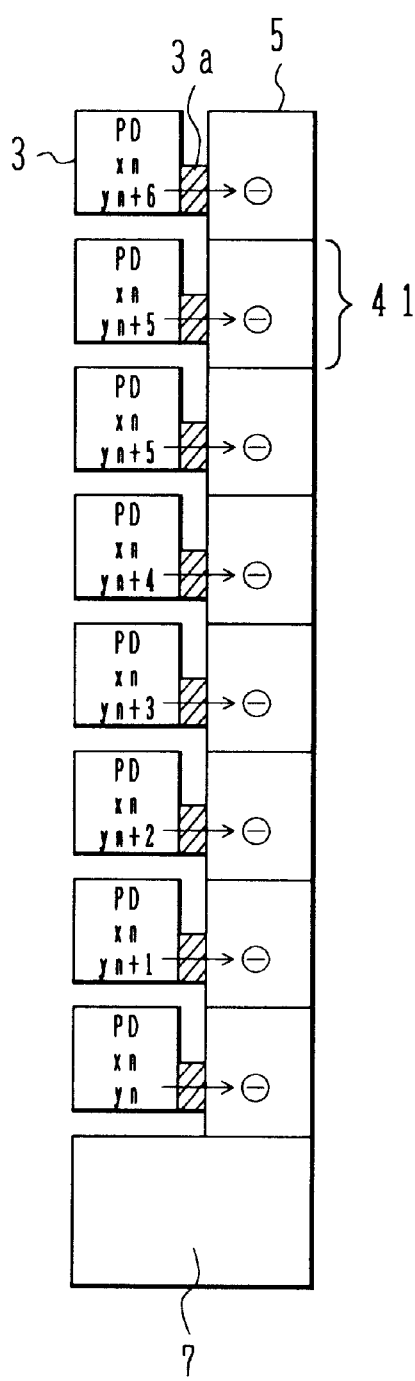
FIGS. 12A to 12C are diagram showing an example of operation in which charge from each of two photoelectric converter elements is fed from the vertical charge transfer path 5 to be added to each other and the resultant charge is transferred to the horizontal charge transfer path 7.
Figure 12B:
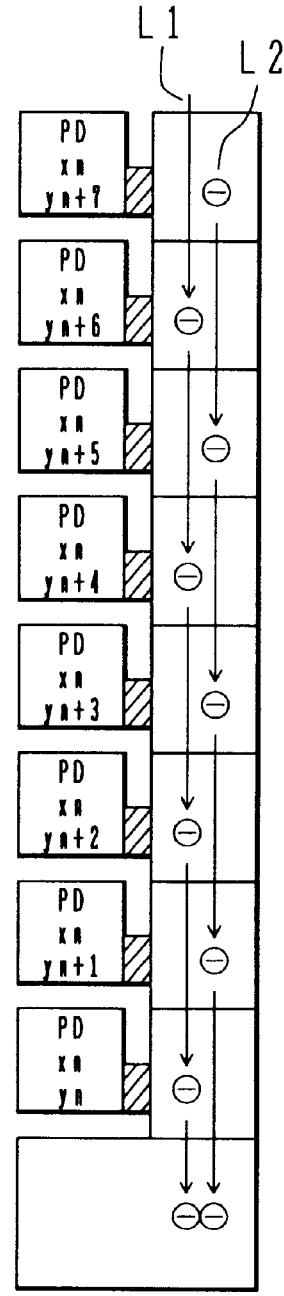
Figure 12C:
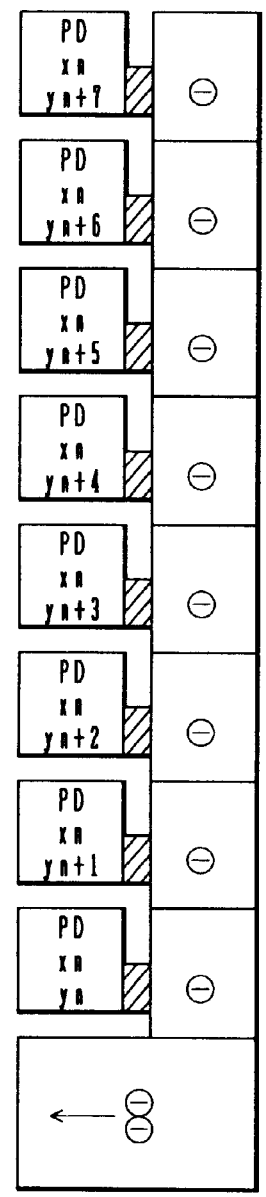

FIGS. 12A to 12C show an example of charge transfer operation from the vertical charge transfer path 5 to the horizontal charge transfer path 7 in which charge read from each of two photoelectric converters is added to each other.

As shown in FIG. 12A, a reading pulse voltage is applied to each of the vertical charge transfer electrodes EV3 and EV7 (reference is to be made to FIGS. 5 and 7). Signal charge accumulated in the photoelectric converters 3 is entirely read out to the vertical charge transfer path 5.

As can be seen from FIG. 12B, charge of yn, yn+2, yn+4, yn+6, etc. is transferred in a step of two transfer stages (41) as shown in a charge transfer line L1. Simultaneously, charge of yn+1, yn+3, yn+5, yn+7, etc. is transferred in a step of two transfer stages (41) as shown in a charge transfer line L2.

As shown in FIG. 12C, charge read from the photoelectric converters 3 (yn) and 3 (yn+1) is first transferred to the horizontal charge transfer path 7. While the charge from two photoelectric converters is being transferred to the path 7, the amount of charge of each converter is added to each other.

The charge of two photoelectric converters is accumulated in the path 7. The operation to transfer charge from the vertical path 5 to the horizontal path 7 is once stopped.

The charge resultant from the addition of the charge in the horizontal path 7 is horizontally transferred through the path 7 and is fed via an amplifier to an external device.

By repeatedly conducting the charge transfer described above, the charge of all pixels can be outputted to an external device.

Since the charge of two photoelectric converters are fed through the horizontal path 7, the quantity of signals transferred therethrough can be doubled.

Therefore, a bright monitor image can be obtained while keeping a high frame speed.

Figure 13:
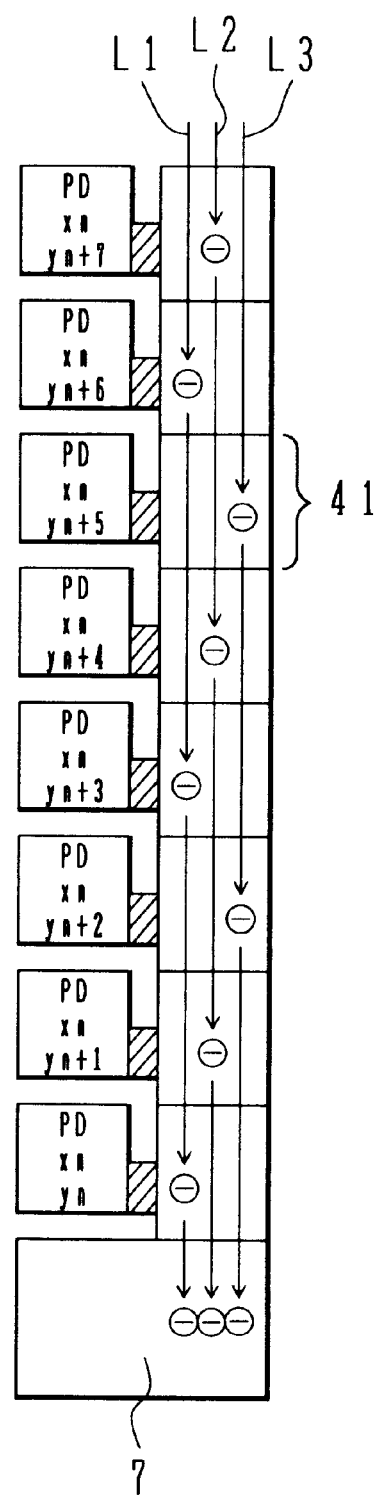
FIG. 13 is a diagram showing a first variation of the operation in the adding movie mode shown in FIG. 12.
Figure 14:
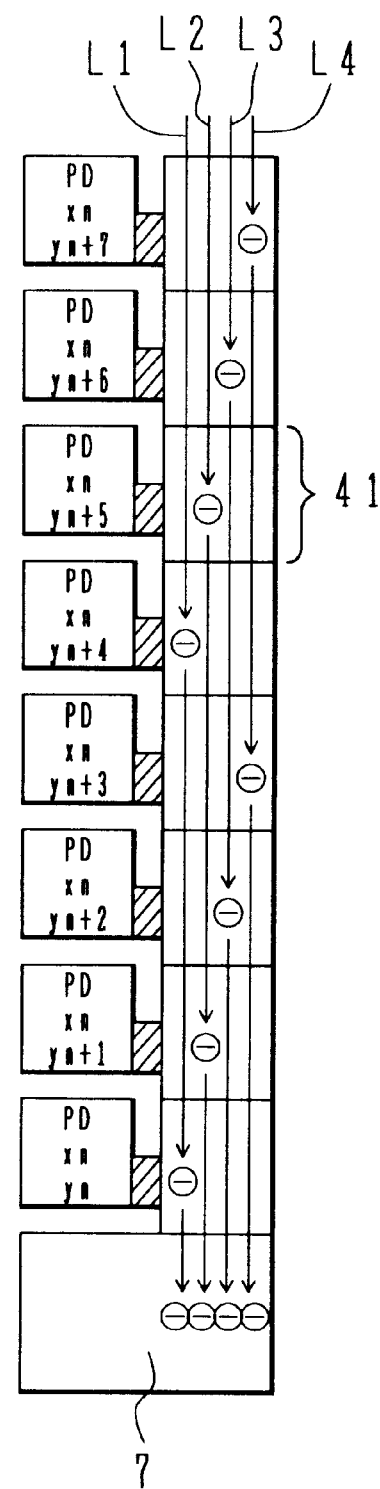
FIG. 14 is a diagram showing second variation of the operation in the adding movie mode shown in FIG. 12.

FIGS. 13 and 14 respectively show first and second variations of the operation in the adding movie mode shown in FIGS. 12A to 12C.

Also in the first variation, charge is read from all photoelectric converters and is fed to the vertical charge transfer path.

Charge of yn, yn+3, yn+6, yn+9, etc. is first transferred three transfer stages (41) as indicated by L1.

Simultaneously, charge of yn+1, yn+4, yn+7, etc. is transferred three transfer stages (41) as indicated by L2. Charge of yn 2, yn+5, etc. is transferred three transfer stages (41) as indicated by L3.

First, charge read from the photoelectric converters 3 (yn), 3 (yn+1), and 3 (yn+2) is transferred to the horizontal path 7.

When the charge from each of three converters 3 is transferred to the horizontal path 7, the amount of charge of each converter 3 is added to each other.

When the charge of three converters is fed to the horizontal path 7, the operation to transfer charge from the vertical path 5 to the horizontal path 7 is once stopped.

The charge resultant from the addition of charge conducted during the charge transfer from the vertical path 5 to the horizontal path 7 is horizontally transferred through the horizontal path 7 and is outputted to an external device.

By repeatedly carrying out the charge transfer above in a similar way, the charge of all pixels can be outputted to the external device.

Since the charge transferred to the horizontal path 7 includes a total amount of charge of three photoelectric converters, the amount of signals transferred through the horizontal path 7 is three times that of charge transfer in the stage-by-stage transfer mode.

Therefore, it is possible to produce a bright monitor image while retaining a high frame speed.

In the second variation shown in FIG. 14, charge is transferred four transfer stages (41) by each transfer operation as indicated by L1 to L4. The other transfer operations are substantially the same as above.

The charge fed to the horizontal path 7 includes an amount of charge of four photoelectric converters. Namely, the amount of signals transferred through the horizontal path 7 is four times that of charge transferred in the stage-by-stage transfer mode.

Consequently, the obtained monitor image is more bright and the high frame speed is kept remained.

By increasing the number of transfer lines, the quantity of light can be further increased although resolution is decreased.

Figure 15A:
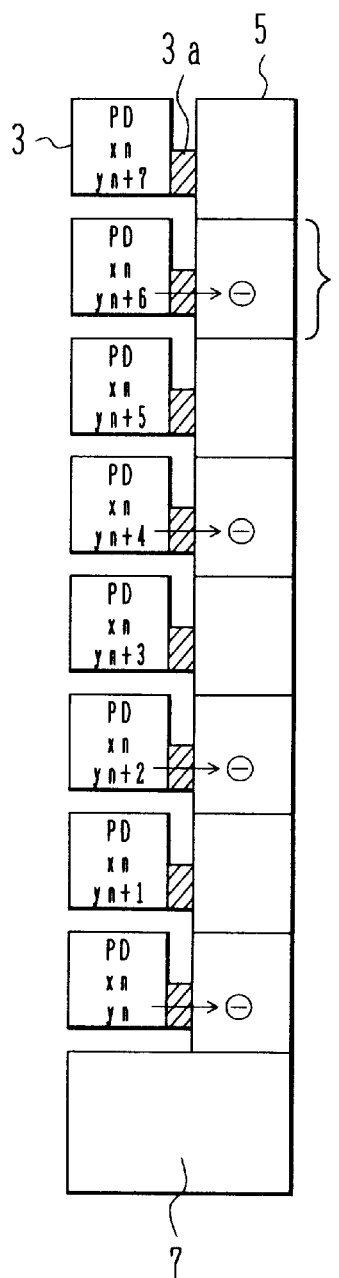
FIGS. 15A to 15C are diagrams showing a third variation of the operation in the adding movie mode shown in FIG. 12.

FIGS. 15A to. 15C schematically shows a still another variation of operation in the adding movie mode shown in FIGS. 12A to 12C.

In this readout method, charge is read from every second row of the photoelectric converters 3 arranged in the column direction and is fed to the vertical charge transfer path 5 (FIG. 15A).

Figure 15B:
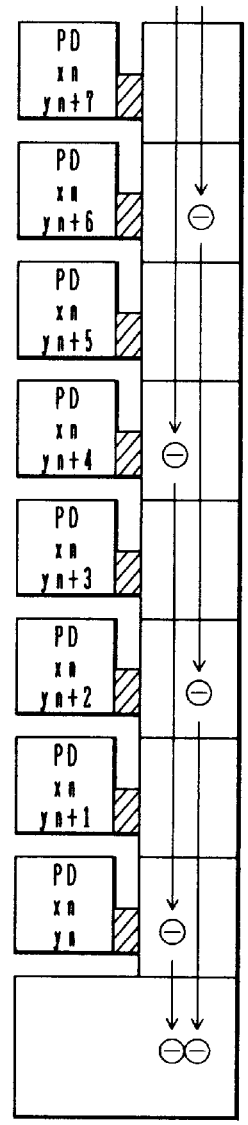

As can be seen from FIG. 15B, charge read out to the vertical path 5 is transferred four transfer stages (41) therethrough by each transfer operation. Charge of each of two photoelectric converters is fed to the horizontal path 7 and is added to each other therein.

When the charge of two converters is fed to and is accumulated in the horizontal path 7, the operation to transfer charge from the vertical path 5 to the horizontal path 7 is once stopped.

When the charge of two converters is delivered to the horizontal path 7, the charge in the horizontal path 7 is vertically transferred to be outputted to an external device.

Since the charge of two photoelectric converters are fed to the horizontal path 7, the quantity of signals transferred therethrough can be doubled.

Therefore, a brighter monitor image can be obtained while keeping a high frame speed.

Figure 15C:
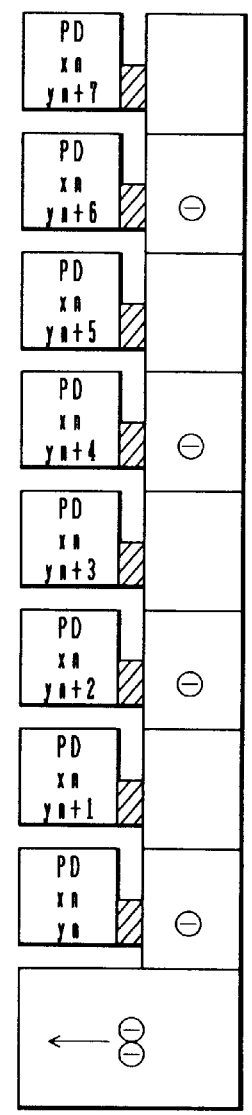
Figure 16:
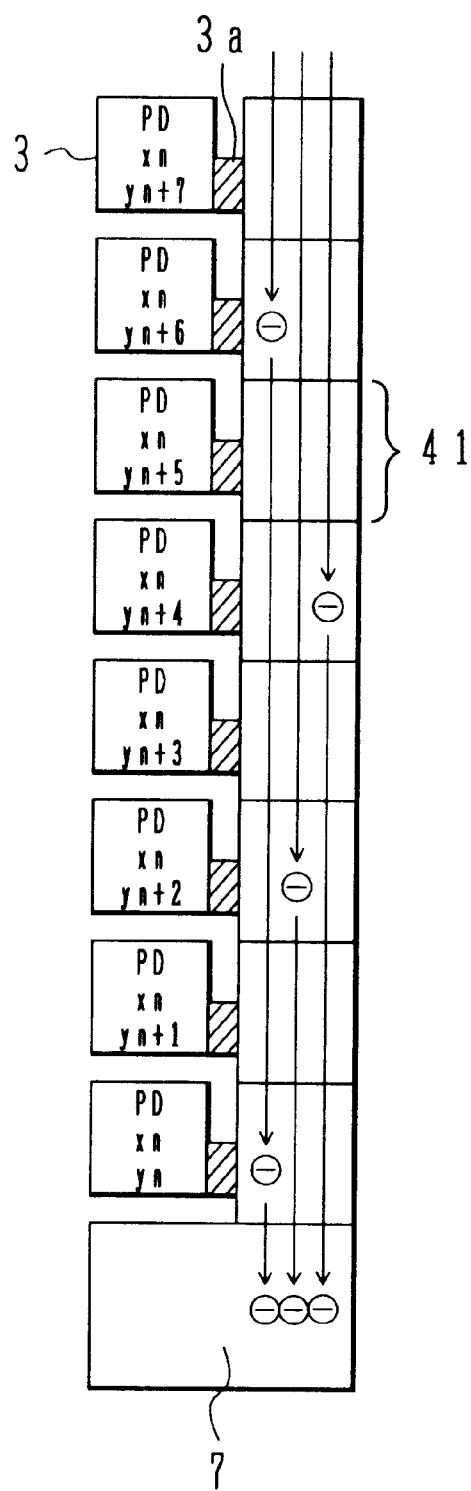
FIG. 16 is a diagram showing a variation of a readout operation of FIGS. 15A to 15C.
Figure 17:
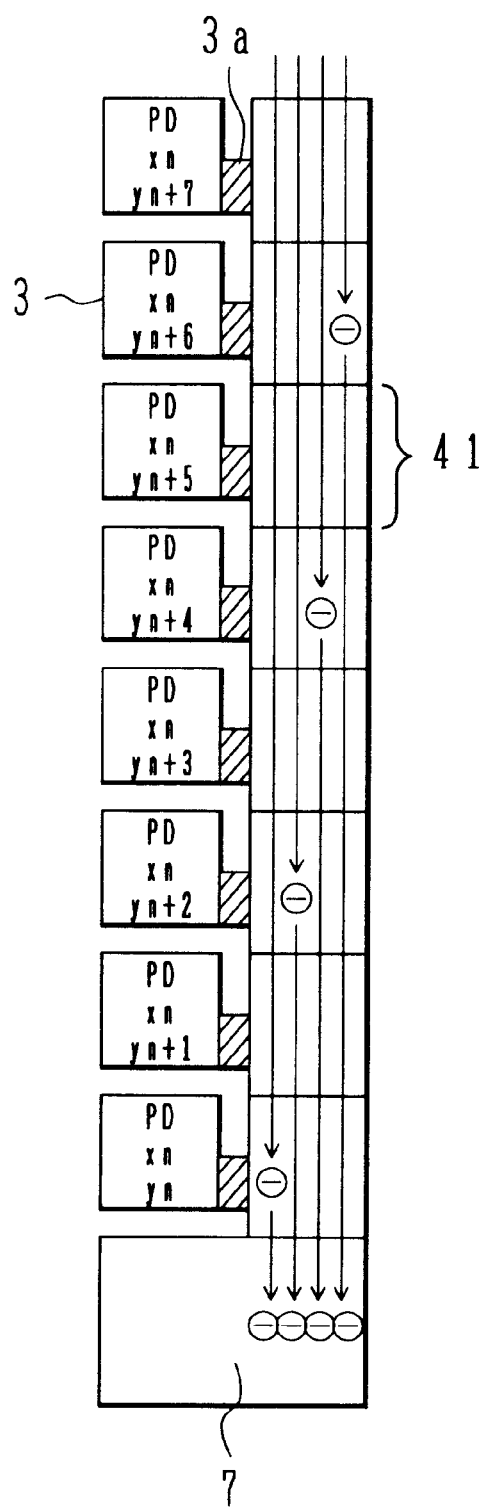
FIG. 17 is a diagram showing another variation of the readout operation of FIGS. 15A to 15C.

FIGS. 16 and 17 show a variation of the readout operation of FIG. 15.

In the charge transfer method of FIG. 16, charge is read from every second row of the photoelectric converters 3 arranged in the column direction and is fed to the vertical charge transfer path 5.

For each line, the charge is transferred six transfer stages 41 through the vertical path 5 by each transfer operation.

In the horizontal path 7, charge of three photoelectric converters is fed to be added to each other.

When the charge of three converters is fed to and is accumulated in the horizontal path 7, the operation to transfer charge from the vertical path 5 to the horizontal path 7 is once stopped.

When the charge of three converters is delivered to the horizontal path 7, the charge in the horizontal path 7 is vertically transferred and is outputted to an external device. Since the charge of three photoelectric converters are fed to the horizontal path 7, the quantity of signals transferred therethrough can be three times that of signals transferred in the stage-by-stage transfer mode.

FIG. 17 shows a charge transfer method in which charge is read from every second row of the photoelectric converters 3 arranged in the column direction. The charge is transferred eight transfer stages 41 through the vertical path 5 by each transfer operation.

When the number of transfer lines is increased, the quantity of light can become further greater although resolution is deteriorated.

Figure 18:
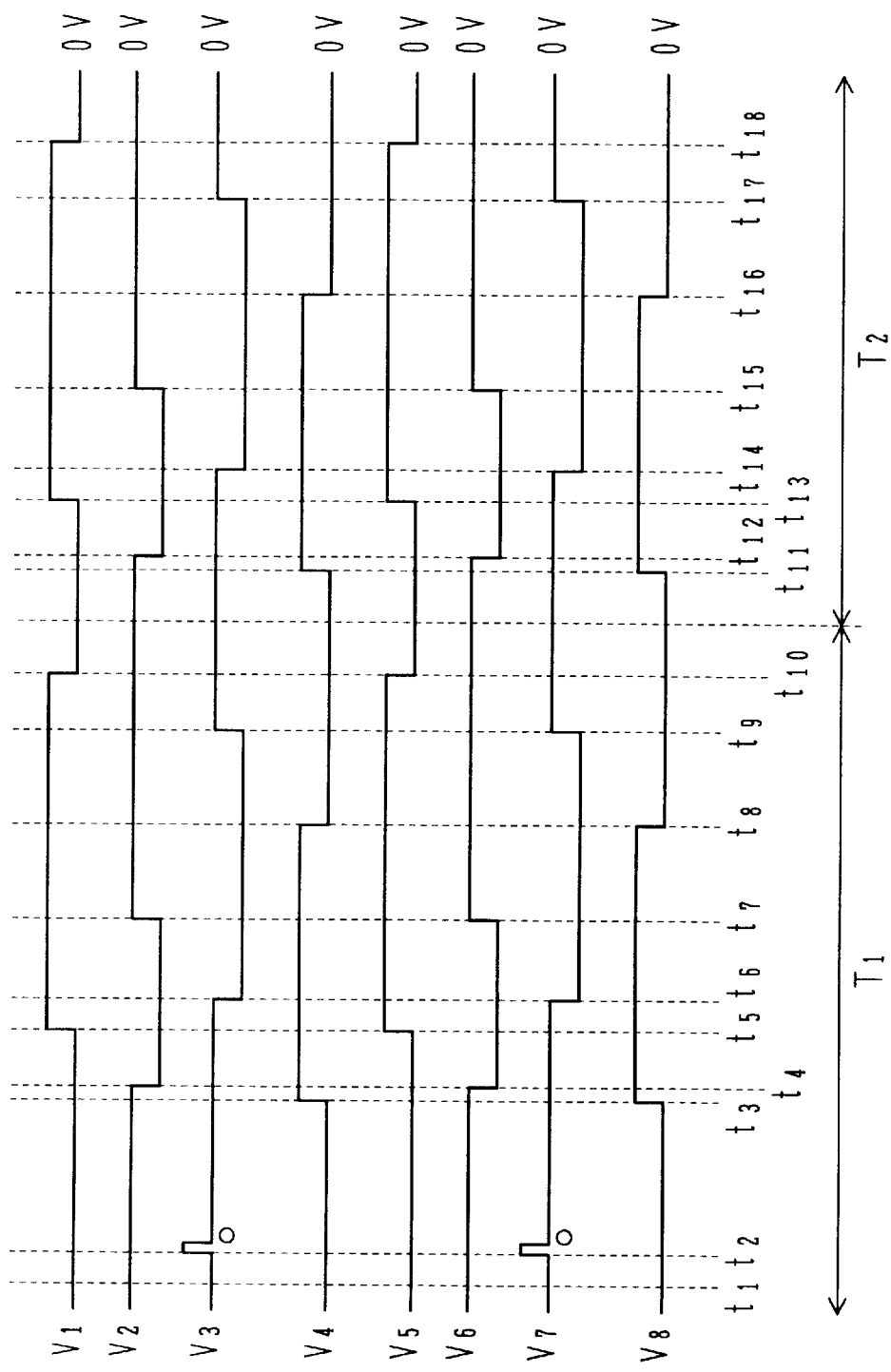
FIG. 18 is a signal timing chart showing specific waveforms of voltages applied to the vertical charge transfer electrodes EV1 to EV8 in actual readout and transfer operations of electric charge.

FIG. 18 shows, in a signal timing chart, specific waveforms of voltages applied to vertical charge transfer electrodes EV1 to EV8 (reference is made to FIGS. 5 and 7) in an actual charge readout and transfer operations. These waveforms of FIG. 18 correspond to the charge readout and transfer operations shown in FIGS. 12A to 12C. The electrodes EV1 to EV8 are arranged as shown in FIG. 5.

The voltages applied to the electrodes EV1 to EV4 are respectively the same as those applied to the electrodes EV5 to EV8.

Assume at time t1 that the voltages are set as follows: EV1=0 V, EV2=8 V, EV3=8 V, EV4=0 V.

At time t2, a high voltage of 15 V is applied to the electrode EV3. Charge stored in the associated photoelectric converter 3 is read therefrom via the transfer gate 3a to the vertical path 5. The electrode EV3 is returned to 8 V.

The signal charge from each photoelectric converter 3 is transferred one transfer stage 41 through the vertical charge transfer path 5 linked via the readout gate 3a to the photoelectric converter 3. By this operation, the charge can be read from all pixels of the solid-state image pickup device X.

The signal charge read out to the vertical path 5 as above is sequentially transferred toward the horizontal path 7.

During the interval of time from t2 to t3, charge is accumulated in a semiconductor region below the electrodes EV2 and EV3.

Description will be given of operation to transfer charge one transfer stage by each transfer operation, i.e., in the stage-by-stage way.

At time t4, a voltage of 0 V is applied to the electrode EV2. Charge is confined in a semiconductor region blow the electrodes EV3 and EV4.

When EV5 (EV1) is set to 8 V at time t5, the charge is spread in a semiconductor region below an electrode range from the electrode EV3 to the electrode EV5.

When the electrode EV3 is set to 0 V at time t6, the charge is confined in a semiconductor region below the electrodes EV4 and EV5.

The electrode EV6 (EV2) is set to 8 V at time t7 and the electrode EV4 (EV8) to 0 V at time t8. The charge is accumulated in a semiconductor region below the electrodes EV5 and EV6.

The electrode EV3 (EV7) is set to 8 V at time t9 and the electrode EV1 (EV5) to 0 V at time t8.

By the readout operation during a first readout transfer period T1, the charge read out to a first transfer stage is transferred to a subsequent transfer stage.

During a period T2, the charge read out to a transfer stage subsequent to the first transfer stage is similarly transferred.

At time t11, a voltage of 8 V is applied to the electrode EV4. Charge is distributed in a semiconductor region below an electrode range from the electrode EV2 to EV4.

At time t12, 0 V is applied to the electrode EV2. The charge is confined in a semiconductor region below the electrode EV3 and EV4.

When the electrode EV5 (EV1) is set to 8 V at time t13, the charge is distributed in a semiconductor region below an electrode range from the electrode EV3 to EV5.

When the electrode EV3 is set to 0 V at time t14, the charge is confined in a semiconductor region below the electrodes EV4 and EV5.

The electrode EV6 (EV2) is set to 8 V at time t15 and the electrode EV4 (EV8) to 0 V at time t16. The charge is accumulated in a semiconductor region below the electrodes EV5 and EV6.

The electrode EV3 (EV7) is set to 8 V at time t17 and the electrode EV1 (EV5) to 0 V at time t18.

By the readout operation during a second readout transfer period T2, the charge read out to one transfer stage is transferred to a subsequent transfer stage.

The charge read out at time t2, to a transfer stage subsequent to the pertinent transfer stage is similarly transferred.

When the charge of each of two transfer stages (two photoelectric converters) read out to the vertical path 5 is transferred from the vertical path 5 to the horizontal path 7, each charge is added to each other.

Figure 19A:
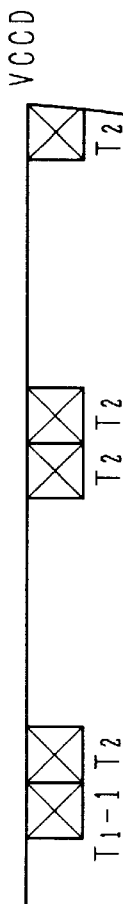
FIGS. 19A to 19C are diagrams showing simplified waveforms of voltages applied to vertical charge transfer electrodes in association with readout and transfer operations shown in FIGS. 12A to 12C, 13, and 14.
Figure 19B:
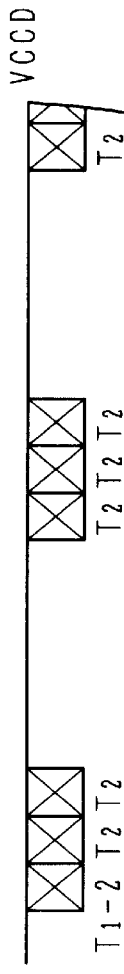
Figure 19C:
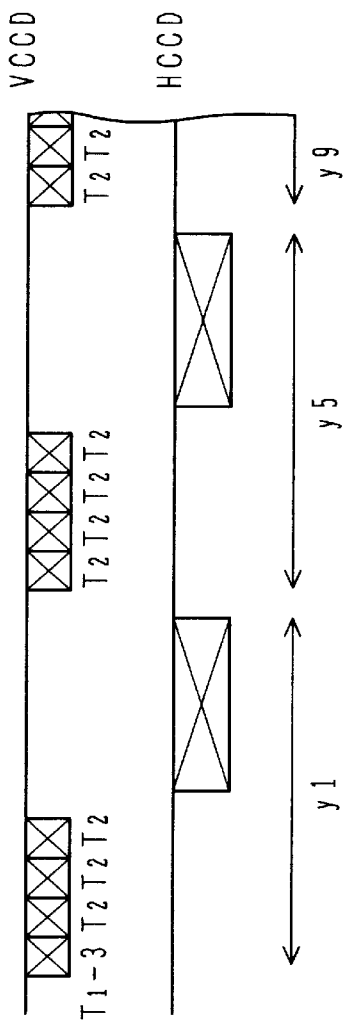

FIGS. 19A to 19C shows, in simplified graphs, the waveforms of voltages applied to associated vertical charge transfer electrodes in the readout and transfer operations shown in FIGS. 12A to 12C, 13, and 14.

FIG. 19A shows the voltage waveforms corresponding to the readout and transfer operations of FIGS. 12A to 12C. FIGS. 19B and 19C respectively correspond to the readout and transfer operations of FIGS. 13 and 14, respectively.

A waveform T1 in FIGS. 19A to 19C is associated with the readout charge transfer waveform T1 shown in FIG. 18.

A waveform T2 in FIGS. 19A to 19C is associated with the readout charge transfer waveform T2 shown in FIG. 18.

According to the waveform of FIG. 19A, to transfer charge read from one row of the photoelectric converters 3 arranged in the horizontal direction to the horizontal charge transfer path 7, the charge read out to the vertical charge transfer path 5 is transferred two transfer stages by each transfer operation.

The charge as a total of charge added to each other during the charge transfer to the horizontal path 7 is horizontally transferred through the horizontal path 7 and is delivered to an external device.

In accordance with the waveform of FIG. 19B, to transfer charge read from one row of the photoelectric converters 3 arranged in the horizontal direction to the horizontal charge transfer path 7, the charge read out to the vertical charge transfer path 5 is transferred three transfer stages by each transfer operation.

When the charge from three photoelectric converters 3 is transferred to the horizontal path 7, the transfer of charge from the vertical path 5 to the horizontal path 7 is stopped.

The charge obtained as a result of the addition during the transfer from the vertical path 5 to the horizontal path 7 is transferred through the horizontal path 7 in a horizontal direction and is outputted to an external device.

According to the waveform of FIG. 19C, to transfer charge read from one row of the photoelectric converters 3 arranged in the horizontal direction to the horizontal charge transfer path 7, the charge read out to the vertical charge transfer path 5 is transferred four transfer stages by each transfer operation.

When the charge from four photoelectric converters is transferred to the horizontal path 7, the charge transfer from the vertical path 5 to the horizontal path 7 is stopped.

The charge thus added to each other during the transfer from the vertical path 5 to the horizontal path 7 is transferred through the horizontal path 7 in a horizontal direction and is supplied to an external device.

Description will now be given of a second embodiment of a solid-state image pickup device according to the present invention.

Figure 20:
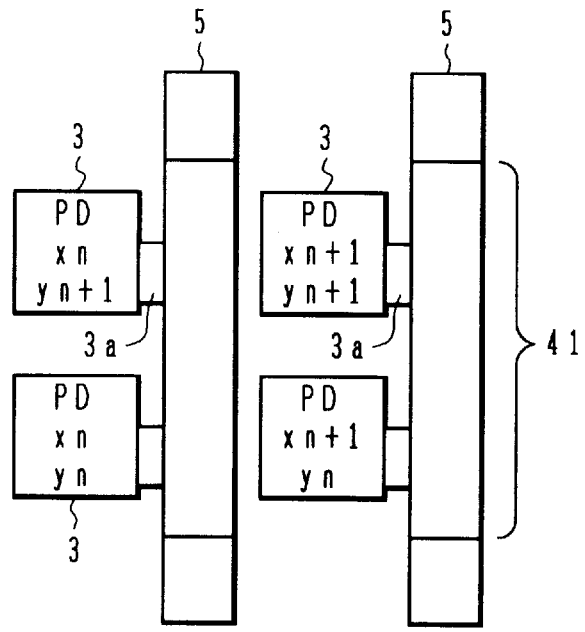
FIG. 20 is a plan view showing a layout of photoelectric converter elements and vertical charge transfer paths manufactured in a semiconductor substrate.
Figure 21:
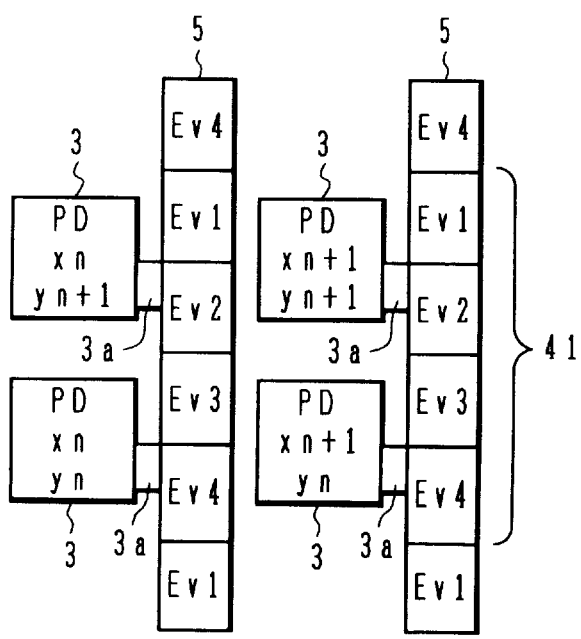
FIG. 21 is a plan view showing a layout of vertical charge transfer paths in a semiconductor substrate.

FIG. 20 shows in a plan view a layout of photoelectric converters 3 and vertical charge transfer paths 5 fabricated on a semiconductor substrate. FIG. 21 shows in a plan view a layout of vertical charge transfer electrodes (EV1 to EV4) on a semiconductor substrate.

The constitution of FIGS. 20 and 21 includes a region 41 which is one charge transfer stage.

As shown in FIG. 20, two photoelectric converters 3 are manufactured for each charge transfer stage 41 of the vertical path 5.

As can be seen from FIG. 21, four electrodes (e.g., EV1 to EV4) are fabricated on the vertical path for each charge transfer stage 41. The photoelectric converters 3 are sequentially connected via readout gate 3a to a semiconductor region serving as the vertical charge transfer path 5 below every second electrode, for example, the electrode EV2 or EV4 of four electrodes EV1 to EV4 of one transfer stage 41.

Figure 22:
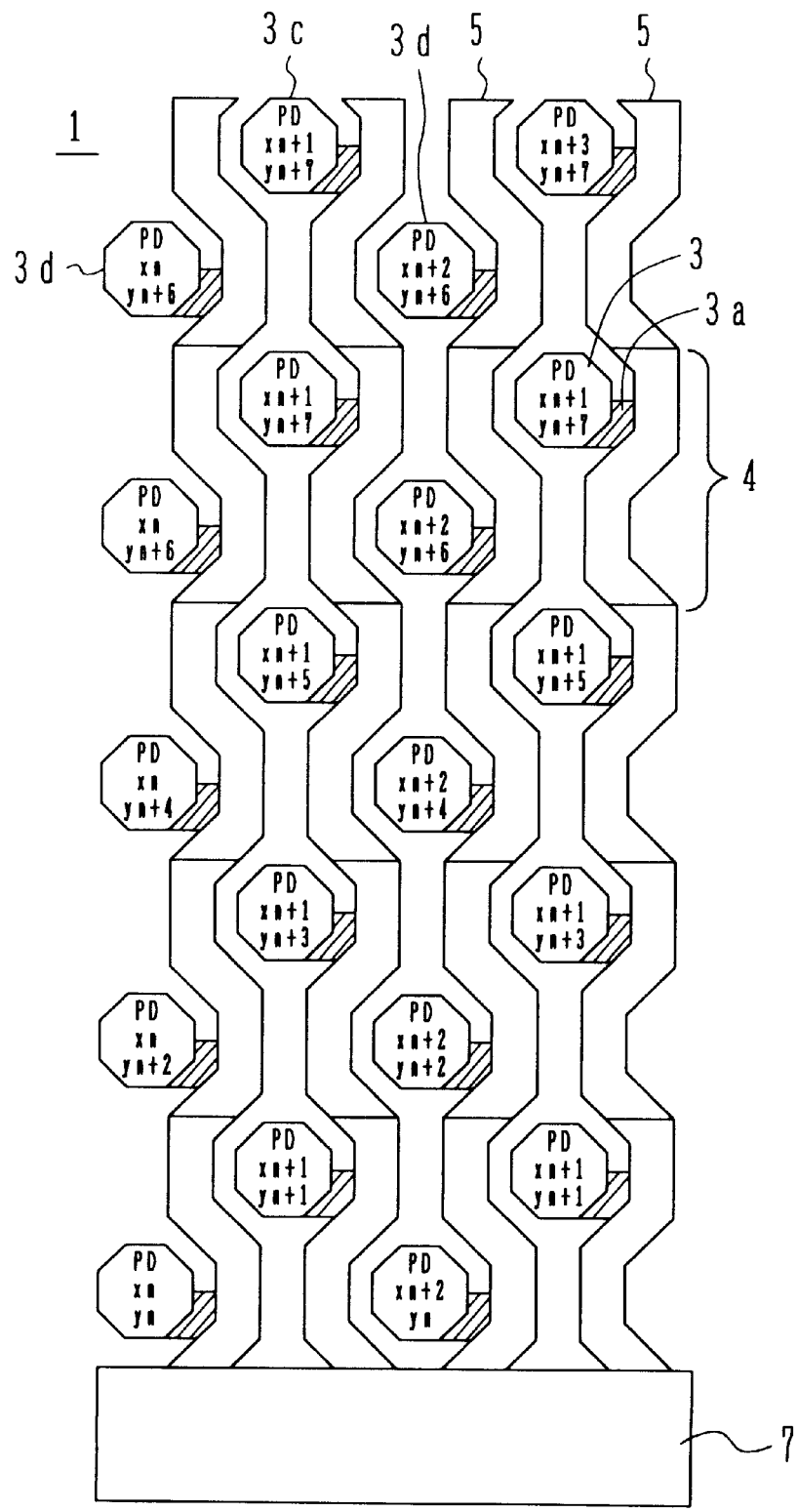
FIG. 22 is a plan view showing a variation of the solid-state image pickup device shown in FIG. 20.
Figure 23:
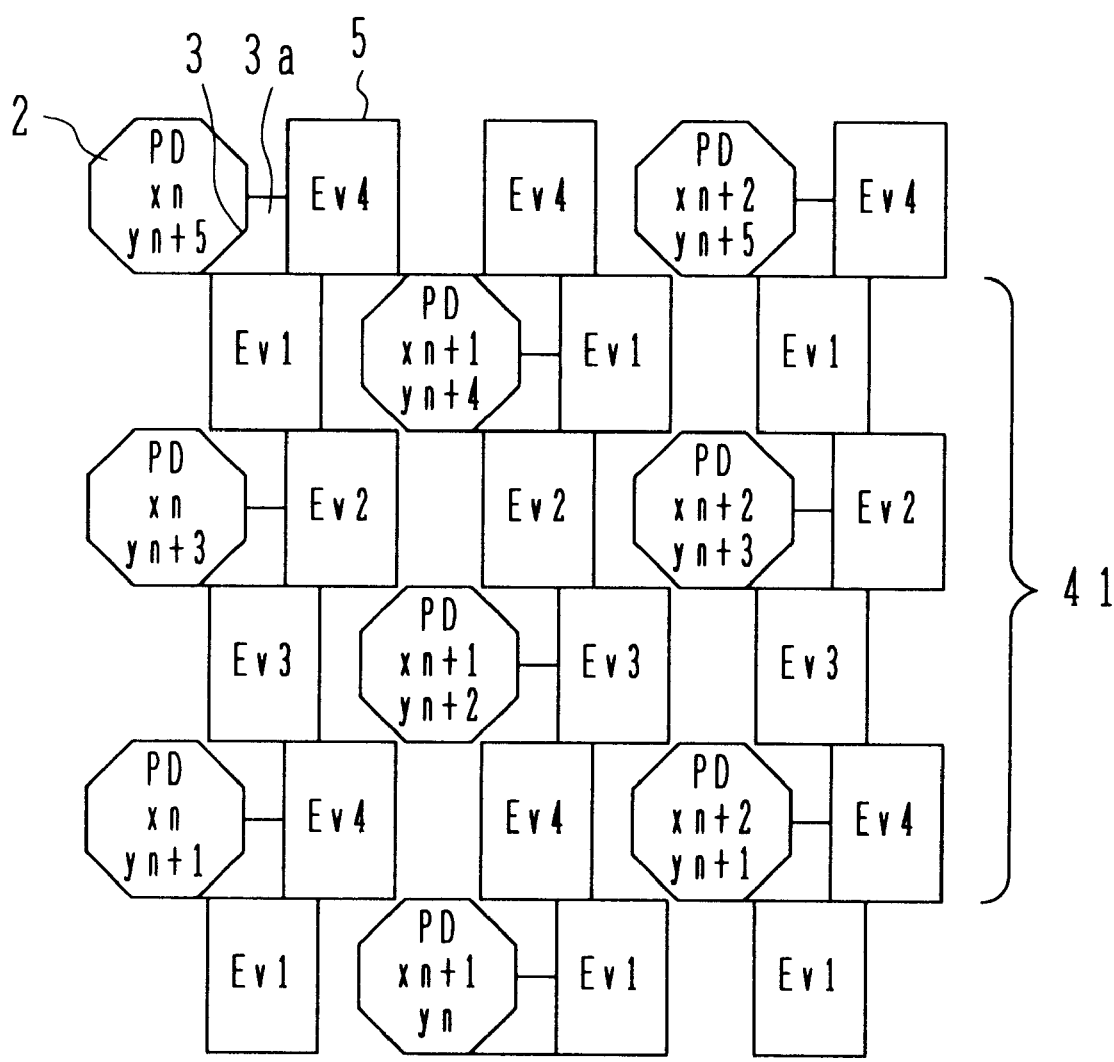
FIG. 23 is a plan view showing a variation of the solid-state image pickup device of FIG. 21.

FIGS. 22 and 23 shows, in plan views, variations of the solid-state image pickup device shown in FIGS. 20 and 21.

In FIGS. 22 and 23, each photoelectric converter 3 is configured in substantially a regular octagon. Photoelectric converters 3c vertically arranged in a first column with a pixel pitch are vertically shifted by one half of the pixel pitch relative to photoelectric converters 3c horizontally adjacent to the photoelectric converters 3c in the first column. That is, the photoelectric converters 3c are arranged in a shifted-pixel layout.

Also in this structure, two photoelectric converters 3 are fabricated for each transfer stage 41 of the vertical path 5. Disposed on the vertical path 5 are four electrodes, e.g., EV1 to EV4 for each transfer stage 41.

Description will now be given of operation of the solid-state image pickup device configured as shown in FIGS. 20 to 23.

FIGS. 24A to 24C show operation in the overall pixel readout mode used to reproduce a still picture or the like.

The operation will be described by referring to FIGS. 20 to 23 as required.

First, a reading pulse voltage is applied to the vertical charge transfer electrode EV2 as shown in FIG. 24A. Signal charge is read from every second row of photoelectric converters 3 (yn+1, yn+3, yn+5, etc.) and is fed to the vertical path 5 (as indicated by a negative sign in a small circle in FIG. 24A).

FIG. 24 shows operation in which the charge read out to the vertical path 5 shown in FIG. 24A is transferred one transfer stage 41 for each transfer operation.

The charge is transferred only one transfer stage toward the horizontal path 7 as indicated by a solid line in FIG. 24B.

The charge fed to the horizontal path 7 (a negative sign in a small circle) is transferred through the horizontal path 7 and is horizontally fed to an external device as shown in FIG. 24C.

All charge (a negative sign in a small circle) read out in the first field can be entirely fed to an external device.

Thereafter, charge is read from other photoelectric converters 3 (yn+2, yn+4, yn+6, etc.) connected to the same transfer stage as that described above and is fed to the vertical path 5 (an open circle in FIG. 24A).

By achieving an operation similar to that indicated by the solid line, namely, by achieving an operation indicated by a broken line, the charge of the open circle is also transferred from the vertical path 5 to the horizontal path 7.

The charge fed to the horizontal path 7 is horizontally transferred therethrough and is delivered to an external device.

By repeatedly executing this operation, the entire charge (indicated by an open circle) read out for a second field can be fed to an external device.

Figure 25A:
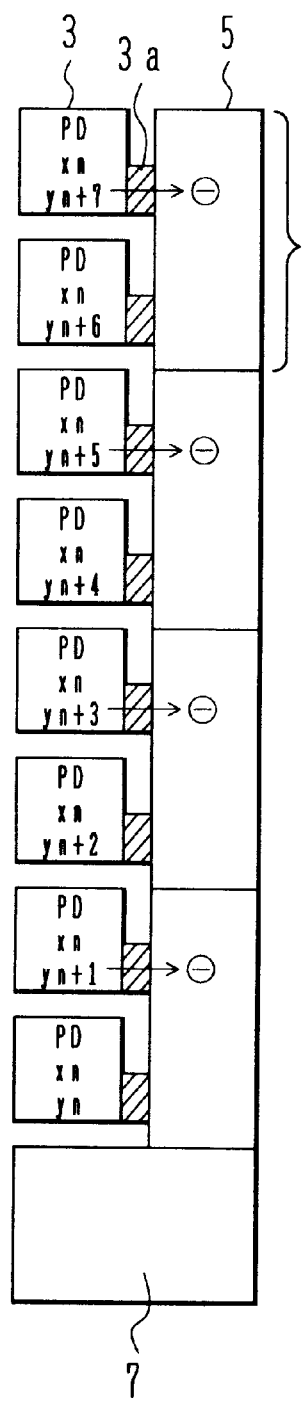
FIGS. 25A to 25C are diagrams showing thinning readout operations (in a thinning readout movie mode) to reproduce a monitor image.
Figure 25B:
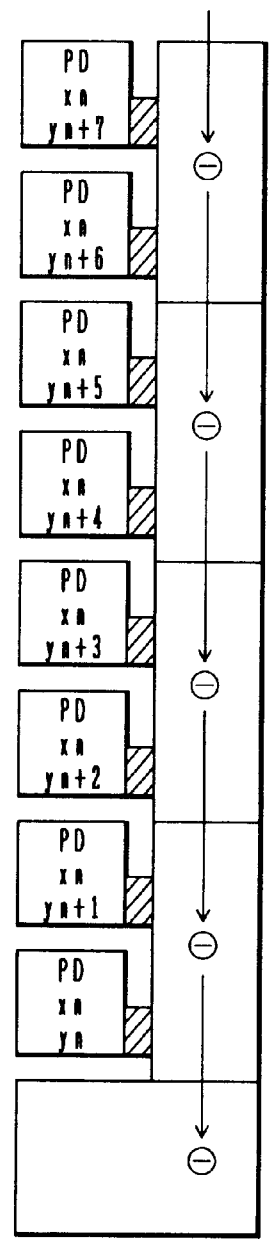
Figure 25C:
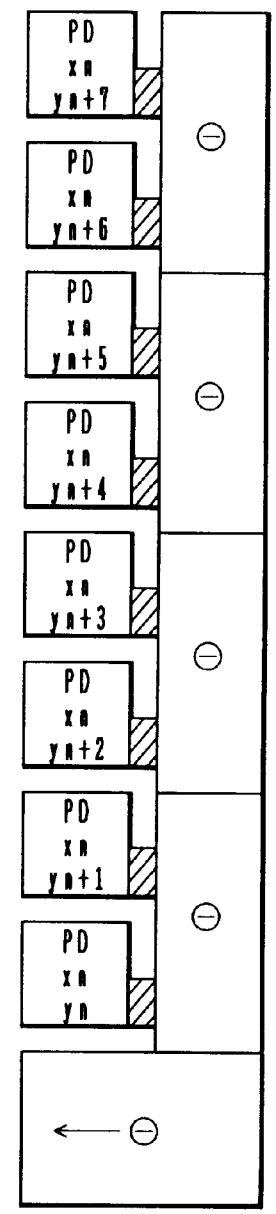

FIGS. 25A to 25C shows a thinning readout operation (a thinning readout a movie mode) employed to display a monitor image.

As can be seen from FIG. 25A, charge is read from one of the photoelectric converters 3 associated with, for example, one transfer stage 41 and is fed to the vertical path 5.

For example, for a first field, the charge accumulated in the photoelectric converters 3 (yn+1, yn+3, yn+5, yn+6, etc.) is read out to the transfer stages 41 associated therewith in the vertical path 5.

As shown in FIG. 25B, the charge is transferred one transfer stage 41 in a direction from the vertical path 5 to the horizontal path 7. The charge fed to the horizontal path 7 is transferred to the output amplifier as shown in FIG. 25C.

By achieving the thinning readout operation, the charge in the photoelectric converters 3 can be transferred to the horizontal path 7 at a high speed.

FIGS. 26A to 26C show a method of reading charge from all pixels by one readout operation. In this case, charge stored in each of two photoelectric converters 3 associated with one transfer stage 41 is simultaneously read out to the vertical path 5 as shown in FIG. 26A. In the vertical path 5, the charge is added to each other for each transfer stage as shown in FIG. 26B. Charge resultant from the addition is transferred for each transfer stage 41 in a direction to the horizontal path 7 as shown in FIG. 26C.

FIGS. 27A to 27C, 28 and 29, 30A to 30C, and 31 and 32 show a readout operation, specifically, an operation example in an adding movie mode used to reproduce a monitor image.

These diagrams specifically show an operation method in which charge is first added to each other in the vertical charge transfer path 5 and the resultant charge is further added to each other in the horizontal charge transfer path 7.

Referring to FIGS. 27A to 27C, 28, and 29, description will be given of such a charge readout and transfer method.

Figure 27A:
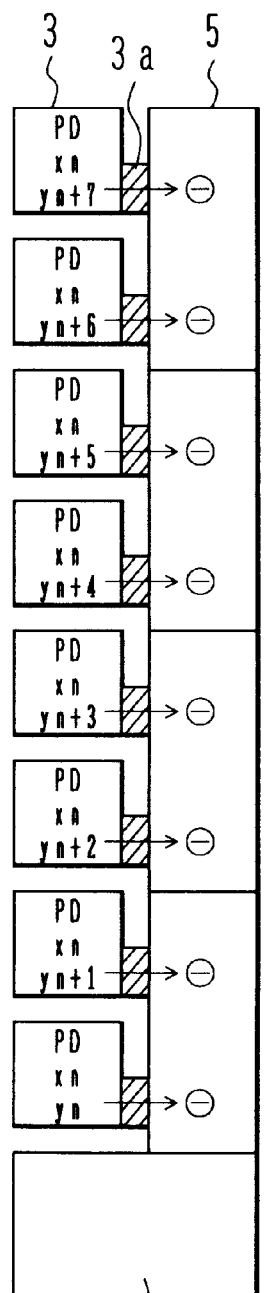

As can be seen from FIG. 27A, charge is read from two photoelectric converters 3 associated with one transfer stage 41 and is delivered to the vertical path 5. The charge is read from all photoelectric converters 3 and is fed to the vertical path 5.

Since two photoelectric converters 3 are related to each transfer stage 41, the charge from two photoelectric converters 3 is transferred to the vertical path 5 and is added to each other therein.

Figure 27B:
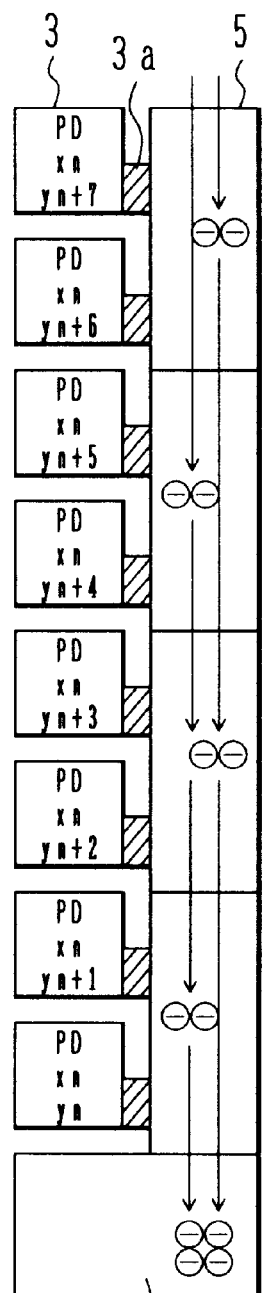

As shown in FIG. 27B, the charge of two photoelectric converters 3 fed to each associated transfer stage 41 is transferred two transfer stages.

First, the charge of the converters 3 (yn and yn+1) and the charge of the converters (yn+2 and yn+3) are fed to the vertical path 5. Namely, a total charge of four converters is transferred to the horizontal path 7.

After the charge of four converters is transferred to the horizontal path 7, the transfer of charge from the vertical path 5 to the horizontal path is once stopped.

Figure 27C:
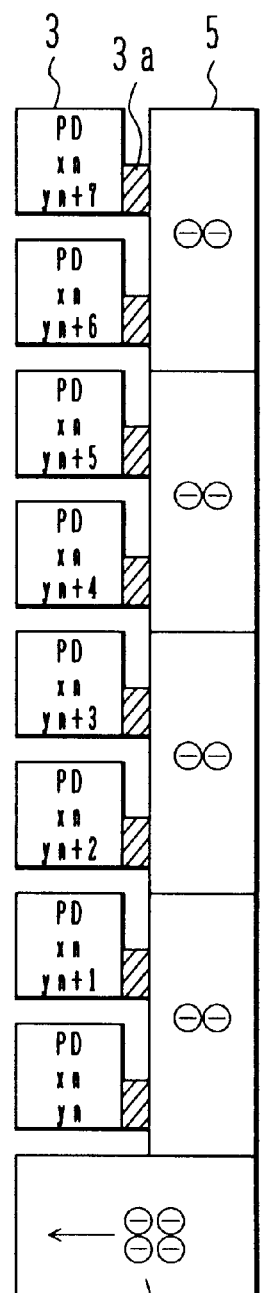

The resultant charge is then transferred through the horizontal path 7 in a direction to the output amplifier as shown in FIG. 27C.

When the charge from two converters 3 is transferred to the vertical path 5, the charge of each converter 3 is added to each other therein. This also applies to the other set of two converters 3. When the charge of two converters and that of the other set of two converters are transferred to the horizontal path 7, each charge is added to each other and is accumulated therein.

Figure 28:
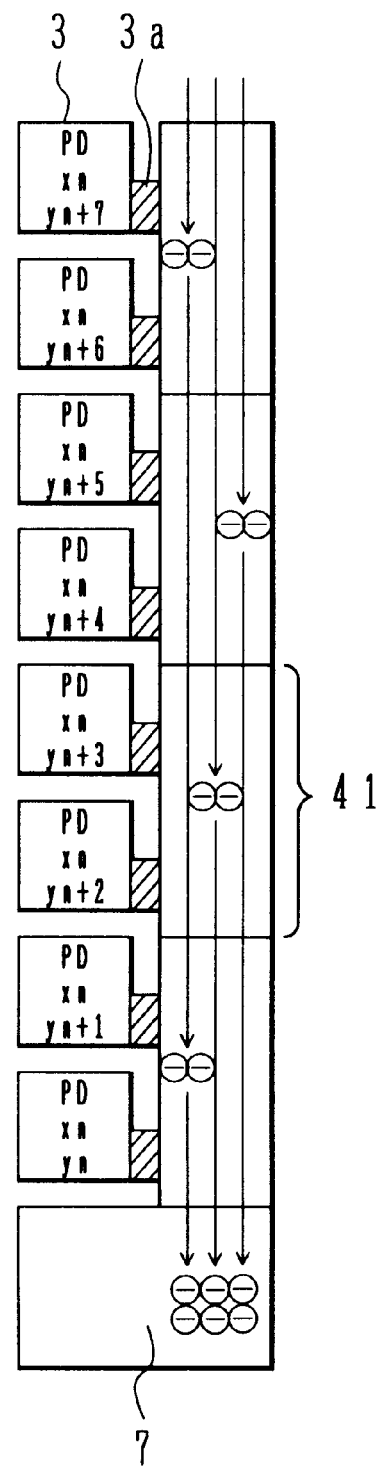

FIG. 28 shows a variation of the readout method of FIGS. 25A to 25C. In this variation, charge is first read from two photoelectric converters 3 associated with one transfer stage 41 and is fed to the vertical path 5. The charge of the converters 3 delivered to each associated transfer stage 41 is transferred three transfer stages 41.

When the charge of the photoelectric converters 3 (yn, yn+1), (yn+2, yn+3), and (yn+4, yn+5) is transferred to the horizontal path 7, each charge of six converters is added to each other. The total charge is transferred through the horizontal path 7 in a direction to the output amplifier.

Figure 29:
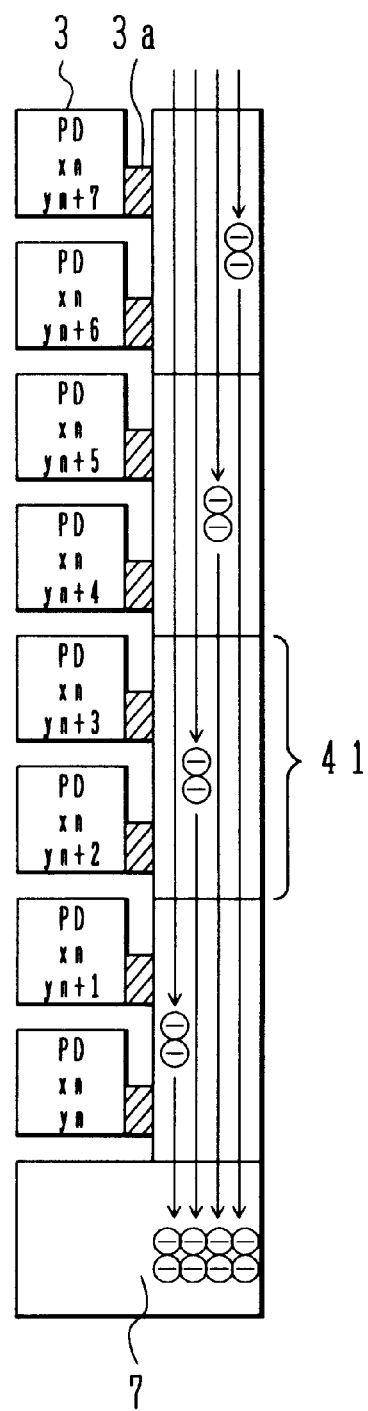
FIG. 29 is a diagram showing an example of operation in which addition of charge is conducted in the vertical charge transfer path 5 as well as in the horizontal charge transfer path 7.

FIG. 29 shows a variation of the readout and transfer method shown in FIGS. 27A to 27C and 28. In this variation, the charge of two converters 3 is transferred four transfer stages 41 through the vertical path 5 in a direction to the horizontal path 7. In the horizontal path 7, a total of each charge of eight converters 3 is transferred toward the output amplifier.

FIGS. 30A to 30C, 31, and 32 show methods which are substantially equal in constitution to that shown in FIG. 29 in that one transfer stage 41 is associated with two photoelectric converters 3. However, in the methods of FIGS. 30A to 30C, 31, and 32, charge is read from only one of two photoelectric converters 3 and is fed to the vertical path 5.

Figure 30:
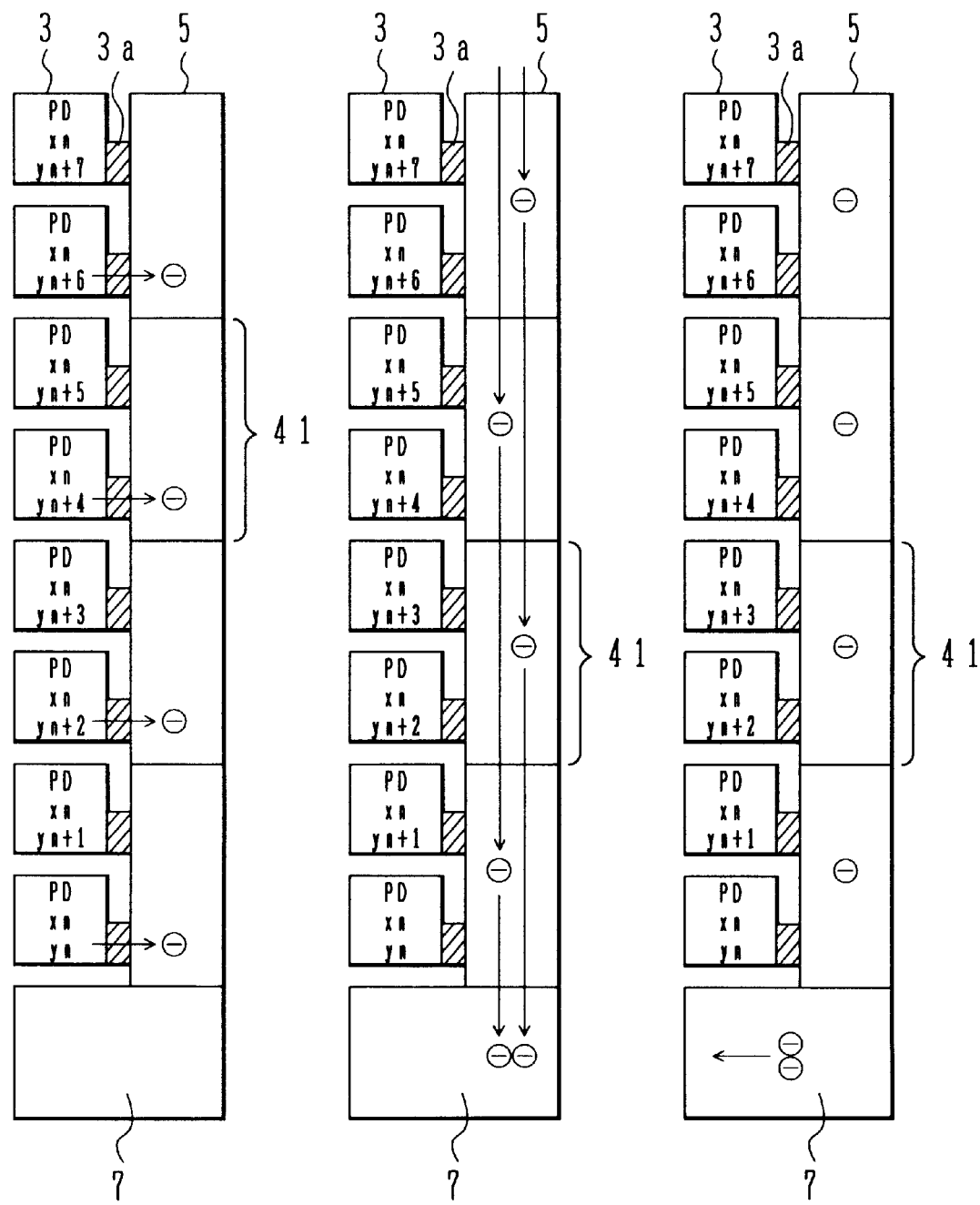
FIGS. 30A to 30C are diagram sequentially showing a method of reading charge from only one of two photoelectric converter elements to feed the charge to a vertical charge transfer path.

As can be seen from FIG. 30A, the charge read out to the vertical charge 5 is transferred two transfer stages 41 through the vertical path 5 as shown in FIG. 30B. Addition of each charge is not conducted in the vertical path 5, but is achieved after each charge is transferred to the horizontal path 7.

As shown in FIG. 30C, the total charge is transferred through the horizontal path 7 in a direction to an external device.

Figure 31:
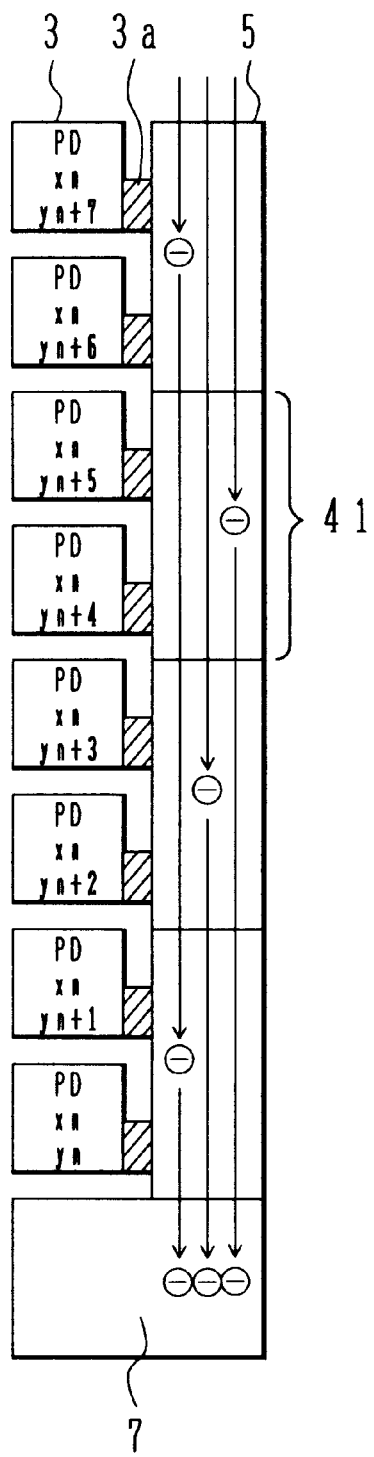
FIG. 31 is a diagram showing a method of reading charge from only one of two photoelectric converter elements to feed the charge to a vertical charge transfer path.
Figure 32:
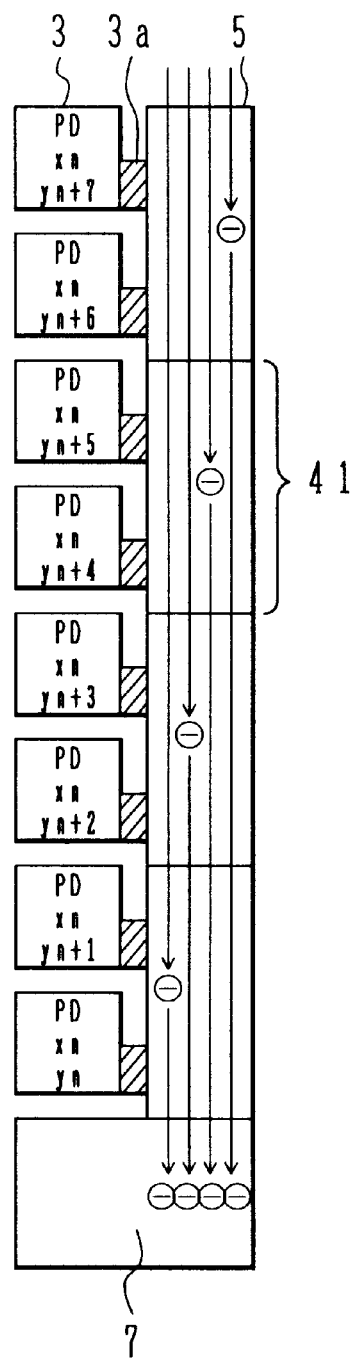
FIG. 32 is a diagram showing a method of reading charge from only one of two photoelectric converter elements to feed the charge to a vertical charge transfer path.

FIGS. 31 and 32 show variations of the method of FIGS. 30A to 30C.

In the method of FIG. 31, charge is transferred three stages 41 by each transfer operation.

In the method of FIG. 32, charge is transferred four stages 41 by each transfer operation.

In either case of the adding movie mode, the charge transferred to the horizontal path 7 by one transfer operation is added to each other in at least either one of the vertical path 5 and the horizontal path 7. Therefore, the amount of signals is twice, three times, four times, etc. that of signals transferred in the ordinary overall pixel readout mode.

It is consequently possible to attain a bright monitor image while keeping the high frame speed.

Referring now to FIGS. 33A to 33E, 34A to 34E, 35A to 35E, 36E to 36E, 37A to 37E, and 38A to 38E, description will be given of a specific readout method of a solid-state image pickup device X in which a color filter array includes a particular layout of colors.

FIGS. 33A to 33E and 34A to 34E are diagrams for concretely explaining the readout operation when photoelectric converters and color filters are arranged in horizontal and vertical directions.

Figures 33A, 33B, 33C, 33D, 33E:
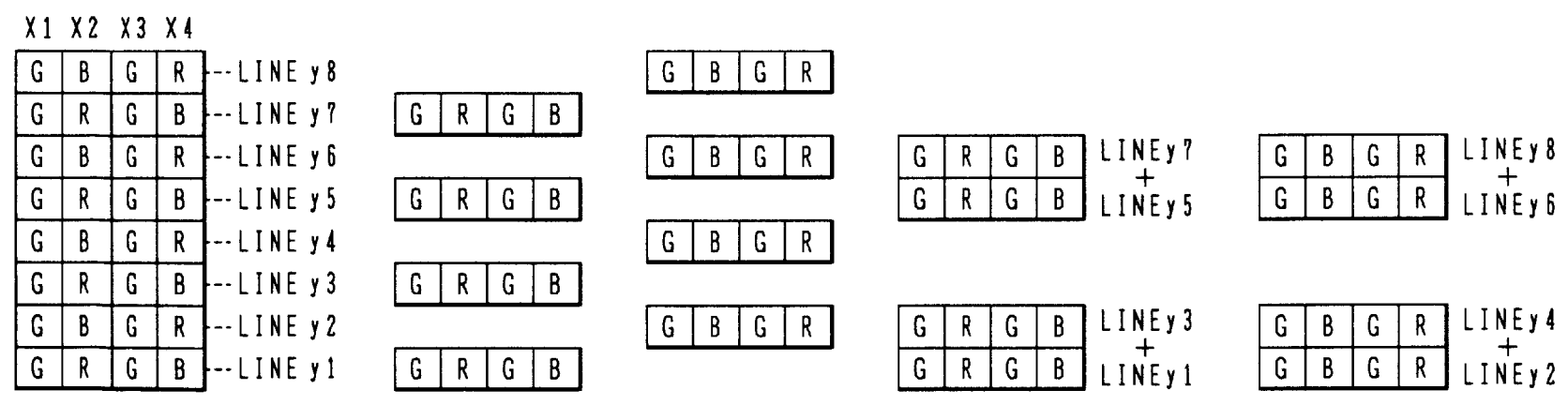

The color filter array has G stripes at every second column. R and B pixels are juxtaposed in remaining columns. As shown in FIG. 33A, G line is formed each for every two lines. Except the G lines, R and B are arranged in a checkerboard pattern.

The pixel layout of FIGS. 33a to 33E is obtained by arranging on the photoelectric converters 3 in the structure shown in FIGS. 15A to 15C a color filter array of the G stripe R and B complete zigzag type.

FIG. 33A includes a pixel array including eight rows including lines y1 to y8 and four columns. However, an actual pixel array includes a large number of pixels, for example, more than one million pixels are arranged on a two-dimensional plane.

As can be seen from FIG. 33B, charge is read from every second row of the photoelectric converters in a first field readout operation. Concretely, charge is read from the converters of odd lines, namely, lines y1, y3, y5, y7, etc. of FIG. 33A.

In each of lines y1 to y7, color filters of green (G), red (R), green (g) and blue (B) are arranged for columns x1 to x4 in a horizontal direction. Charge is read out according to the color layout.

The charge thus obtained is transferred four transfer stages 41 through the vertical charge transfer path 5 as shown in FIG. 15B. The charge from lines y1 and y3 is fed through the vertical path 5 as shown in FIG. 33D. When transferred from the vertical path 5 to the horizontal path 7, the charge is added to each other. The resultant charge is horizontally fed through the horizontal path 7 and is fed to an external device.

The charge read from each of lines y5 and y7 is then added to each other when fed from the vertical path 5 to the horizontal path 7.

In the vertical path 5 corresponding to column x1, the charge of each of two photoelectric converters corresponding to G is added to each other (GG). Similarly, in the vertical path 5 corresponding to column x2, the charge of each of two photoelectric converters corresponding to R is added to each other (RR). In the vertical path 5 corresponding to column x3, the charge of each of two photoelectric converters corresponding to G is added to each other (GG). In the vertical path 5 corresponding to column x4, the charge of each of two photoelectric converters corresponding to B is added to each other (BB). When transferred from the vertical path 5 to the horizontal path 7, the charge is added to each other. The resultant charge is horizontally transferred through the horizontal path 7 and is fed to an external device.

Subsequently, when transferred from the vertical path 5 to the horizontal path 7, the charge from each of lines y5 and y7 is added to each other. In an operation similar to that described above, the resultant charge is horizontally transferred through the horizontal path 7. By repeatedly conducting the operation above, the charge of the photoelectric converters of every second column is read out and is added to each other. This completes the first field charge readout operation.

Thereafter, signal charge is read from photoelectric converters in even rows, i.e., lines y2, y4, y6, and y8. Charge of signals corresponding to green (G), blue (B), green (G), and red (R) is read out to the associated respective lines.

By an operation similar to the charge transfer in the vertical charge transfer path 5, charge of lines 2 and 4 is fed to the vertical charge transfer path 5. When transferred from the vertical path 5 to the horizontal path 7, the charge of each of lines y2 and y4 is added to each other. The charge resulted from the addition is transferred through the horizontal path 7 in a horizontal direction to an external device (first field readout).

Next, charge corresponding to lines y6 and y8 is transferred to the vertical path 5. When transferred from the vertical path 5 to the horizontal path 7, each charge of lines y6 and y8 is added to each other. The resultant charge is fed through the horizontal path 7 in a horizontal direction and is delivered to an external device (second field readout).

By repeatedly achieving the operation above, the first and second fields are read out.

By the readout operations of the first and second fields, the charge is finally read from all pixels. In this operation, the charge is added to each other and is transferred through the horizontal charge transfer path. Therefore, even a small quantity of light is obtained for an object to be shot, there can be produced a bright monitor image.

FIG. 34A includes a color filter array substantially equal to the color layout shown in FIG. 33A.

As can be seen from FIG. 34B or 34C, signal charge is read from the pixels of lines y1 and y5 in the first field readout operation.

Charge transferred to the vertical path 5 is associated with filters G, R, G, and B in the horizontal direction in this sequence. The charge read to the vertical path 5 is transferred eight transfer stages 41 by one transfer operation in a direction to the horizontal path 7.

When transferred from the vertical path 5 to the horizontal path 7, each charge from lines y1 and y5 is added to each other. The total charge is transferred through the horizontal path 7 in a horizontal direction.

By the operation described above, the charge of the first field is read out.

Similarly, when reading out charge of a second field, the charge is read from lines y2 and y6 as shown in FIG. 34C. By an operation like the readout and transfer operation of the first field, the signal charge added to each other when transferred from the vertical path 5 to the horizontal path 7 is transferred through the horizontal path 7 in a horizontal direction and is fed to an external device.

FIGS. 35A to 35E show in schematic plan views a solid-state image pickup device using a shifted-pixel layout. Color filters are arranged in an array including rows and columns of R and B complete zigzag type. In the columns, every second column includes only green (G) filters. Between the G columns, a stripe of color filters of RBRBRB . . . and a stripe of color filters of BRBRBR . . . are alternately disposed. FIG. 35A includes 16 lines including lines y1 to y16 arranged in the horizontal direction.

As can be seen from FIG. 35B, when reading out a first field, charge is read from lines y1 and y2, y5 and y6, y9 and y10, and y13 and y14 and is fed to the vertical charge transfer path 5.

The charge of lines y1 and y2 and lines y5 and y6 is transferred through the vertical path 5 in a direction to the horizontal path 7 as shown in FIG. 35D. When transferred from the vertical path 5 to the horizontal path 7, each charge is added to each other. The charge added to each other in the horizontal path 7 is fed through the horizontal path 7 in a horizontal direction.

Similarly, charge of lines y9 and y10 and lines y13 and y14 is read out to the vertical path 5. When transferred from the vertical path 5 to the horizontal path 7, each charge is added to each other. The charge added to each other in the horizontal path 7 is fed through the horizontal path 7 in a horizontal direction (first field readout operation).

A second field is similarly read out. Charge of lines y3 and y4, lines y7 and y8, lines y12 and y15, and lines y15 and y16 is read out to the vertical path 5.

When transferred from the vertical path 5 to the horizontal path 7, each charge of lines y3 and y4 and lines y7 and y8 is added to each other. The charge added to each other in the horizontal path 7 is fed through the horizontal path 7 in a horizontal direction.

When transferred from the vertical path 5 to the horizontal path 7, each charge of lines y11 and y12 and lines y15 and y16 is added to each other. The charge added to each other in the horizontal path 7 is horizontally fed through the horizontal path 7.

FIGS. 36A to 36E show another readout method of a solid-state image pickup device employing a shifted-pixel layout.

FIG. 36A shows a color filter layout similar to that shown in FIG. 35A.

For a first field, charge of lines y1 and y2 and lines y9 and y10 is transferred to the vertical path 5.

When transferred from the vertical path 5 to the horizontal path 7, each charge of lines y1 and y2 is added to each other. The charge added to each other in the horizontal path 7 is horizontally fed through the horizontal path 7.

Each charge of lines y9 and y10 is added to each other. Charge resultant from the addition in the horizontal path 7 is horizontally fed through the horizontal path 7.

For a second field, charge of lines y3 and y4 and lines y11 and y12 is transferred to the vertical path 5.

When transferred from the vertical path 5 to the horizontal path 7, each charge of lines y3 and y4 is added to each other. The charge added to each other in the horizontal path 7 is horizontally fed through the horizontal path 7.

Moreover, each charge of lines y11 and y12 is added to each other. The charge added to each other in the horizontal path 7 is horizontally fed through the horizontal path 7.

Referring now to FIGS. 37A to 37E and 38A to 38E, description will be given of an example of readout operation in a movie mode when the color filters are arranged in a Bayer array.

Figure 37A:
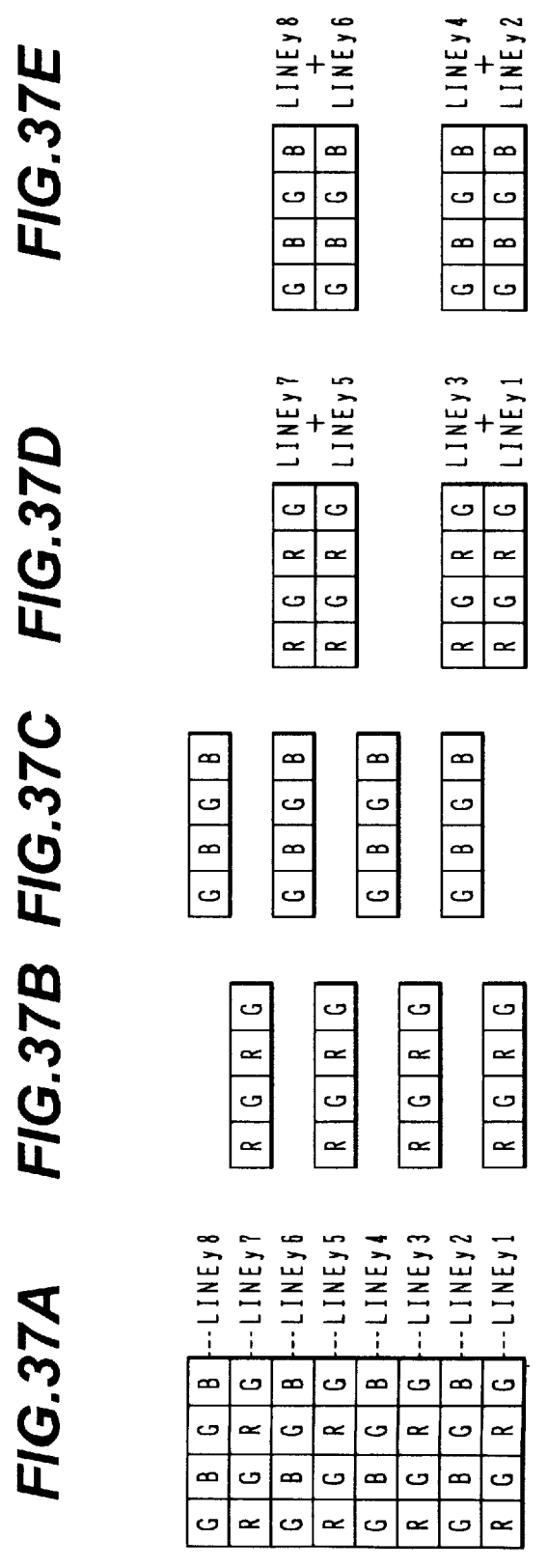

The color filter array of FIG. 37A alternately includes a column of a color layout of RGRGRG . . . and a column of a color layout of GBGBGB . . . adjacent thereto. This is a so-called Bayer array. Line y1 includes a color layout of RGRG . . . and line y2 disposed over line y1 includes a color layout of GBGB . . . A set of line y1 and line y2 is repeatedly fabricated, that is, these lines are alternately arranged in the vertical direction.

As shown in FIG. 37B, in a readout operation of a first field, charge is read from the photoelectric converters of odd lines y1, y3, y5, and y7 and is fed to the vertical charge transfer path 5. Of the charge read out to the vertical path 5, charge of every second row is transferred through the vertical path 5 in a direction to the horizontal path 7.

As can be seen from FIG. 37D, in the readout of the first field, when charge of lines y1 and y3 is transferred to the horizontal path 7, each charge is added to each other. Charge resultant from the addition in the horizontal path 7 is horizontally fed through the horizontal path 7.

When charge of lines y5 and y7 is transferred to the horizontal path 7, each charge is added to each other. The charge added to each other in the horizontal path 7 is horizontally fed through the horizontal path 7.

As shown in FIGS. 37C and 37E, in the readout of the second field, charge of lines y2 and y4 and lines y6 and y8 is read out to the vertical path 5.

When transferred to the horizontal path 7, each charge of lines y2 and y4 is added to each other. Charge resultant from the addition in the horizontal path 7 is horizontally fed through the horizontal path 7.

When charge of lines y6 and y8 is transferred to the horizontal path 7, each charge is added to each other. The charge added to each other in the horizontal path 7 is horizontally fed through the horizontal path 7.

FIGS. 38A to 38E show an example of the readout operation. For a first field, charge is read from the photoelectric converters in lines y1 and y5. For a second field, charge is read from the photoelectric converters in lines y2 and y6.

In a transfer operation of the first field, when the charge of the photoelectric converters in lines y1 and y5 is transferred to the horizontal path 7, each charge is added to each other. When the charge of the photoelectric converters in lines y2 and y6 is transferred to the horizontal path 7, each charge is added to each other (reference is to be made to FIGS. 38D and 38E).

Figure 39:
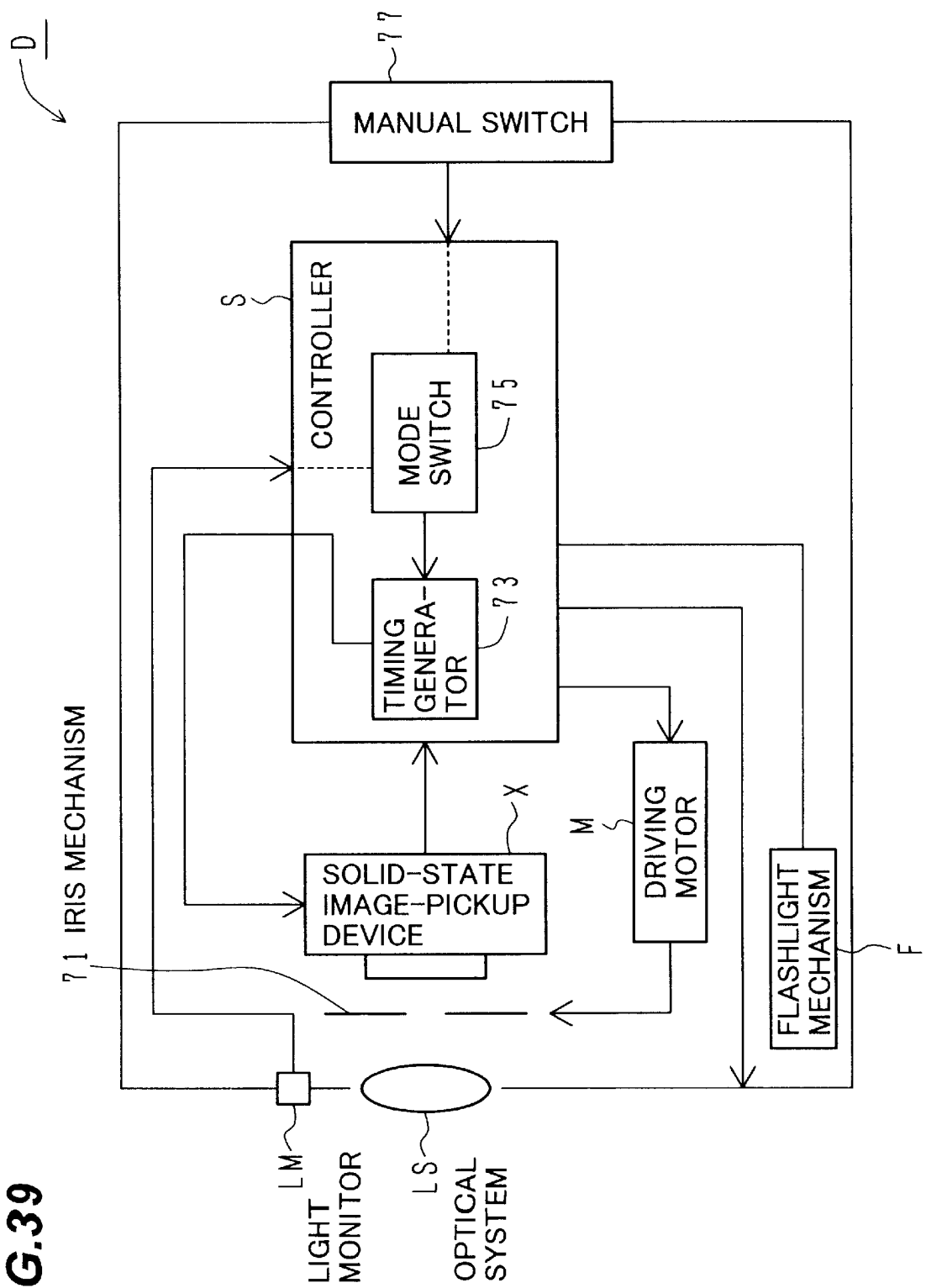
FIG. 39 is a block diagram showing a concrete example of constitution in which a solid-state image pickup device is applied to an actual digital still camera according to the present invention.
Figure 40:
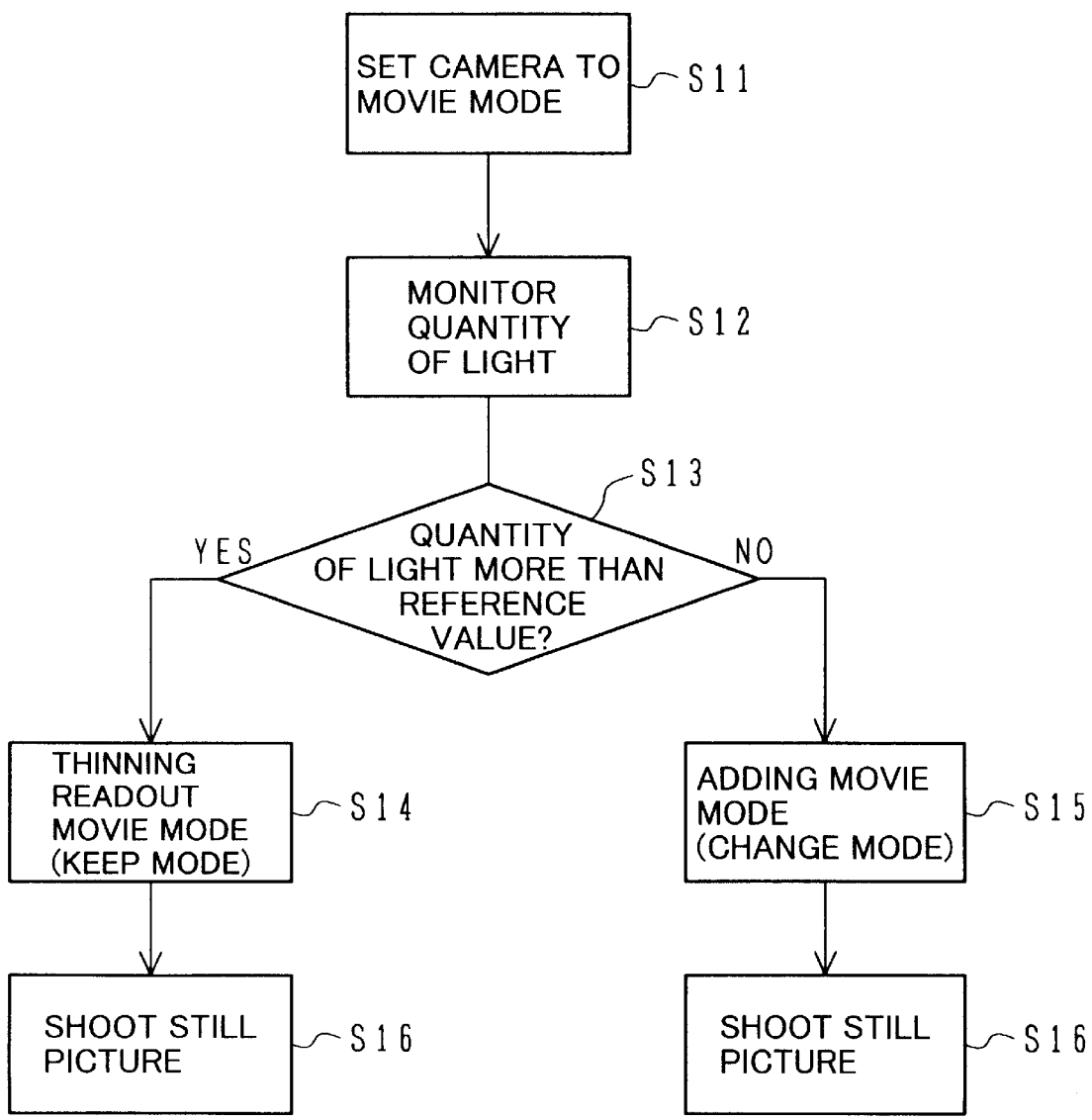
FIG. 40 is a flowchart showing operation of a solid-state image pickup device is applied to an actual digital still camera according to the present invention.
Figure 41:
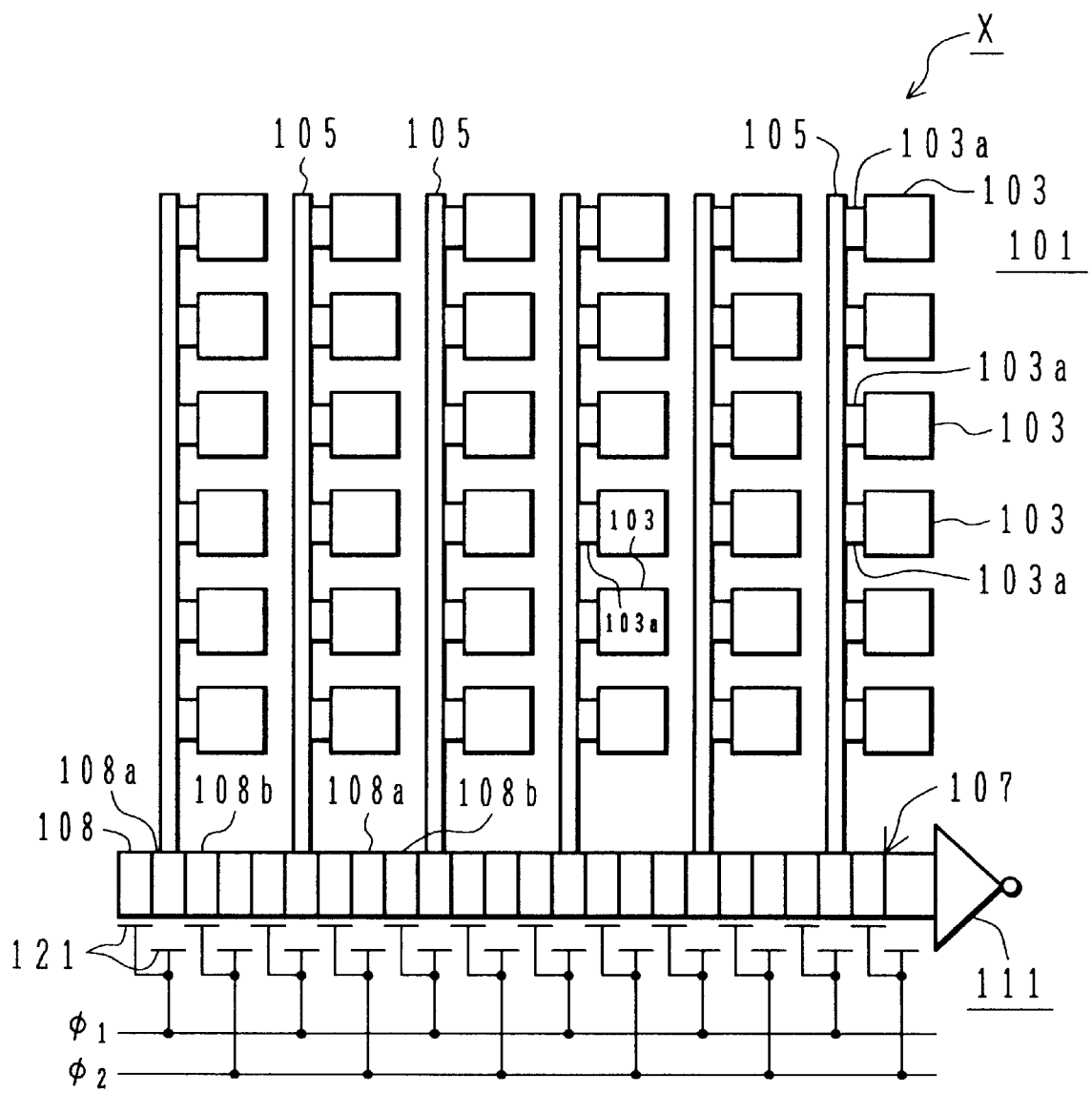
FIG. 41 is a plan view showing a general configuration of a solid-state image pickup device.
Figure 42:
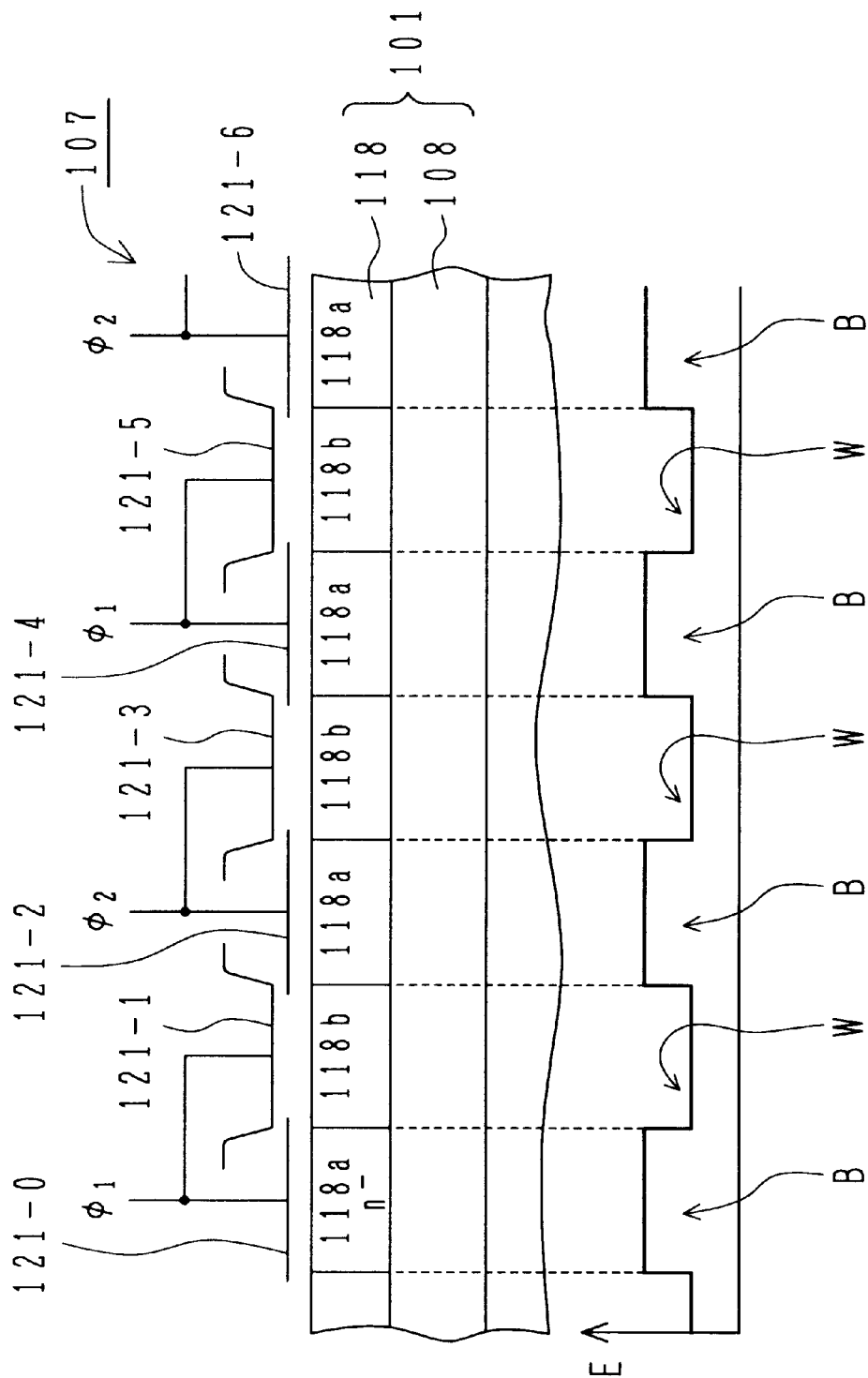
FIG. 42 is a cross-sectional view showing a horizontal charge transfer path.
Figure 43:
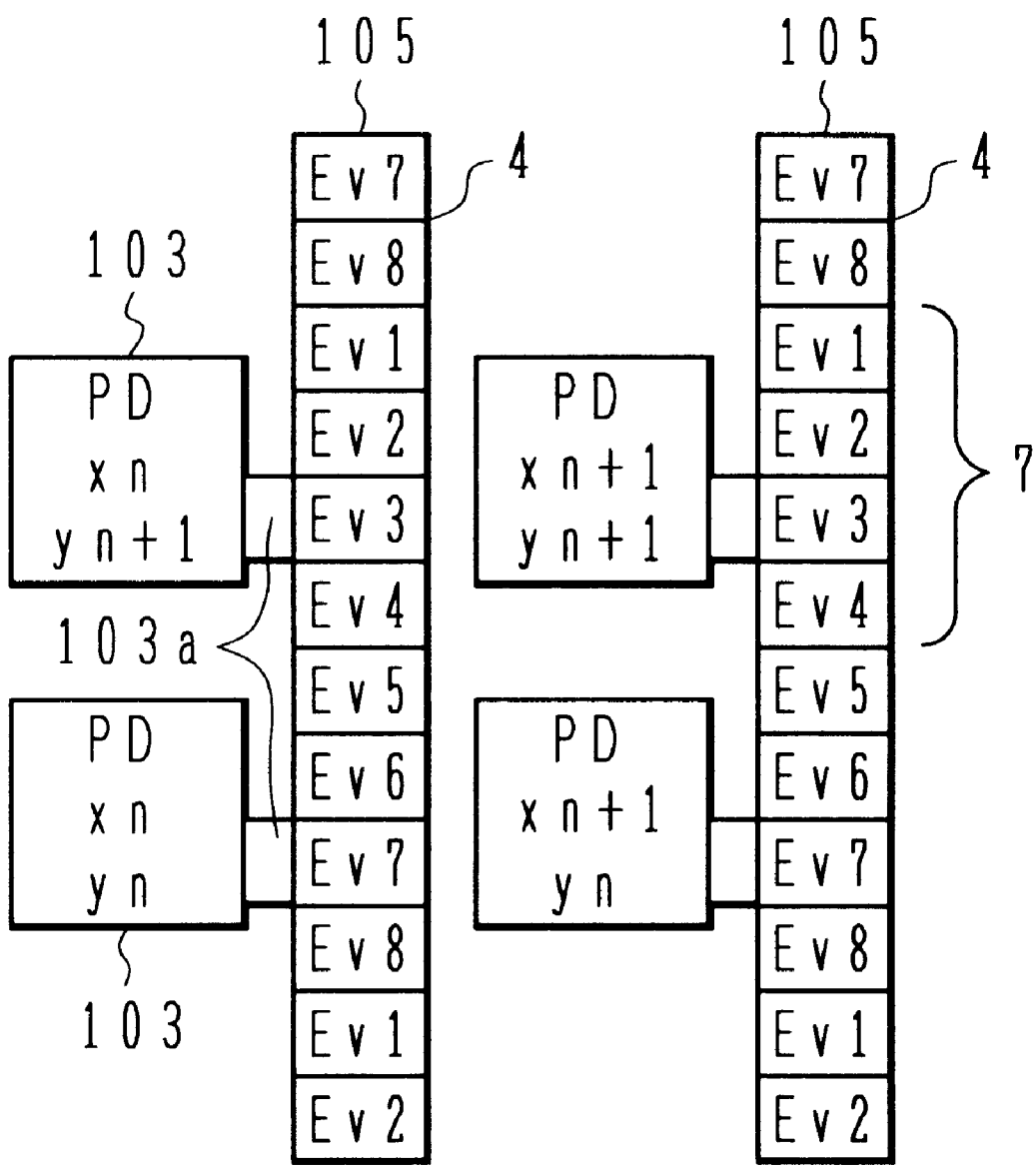
FIG. 43 is a plan view mainly showing a layout of a vertical charge transfer electrode.
Figure 45A:
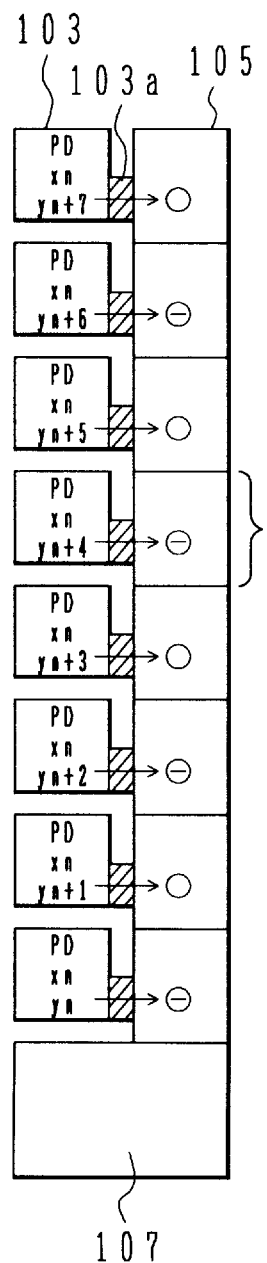
FIGS. 45A to 45C are diagrams showing operation of a solid-state image pickup device.
Figure 45B:
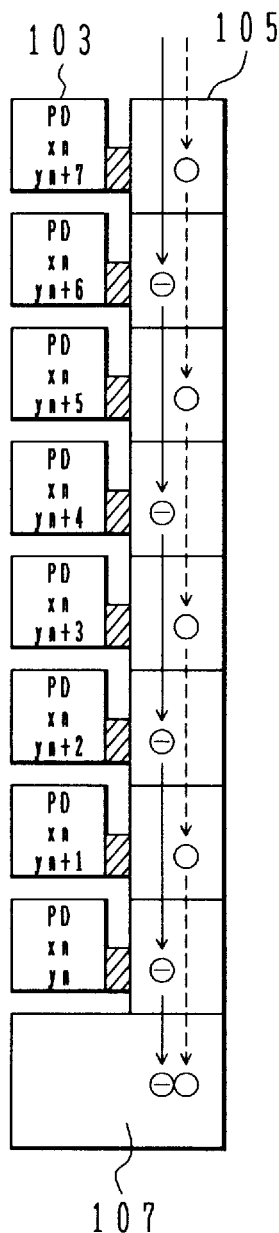
Figure 45C:
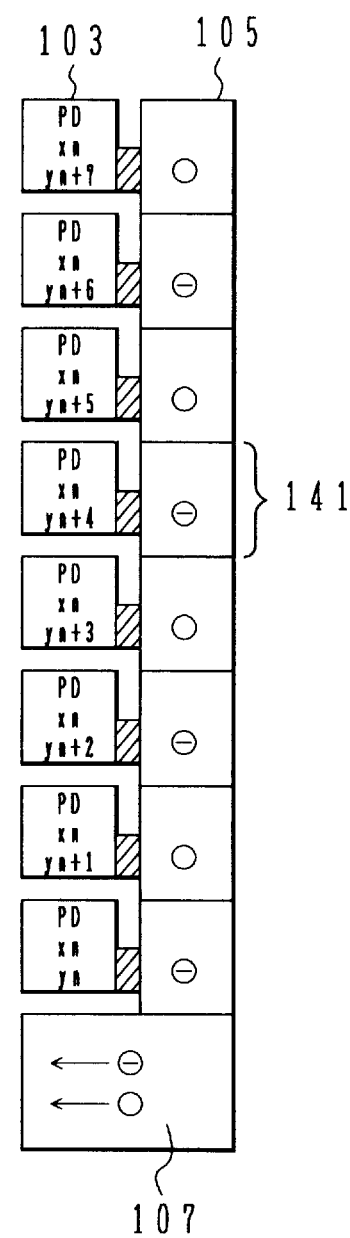

Referring next to FIGS. 39 and 40, description will be given of a specific configuration example of a system in which a solid-state image pickup device of the present invention is applied to an actual digital still camera.

FIG. 39 shows a digital still camera D including an optical system LD including a lens, an iris mechanism (including a diaphragm 71 and a driving motor M), a flashlight mechanism F, a controller circuit S, a light monitor LM, a manual switch 77, and a solid-state image pickup device X.

The controller S includes a timing generator 73 to generate driving pulse signals to drive the device X and a shooting mode switch circuit 75 to change a shooting mode.

The mode switch 75 receives a signal from the light monitor LM to conduct a change-over operation between the thinning readout movie mode and the adding movie mode.

FIG. 40 shows, in a flowchart, operation in the movie mode.

In step S11, the camera D is set to movie mode. A mobile picture is displayed as a monitor image.

In step S12, the light monitor LM measures a quantity of light and produces an output indicting the quantity of light. According to the output from the light monitor LM, the shooting mode of the monitor image is determined.

When the light monitor LM measures a quantity of light sufficient to shoot a bright monitor image, step S14 keeps the thinning readout movie mode according to the output from the light monitor LM.

At an appropriate point of timing, a still picture is shot, for example, in step S16. In this operation, the flashlight is illuminated when necessary.

In step 313, when the light monitor LM measures a quantity of light less than a reference value and outputs a signal indicating the condition, processing goes to step S15. In step S15, a readout operation is started in the adding movie mode. Charge from photoelectric converters is added to each other in the vertical or horizontal charge transfer path, and hence a bright monitor image is attained.

The operator of the camera shoots in step S16 a still picture at a desired point of timing. In this situation, the flashlight is activated forcibly or optionally.

As above, according to the value of the quantity of light measured by the light monitor LM, the camera D automatically selects, for the shooting, the ordinary thinning readout mode or the adding movie mode in which a bright monitor image can be obtained. That is, a bright monitor image can be displayed in any situation.

When the manual switch 77 is set to on, it is possible to manually change the mode between the thinning movie mode and the adding movie mode for the shooting.

When the solid-state image pickup device includes a color filter array, the array need only include color filters to produce a color image. The color filters of this kind include, in addition to a color filter array of three primary colors, i.e., red (R), green (G), and blue (B) described in conjunction with the embodiments above, a color filter array of complementary color type.

Known color filter arrays of complementary color type include, for example, (i) a color filter array including green (G), cyan (Cy), and yellow (Ye); (ii) a color filter array including cyan (Cy), yellow (Ye), and white or colorless (W); (III) a color filter array including cyan (Cy), magenta (Mg), yellow (Ye), and green (G); and (iv) a color filter array including cyan (Cy), yellow (Ye), green (G), and white or colorless (W).

The color filter arrays of three primary colors are configured in various patterns including a Bayer type, an interline type, a G stripe RB zigzag type, and a G stripe RB complete zigzag type.

The solid-state image pickup device (apparatus) and the readout method of the same according to the present invention are used to display a picture primarily in the movie mode. However, the use thereof is not limited to the picture display. For example, the solid-state image pickup device (apparatus) and the readout method of the same can be naturally used to increase sensitivity when the quantity of signals (light) is insufficient to produce a still picture, for example, in an automatic exposure mode and/or an automatic focus mode.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A solid-state image pickup device, comprising:
   a plurality of photoelectric converter elements arranged in columns in a vertical direction with a predetermined pitch and in rows in a horizontal direction with a predetermined pitch on a two-dimensional plane;
   a plurality of vertical charge transfer paths respectively fabricated adjacent to the columns of said photoelectric converter elements, each said path including a plurality of charge transfer stages;
   a plurality of vertical charge transfer electrodes fabricated on each said vertical charge transfer paths for transferring charge through said each vertical charge transfer path one said charge transfer stage in each transfer period;
   a horizontal charge transfer path fabricated to be connected to an end section of each said vertical charge transfer path for receiving charge transferred from said vertical charge transfer path and for transferring the charge in a horizontal direction;
   a plurality of horizontal charge transfer electrodes fabricated on said horizontal charge transfer path in a horizontal direction;
   an output amplifier fabricated to be connected to an end section of said horizontal charge transfer path for amplifying charge supplied from said horizontal charge transfer path and for outputting charge resultant from the amplification to an external device; and
   a control circuit operating in a two driving modes including a thinning readout mode and an adding movie mode,
   said control circuit reading, in the thinning readout mode, charge from said photoelectric converter elements to only part of said charge transfer stages, said control circuit transferring the charge from said vertical charge transfer path to said horizontal charge transfer path,
   said control circuit reading, in the adding movie mode, charge from said photoelectric converter elements to all said charge transfer stages, said control circuit transferring the charge of at least two said photoelectric converter elements from said vertical charge transfer path to said horizontal charge transfer path to add each said charge to each other, said control circuit stopping a transfer of charge from said vertical charge transfer path to said horizontal charge transfer path, said control circuit outputting by said horizontal charge transfer path charge resultant from the addition to an external device.

2. A solid-state image pickup device according to claim 1, wherein each said photoelectric converter element is disposed for each said charge transfer stage of said vertical charge transfer paths.

3. A solid-state image pickup device according to claim 1, wherein two said photoelectric converter elements are disposed for each said charge transfer stage of said vertical charge transfer paths.

4. A solid-state image pickup device according to claim 1, wherein:
   said photoelectric converter elements in the even columns are shifted about one half of the pixel pitch relative to said photoelectric converter elements in the odd columns;

said photoelectric converter elements in the even rows are shifted about one half of the pixel pitch relative to said photoelectric converter elements in the odd rows;

each said column includes said photoelectric converter elements of only the even or odd rows;

each said vertical charge transfer path is fabricated adjacent to each associated one column of said photoelectric converter elements, said vertical charge transfer path generally extending, while locally meandering, in a direction of the column; and said charge transfer stage corresponds to about one half of the pixel pitch of said photoelectric converter elements of each column.

5. A solid-state image pickup device according to claim 4, wherein said device reads, in said adding movie mode, charge simultaneously from said photoelectric converter elements of said even and odd columns to said vertical charge transfer paths associated therewith, transfers the charge of at least two photoelectric converter elements from said associated vertical charge transfer path to said horizontal charge transfer path, adds each said charge to each other, stops a transfer of charge from said vertical charge transfer path to said horizontal charge transfer path, and outputs by said horizontal charge transfer path charge resultant from the addition to an external device.

6. A solid-state image pickup device according to claim 1, wherein said device reads, in said adding movie mode, charge from all said charge transfer stages of said vertical charge transfer path associated therewith, transfers the charge by a plurality of charge transfer stages from said vertical charge transfer path in a direction to said horizontal charge transfer path, transfers the charge of at least two said photoelectric converter elements to said horizontal charge transfer, adds each said charge to each other, stops a transfer of charge from said vertical charge transfer path to said horizontal charge transfer path, and outputs by said horizontal charge transfer path charge resultant from the addition to an external device.

7. A solid-state image pickup device according to claim 1, wherein said device reads, in said adding movie mode, charge from every n-th one of said charge transfer stages of said vertical charge transfer path associated therewith, transfers the charge of at least two photoelectric converter elements from said associated vertical charge transfer path to said horizontal charge transfer path, adds each said charge to each other, stops a transfer of charge from said vertical charge transfer path to said horizontal charge transfer path, and outputs by said horizontal charge transfer path charge resultant from the addition to an external device.

8. A solid-state image pickup device according to claim 1, wherein said device reads, in said adding movie mode, charge from every n-th one of said charge transfer stages of said vertical charge transfer path associated therewith, transfers the charge by every nm-th one (m is an integer equal to or more than two) of said charge transfer stages from said associated vertical charge transfer path in a direction to said horizontal charge transfer path, transfers the charge of at least two photoelectric converter elements from said associated vertical charge transfer path to said horizontal charge transfer path, adds each said charge to each other, stops a transfer of charge from said vertical charge transfer path to said horizontal charge transfer path, and outputs by said horizontal charge transfer path charge resultant from the addition to an external device.

9. A solid-state image pickup device according to claim 4, wherein said device reads, in said adding movie mode, charge from all said charge transfer stages of said vertical charge transfer path associated therewith, transfers the charge by a plurality of said charge transfer stages from said vertical charge transfer path in a direction to said horizontal charge transfer path, transfers the charge of at least two said photoelectric converter elements to said horizontal charge transfer, adds each said charge to each other, stops a transfer of charge from said vertical charge transfer path to said horizontal charge transfer path, and outputs by said horizontal charge transfer path charge resultant from the addition to an external device.

10. A solid-state image pickup device according to claim 4, wherein said device reads, in said adding movie mode, charge from every n-th one of said charge transfer stages of said vertical charge transfer path associated therewith, transfers the charge of at least two photoelectric converter elements from said associated vertical charge transfer path to said horizontal charge transfer path, adds each said charge to each other, stops a transfer of charge from said vertical charge transfer path to said horizontal charge transfer path, and outputs by said horizontal charge transfer path charge resultant from the addition to an external device.

11. A solid-state image pickup device according to claim 4, wherein said device reads, in said adding movie mode, charge from every n-th one of said charge transfer stages of said vertical charge transfer path associated therewith, transfers the charge by every nm-th one (m is an integer equal to or more than two) of said charge transfer stages from said associated vertical charge transfer path in a direction to said horizontal charge transfer path, transfers the charge of at least two photoelectric converter elements from said associated vertical charge transfer path to said horizontal charge transfer path, adds each said charge to each other, stops a transfer of charge from said vertical charge transfer path to said horizontal charge transfer path, and outputs by said horizontal charge transfer path charge resultant from the addition to an external device.

12. A solid-state image pickup apparatus, comprising:

a plurality of photoelectric converter elements arranged in columns in a vertical direction with a predetermined pitch and in rows in a horizontal direction with a predetermined pitch on a two-dimensional plane;

a plurality of vertical charge transfer paths respectively fabricated adjacent to the columns of said photoelectric converter elements, each said path including a plurality of charge transfer stages;

a plurality of vertical charge transfer electrodes fabricated on each said vertical charge transfer paths for transferring charge through said each vertical charge transfer path one said charge transfer stage in each transfer period;

a horizontal charge transfer path fabricated to be connected to an end section of each said vertical charge transfer path for receiving charge transferred from said vertical charge transfer path and for transferring the charge in a horizontal direction;

a plurality of horizontal charge transfer electrodes fabricated on said horizontal charge transfer path in a horizontal direction;

an output amplifier fabricated to be connected to an end section of said horizontal charge transfer path for amplifying charge supplied from said horizontal charge transfer path and for outputting charge resultant from the amplification to an external device; and a control circuit operating in a two driving modes including a thinning readout mode and an adding movie mode, said control circuit reading, in the thinning readout mode, charge from said photoelectric converter elements to only part of said charge transfer stages, said control circuit transferring the charge from said vertical charge transfer path to said horizontal charge transfer path, said control circuit reading, in the adding movie mode, charge from said photoelectric converter elements to all said charge transfer stages, said control circuit transferring the charge of at least two said photoelectric converter elements from said vertical charge transfer path to said horizontal charge transfer path to add each said charge to each other, said control circuit stopping a transfer of charge from said vertical charge transfer path to said horizontal charge transfer path, said control circuit outputting by said horizontal charge transfer path charge resultant from the addition to an external device;

an optical lens;

an iris mechanism for controlling a quantity of light for exposure;

a mobile picture monitor display for displaying a shooting object when necessary;

a light monitor for measuring brightness of a peripheral area of the shooting object; and a switch responsive to a result of the measurement by said light monitor for automatically selecting, when the brightness of the peripheral area of the shooting object exceeds a reference value, driving of the device in the thinning readout mode and for automatically selecting, when the brightness of the peripheral area of the shooting object is less than a reference value, driving of the device in the adding movie mode.

13. A solid-state image pickup device according to claim 12, further including an auto-manual switch for conducting a changeover between an automatic selection mode to automatically select the thinning readout mode or the adding movie mode and a manual selection mode to manually conduct a changeover between the thinning readout mode or the adding movie mode.

14. A solid-state image pickup device according to claim 12, further including:

an overflow drain fabricated adjacent to said horizontal charge transfer path for drawing charge, accumulated in said horizontal charge transfer path, from said horizontal charge transfer path, said drain being made of a semiconductor layer, said semiconductor layer having, as a carrier, electric charge substantially equal to said charge; and a charge adjusting barrier disposed between said overflow drain and said horizontal charge transfer path for controlling, by changing height of said barrier, a quantity of charge accumulated in said horizontal charge transfer path.

15. A solid-state image pickup device according to claim 1, wherein each said photoelectric converter constitutes one pixel;

a set of a first pixel column and a second pixel column adjacent thereto is repeatedly formed in said device;

said first pixel column includes green pixels, each said pixel including one said photoelectric converter and a green filter; and said second pixel column adjacent thereto includes pixels including red pixels each including one said photoelectric converter element and a red filter and blue pixels each including one said photoelectric converter element and a blue filter, wherein said red and blue pixels are alternately arranged in a vertical direction in said second pixel column and said red and blue pixels are alternately arranged in a horizontal direction in a plurality of said second pixel columns.

16. A method of controlling a solid-state image pickup apparatus comprising a solid-state image pickup device including a plurality of photoelectric converter elements arranged in columns in a vertical direction with a predetermined pitch and in rows in a horizontal direction with a predetermined pitch on a two-dimensional plane, a plurality of vertical charge transfer paths respectively fabricated adjacent to the columns of said photoelectric converter elements, each said path including a plurality of charge transfer stages; n vertical charge transfer electrodes (n is an integer equal to or more than three) vertically fabricated for each said charge transfer stage on each said vertical charge transfer path, a horizontal charge transfer path fabricated to be connected to a lower end section of a plurality of said vertical charge transfer paths for receiving charge transferred from said vertical charge transfer paths and for transferring the charge in a horizontal direction, an output amplifier fabricated to be connected to an end section of said horizontal charge transfer path for amplifying charge supplied from said horizontal charge transfer path and for outputting charge resultant from the amplification to an external device, and a driving circuit including a timing generator for generating driving pulse signals to said vertical charge transfer paths to drive said solid-state image pickup device; an optical lens, an iris mechanism, a mobile picture monitor display for displaying a shooting object, a light monitor for measuring brightness of a peripheral area of the shooting object, and a shooting method switch for changing a shooting method according to an output from said light monitor, comprising the steps of:

a) setting the apparatus to a movie mode and for displaying a monitor image on the mobile picture monitor display;

b) measuring by the light monitor a quantity of light in peripheral area of the shooting object and selecting, when the quantity of light measured exceeds a reference value, a thinning readout mode in which the charge of said photoelectric converters read out to only part of said charge transfer stages is read out to said vertical charge transfer path associated therewith and is transferred from said vertical charge transfer path to said horizontal charge transfer path, and selecting, when the quantity of light measured is less than a reference value, an adding movie mode in which the charge is read out to all said charge transfer stages, the charge of at least two said photoelectric converters is transferred from said vertical charge transfer path to said horizontal charge transfer path, each said charge is added to each other, a transfer of charge from said vertical charge transfer path to said horizontal charge transfer path is stopped, and charge resultant from the addition is transferred and is outputted by said horizontal charge transfer path to an external device;

c) transferring the charge fed to said horizontal charge transfer path, amplifying the charge by the output amplifier, and delivering charge resultant from the amplification to an external device;

d) repeatedly executing said steps b) and c) and continuously displaying a picture on the monitor display in the thinning readout mode or the adding movie mode; and e) shooting a still picture at a desired point of timing.

17. A method of controlling a solid-state image pickup device including a plurality of photoelectric converter elements arranged in columns in a vertical direction with a predetermined pitch and in rows in a horizontal direction with a predetermined pitch on a two-dimensional plane, a plurality of vertical charge transfer paths respectively fabricated adjacent to the columns of said photoelectric converter elements, each said path including a plurality of charge transfer stages, n vertical charge transfer electrodes (n is an integer equal to or more than three) vertically fabricated for each said charge transfer stage on each said vertical charge transfer path for transferring charge one said transfer stage through said vertical charge transfer path by each transfer operation, a horizontal charge transfer path fabricated to be connected to a lower end section of a plurality of said vertical charge transfer paths for receiving charge transferred from said vertical charge transfer paths and for transferring the charge in a horizontal direction, an output amplifier fabricated to be connected to an end section of said horizontal charge transfer path for amplifying charge supplied from said horizontal charge transfer path and for outputting charge resultant from the amplification to an external device, a driving circuit for applying voltages at respectively fixed points of timing to said vertical charge transfer electrodes at positions respectively associated with the voltages of said n vertical charge transfer electrodes belonging to said each charge transfer stage, a green filter fabricated on each said photoelectric converter element of a first column of said photoelectric converter elements arranged in a vertical direction, said first column being repeatedly fabricated in a horizontal direction, and a red filter and a blue filter alternately and vertically fabricated on a second column of said photoelectric converter elements arranged (in a vertical direction) adjacent to said first column, said first and second columns being repeatedly arranged in a horizontal direction, said red and blue filters being alternately arranged also in a horizontal direction, comprising the steps of:

a) applying reading voltages to predetermined ones of said vertical charge transfer electrodes, said predetermined vertical charge transfer electrodes reading charge from said photoelectric converter elements having a first identical color layout in a row direction, and thereby reading charge of said photoelectric converter elements to said charge transfer stage associated therewith of said vertical charge transfer path;

b) transferring the charge, read out to said vertical charge transfer path, one said charge transfer stage by one transfer operation in a direction to said horizontal charge transfer path and transferring the charge, read out in said step a), in a direction to said horizontal charge transfer path;

c) stopping a transfer of charge through said vertical charge transfer path after the charge of at least two said photoelectric converter elements is transferred to said horizontal charge transfer path and each said charge is added to each other, transferring the charge accumulated in said horizontal charge transfer path toward said output amplifier, and amplifying by said output amplifier the charge from said horizontal charge transfer path and outputting charge resultant from the amplification to an external device;

d) outputting, by repeatedly executing said steps b) and c), the charge read out to an external device in said step a) to an external device; and e) reading charges, by repeatedly executing said steps a) to d) for photoelectric converter elements having a second identical color layout in a row direction which is different from said first identical color layouts.

* * * * *